(12) United States Patent
Yasuoka et al.

(10) Patent No.: US 7,592,669 B2
(45) Date of Patent: Sep. 22, 2009

(54) SEMICONDUCTOR DEVICE WITH MISFET THAT INCLUDES EMBEDDED INSULATING FILM ARRANGED BETWEEN SOURCE/DRAIN REGIONS AND CHANNEL

(75) Inventors: Hideki Yasuoka, Musashino (JP); Keiichi Yoshizumi, Hitachinaka (JP); Masami Koketsu, Hachioji (JP)

(73) Assignee: Renesas Technology Corp., Tokyo (JP)

( * ) Notice: Subject to any disclaimer, the term of this patent is extended or adjusted under 35 U.S.C. 154(b) by 239 days.

(21) Appl. No.: 11/776,380

(22) Filed: Jul. 11, 2007

(65) Prior Publication Data

US 2008/0258236 A1 Oct. 23, 2008

Related U.S. Application Data

(62) Division of application No. 10/986,896, filed on Nov. 15, 2004, now Pat. No. 7,259,054.

(30) Foreign Application Priority Data

Nov. 14, 2003 (JP) ............................. 2003-384654

(51) Int. Cl.
*H01L 29/78* (2006.01)
(52) U.S. Cl. .................. 257/344; 257/384; 257/397; 257/E29.269
(58) Field of Classification Search .................. 257/396, 257/397
See application file for complete search history.

(56) References Cited

U.S. PATENT DOCUMENTS

| 4,918,026 A | 4/1990 | Kosiak et al. |
| 5,047,358 A | 9/1991 | Kosiak et al. |
| 5,306,652 A | 4/1994 | Kwon et al. |
| 5,525,824 A * | 6/1996 | Himi et al. .................. 257/370 |
| 5,917,217 A | 6/1999 | Kitamura et al. |
| 6,063,674 A * | 5/2000 | Yang et al. .................. 438/286 |
| 6,451,640 B1 | 9/2002 | Ichikawa |
| 7,101,764 B2 | 9/2006 | Petti |
| 2005/0194647 A1 | 9/2005 | Tsai et al. |
| 2006/0071269 A1 | 4/2006 | Hebert |

FOREIGN PATENT DOCUMENTS

| JP | 09-237829 | 9/1997 |
| JP | 10-065153 | 3/1998 |
| JP | 2001-144189 | 5/2001 |
| JP | 2001-160623 | 6/2001 |

\* cited by examiner

OTHER PUBLICATIONS

Chinese Official Action for Application No. 200610143112.8, dated Jan. 25, 2008.

*Primary Examiner*—Stephen W Smoot
(74) *Attorney, Agent, or Firm*—Antonelli, Terry, Stout & Kraus, LLP.

(57) ABSTRACT

With the objective of suppressing or preventing a kink effect in the operation of a semiconductor device having a high breakdown voltage field effect transistor, $n^+$ type semiconductor regions, each having a conduction type opposite to $p^+$ type semiconductor regions for a source and drain of a high breakdown voltage pMIS, are disposed in a boundary region between each of trench type isolation portions at both ends, in a gate width direction, of a channel region of the high breakdown voltage pMIS and a semiconductor substrate at positions spaced away from $p^-$ type semiconductor regions, each having a field relaxing function, of the high breakdown voltage pMIS, so as not to contact the $p^-$ type semiconductor regions (on the drain side, in particular). The $n^+$ type semiconductor regions extend to positions deeper than the trench type isolation portions.

10 Claims, 45 Drawing Sheets

LOW BREAKDOWN VOLTAGE MIS FORMING REGION

LOW BREAKDOWN VOLTAGE MIS FORMING REGION

LOW BREAKDOWN VOLTAGE MIS FORMING REGION

LOW BREAKDOWN VOLTAGE MIS FORMING REGION

LOW BREAKDOWN VOLTAGE MIS FORMING REGION

LOW BREAKDOWN VOLTAGE MIS FORMING REGION

LOW BREAKDOWN VOLTAGE MIS FORMING REGION

LOW BREAKDOWN VOLTAGE MIS FORMING REGION

LOW BREAKDOWN VOLTAGE MIS FORMING REGION

LOW BREAKDOWN VOLTAGE MIS FORMING REGION

LOW BREAKDOWN VOLTAGE MIS FORMING REGION

LOW BREAKDOWN VOLTAGE MIS FORMING REGION

SEMICONDUCTOR DEVICE WITH MISFET THAT INCLUDES EMBEDDED INSULATING FILM ARRANGED BETWEEN SOURCE/DRAIN REGIONS AND CHANNEL

CROSS-REFERENCE TO RELATED APPLICATION

This application is a Divisional application of application Ser. No. 10/986,896, filed Nov. 15, 2004, now U.S. Pat. No. 7,259,054, the contents of which are incorporated herein by reference in their entirety. The present application claims priority from Japanese patent application No. 2003-384654, filed on Nov. 14, 2003, the content of which is hereby incorporated by reference into this application.

BACKGROUND OF THE INVENTION

The present invention in general relates to a semiconductor device and to a technique for the manufacture thereof, and, more particularly, the invention relates to a semiconductor device having a high breakdown voltage field effect transistor and to the manufacture thereof.

In a semiconductor device, a trench type isolation structure, called a "STI (Shallow Trench Isolation) or SGI (Shallow Groove Isolation)", which is advantageous in that it tends to improve the degree of device integration, such as the ability to reduce the isolation width, etc., has recently been adopted as a device isolation structure. However, when a channel region of a low breakdown voltage MIS•FET, which is small in device size and low in applied voltage, is defined by a trench type isolation portion, an extraordinary kink effect is likely to occur in addition to a normal turn-on waveform. The kink effect is a phenomenon, in which when the dependence of the drain current on the drain voltage is measured, the drain current changes into an irregular bumped shape from a given voltage value, so that a stepwise waveform is generated. It is known that the major cause of the occurrence of the kink effect in the low breakdown voltage MIS•FET results from the fact that mechanical stress developed from the trench type isolation portion concentrates on each shoulder portion formed by a main surface of a semiconductor substrate and each side surface of the trench type isolation portion, and, hence, the grating constant of silicon at the shoulder portion changes, so that the mobility of carriers at the shoulder portion partly rises.

Thus, the cause of the occurrence of the kink effect in a low breakdown voltage MIS•FET results from the fact that the shape of each shoulder portion of the semiconductor substrate at each sidewall of the isolation portion is steep. Therefore, a rounding of the shoulder portion has become the main countermeasure against the kink effect.

As kink countermeasures other than the above, in the case of a low breakdown voltage MIS•FET, there is a technique wherein a high concentration impurity region of the same conduction type as a well is provided in a boundary portion between one of the trench type isolation portions and the semiconductor substrate. This technique has been disclosed in, for example, a patent document 1 (Japanese Unexamined Patent Publication No. Hei 9 (1997)-237829).

As another example, a patent document 2 (Japanese Unexamined Patent Publication No. 2001-144189) has disclosed a technique wherein, in a low breakdown voltage MOSFET comparted or laid out by a trench device isolation region, a central portion of a channel region thereof is configured as a $p^-$ type channel region that is low in threshold voltage, and both end portions in the neighborhood of the boundary between the channel region and the trench device isolation region are respectively configured as $p^+$ type channel regions that are high in threshold voltage.

As a further, a patent document 3 (Japanese Unexamined Patent Publication No. Hei 10 (1998)-65153) has disclosed a technique in which an impurity layer that is higher in concentration than a channel region is provided at an outer peripheral portion of an active region defined by a trench type device isolation film having the same conduction type as the channel region so as to be shallower than a source/drain junction of a low breakdown voltage MIS•FET.

As a still further, a patent document 4 (Japanese Unexamined Patent Publication No. 2001-160623) has disclosed a technique wherein a low breakdown voltage MOSFET is formed in an active region defined by a device isolation film formed by a trench device isolation method, and channel edges of an active region below a gate electrode of the MOSFET are placed outside a region for injecting high concentration impurity ions for forming a source/drain region, to thereby turn the channel edges aside from an operation section for the purpose of preventing a kink effect.

As further methods of taking countermeasures against the kink effect, there have been proposed, for example, a method of ion-implanting nitrogen in each edge portion with respect to a semiconductor substrate that contacts a trench type isolation portion in an n channel type MOS•FET to form an SiN region, thereby preventing a reduction in the concentration of boron at the edge portion and reducing the leakage current caused by the kink effect, a method of thickening an oxide film in the neighborhood of each of trench type isolation portions to thereby reduce the kink effect, etc.

SUMMARY OF THE INVENTION

On the other hand, the present inventors have newly found a problem in that, although the kink effect occurs even in a high breakdown voltage MIS•FET, the kink effect thereof is different in cause from the kink effect developed in the low breakdown voltage MIS•FET, and the mere formation of rounding at the shoulder portions of the semiconductor substrate makes it impossible to bring about sufficient suppression of the kink effect in the case of the high breakdown voltage MIS•FET. Thus, as will be described later, an important problem is how to suppress the kink effect in a high breakdown voltage MIS•FET.

An object of the present invention is to provide a technique that is capable of suppressing or preventing a kink effect developed in a high breakdown voltage field effect transistor.

The above, other objects and novel features of the present invention will become apparent from the description provided in the present specification and from the accompanying drawings.

Representative aspects and features of the invention disclosed in the present application will be set forth in brief as follows:

According to the present invention, a region that is higher in impurity concentration than a channel region, which is a semiconductor region of a conduction type opposite to that of a drain semiconductor region of a high breakdown voltage field effect transistor, is provided in a boundary region located between an isolation portion at both ends of the high breakdown voltage field effect transistor, as viewed in its gate width direction, and a semiconductor substrate. The region high in impurity concentration is spaced away from the drain semiconductor region of the high breakdown voltage field effect transistor.

Advantageous effects of representative features of the invention disclosed in the present application will be explained in brief as follows:

It is possible to suppress or prevent a kink effect developed in a high breakdown voltage field effect transistor. It is also possible to improve the characteristic of a semiconductor device having a high breakdown voltage field effect transistor.

BRIEF DESCRIPTION OF THE DRAWINGS

Figures 78, 79, 80:
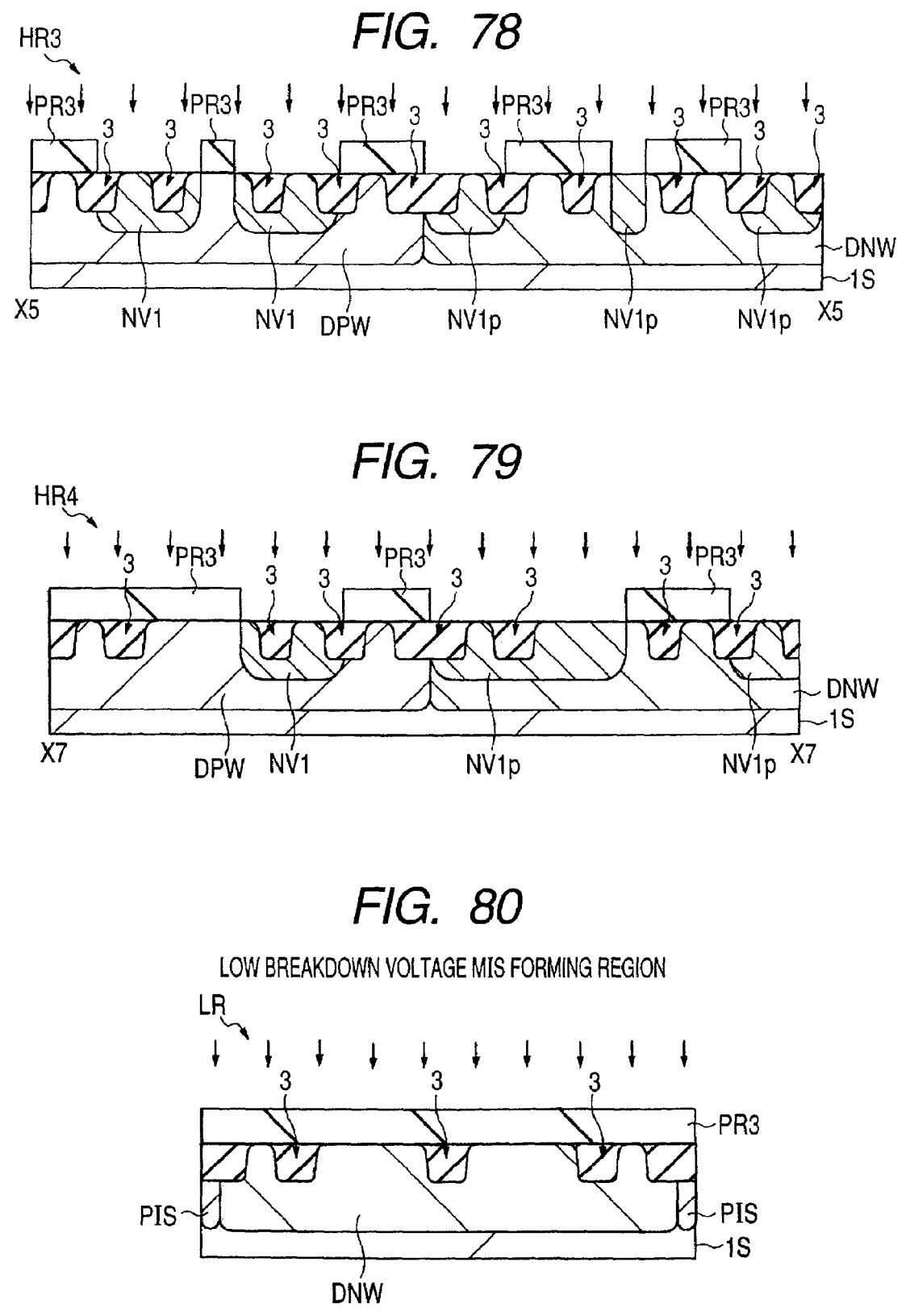

FIG. 78 is a fragmentary cross-sectional view showing a third forming region of a high breakdown voltage field effect transistor in a manufacturing process of a semiconductor device representing a sixth embodiment of the present invention;

FIG. 79 is a fragmentary cross-sectional view illustrating a fourth forming region of the high breakdown voltage field effect transistor of the semiconductor device in the same manufacturing process as FIG. 78;

FIG. 80 is a fragmentary cross-sectional view showing a forming region of a low breakdown voltage field effect transistor of the semiconductor device in the same manufacturing process as FIG. 78;

DETAILED DESCRIPTION OF THE PREFERRED EMBODIMENTS

Figure 1:
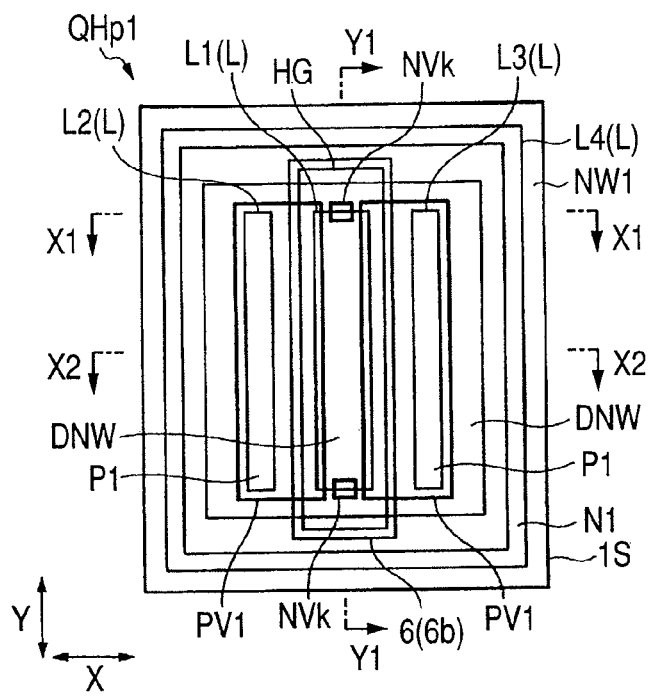
FIG. 1 is a fragmentary plan view illustrative of a high breakdown voltage field effect transistor of a semiconductor device representing a first embodiment of the present invention.
Figure 2:
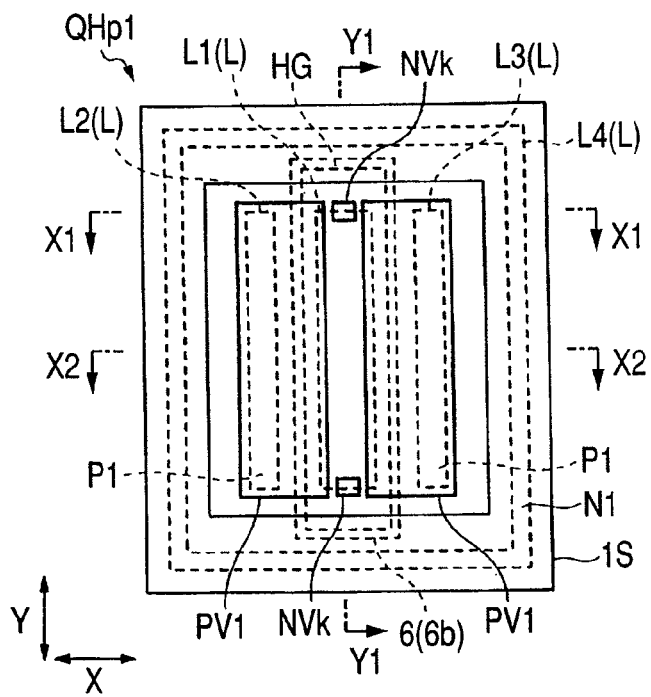
FIG. 2 shows the same spot as FIG. 1 and is a fragmentary plan view particularly showing a layout relationship between field relaxing semiconductor regions of the high breakdown voltage field effect transistor and semiconductor regions for a main part thereof.
Figure 3:
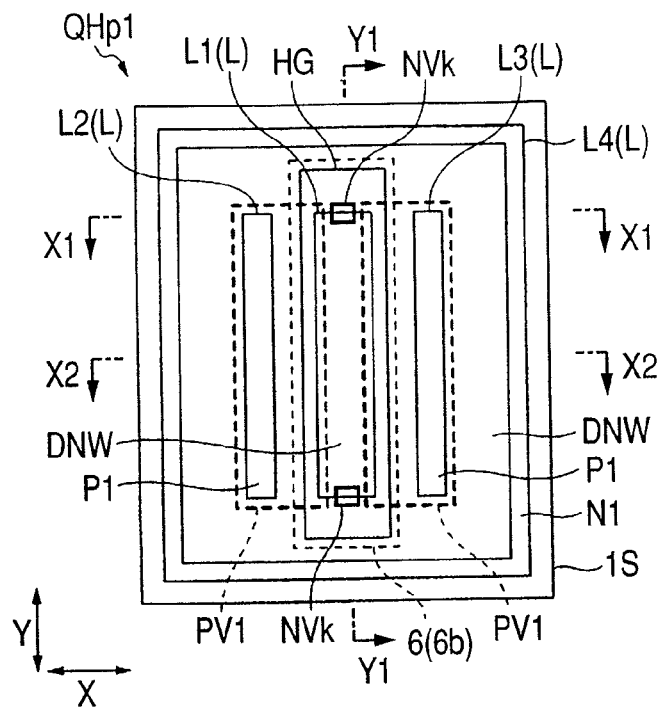
FIG. 3 shows the same spot as FIG. 1 and is a fragmentary plan view particularly showing a layout relationship among a gate electrode of the high breakdown voltage field effect transistor, active regions thereof, and semiconductor regions for a main part thereof.

Whenever circumstances require it for convenience in the following embodiments, the subject matter of the invention will be described by being divided into a plurality of sections or embodiments. However, unless otherwise specified in particular, they are not irrelevant to one another. One thereof has to do with modifications, details and supplementary explanations of some or all of the other. When reference is made to a number of elements or the like (including the number of pieces, numerical values, quantity, range, etc.) in the following description of the embodiments, the number thereof is not limited to a specific number, and may be greater than or less than or equal to the specific number unless otherwise specified in particular and definitely limited to the specific number in principle. It is also needless to say that components (including element or factor steps, etc.) employed in the following embodiments are not always essential, unless otherwise specified in particular and considered to be definitely essential in principle. Similarly, when reference is made to the shapes, positional relations and the like of the components or the like, in the following embodiments, they will include ones substantially analogous or similar to their shapes or the like unless otherwise specified in particular and considered not to be definitely so in principle, etc. This is similarly applicable even to the above-mentioned numerical values and range. Those elements having the same function in all of the drawings are respectively given the same reference numerals, and a repetitive description thereof will be omitted. In the following description of the embodiments, MIS•FET (Metal Insulator Semiconductor•Field Effect Transistor) corresponding to a field effect transistor is abbreviated as "MIS", an n channel type MIS is abbreviated as "nMIS" and a p channel type MIS is abbreviated as "pMIS". Preferred embodiments of the present invention will be described in detail hereinafter based on the accompanying drawings. Of the MISs referred to above, the MIS driven with a relatively high voltage is called a "high breakdown voltage MIS", and the MIS driven with a relatively low voltage is called a "low breakdown voltage MIS". The high breakdown voltage MIS corresponds to an MIS operated by applying a potential of, for example, about 40V to its drain region, and it is set to have such a structure that a breakdown voltage of 100V can be realized. The low breakdown voltage MIS corresponds to an MIS operated by applying a potential of, for example, about 1.5V to its drain region.

A description will first be made of the kink effect developed in a high breakdown voltage MIS, which has newly been discovered by the present inventors. Although the kink effect occurs in a high breakdown voltage MIS, such a kink effect is different in its cause from a kink effect produced in the low breakdown voltage MIS. The present inventors have found a problem in that the mere formation of rounding at the shoulder portion of the semiconductor substrate makes it impossible to sufficiently suppress the kink effect in the case of the high breakdown voltage MIS.

Figure 107:
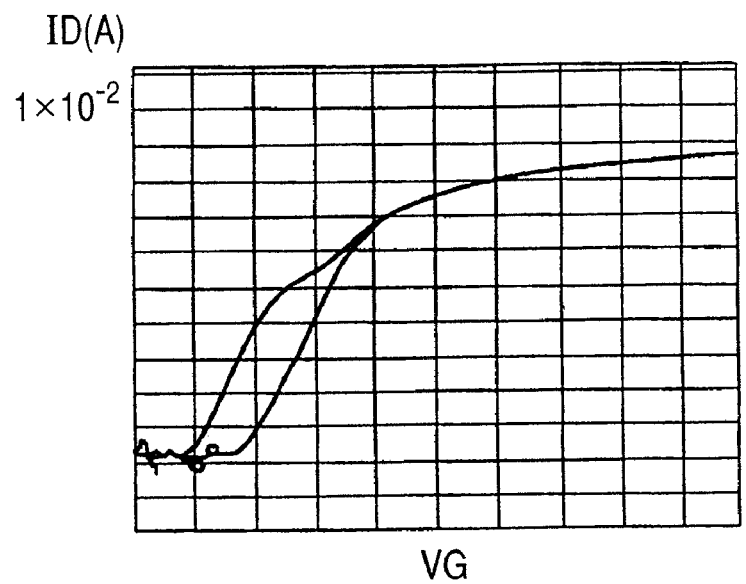
FIG. 107 is a waveform diagram showing kink waveforms produced in a high breakdown voltage field effect transistor.
Figure 108:
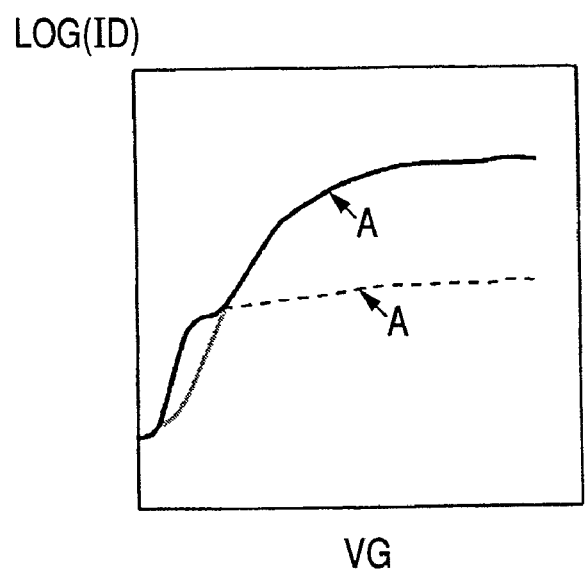
FIG. 108 is a diagram illustrating the kink waveforms shown in FIG. 107.

FIG. 107 shows one example illustrative of actually measured waveforms of drain currents ID with respect to gate voltages VG of a high breakdown voltage MIS. FIG. 108 is a view of the measured waveforms shown in FIG. 107. A solid line A in FIG. 108 indicates a channel current of the high breakdown voltage MIS, and a broken line B indicates an edge current at both ends of a channel region of the high breakdown voltage MIS, as viewed in its longitudinal direction (gate width direction). Particularly, when the isolation portions are formed of trench types, as described above, a small leakage current (μA or more) flows through both longitudinal ends of the channel region along the boundaries between active regions and the isolation portions at both ends thereof due to stress and a reduction in impurity concentration, thereby causing a kink effect. The reason why the kink effect at the high breakdown voltage MIS cannot be sufficiently suppressed by the mere formation of a rounding at the shoulder portion of the semiconductor substrate, as described above, is that the cause of the kink effect at the high breakdown voltage MIS results from a peculiar configuration of the high breakdown voltage MIS and is different from the cause of the kink effect of the low breakdown voltage MIS.

A first reason is as follows: The thickness of a gate insulating film for the high breakdown voltage MIS must be set much thicker than that for the low breakdown voltage MIS to ensure the necessary gate breakdown voltage. However, the threshold voltage must be lowered to normally operate it even with such a thick gate insulating film. To this end, the impurity concentration (concentration of an impurity that forms a conduction type opposite to a drain region) of the channel region must be set low. Therefore, the kink effect is easy to occur.

Figure 109:
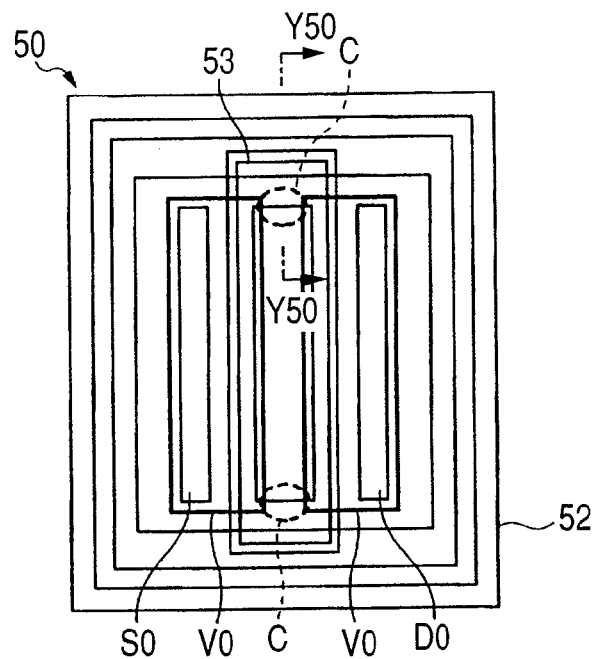
FIG. 109 is a fragmentary plan view showing a high breakdown voltage field effect transistor that is free of countermeasures against kinks.
Figure 110:
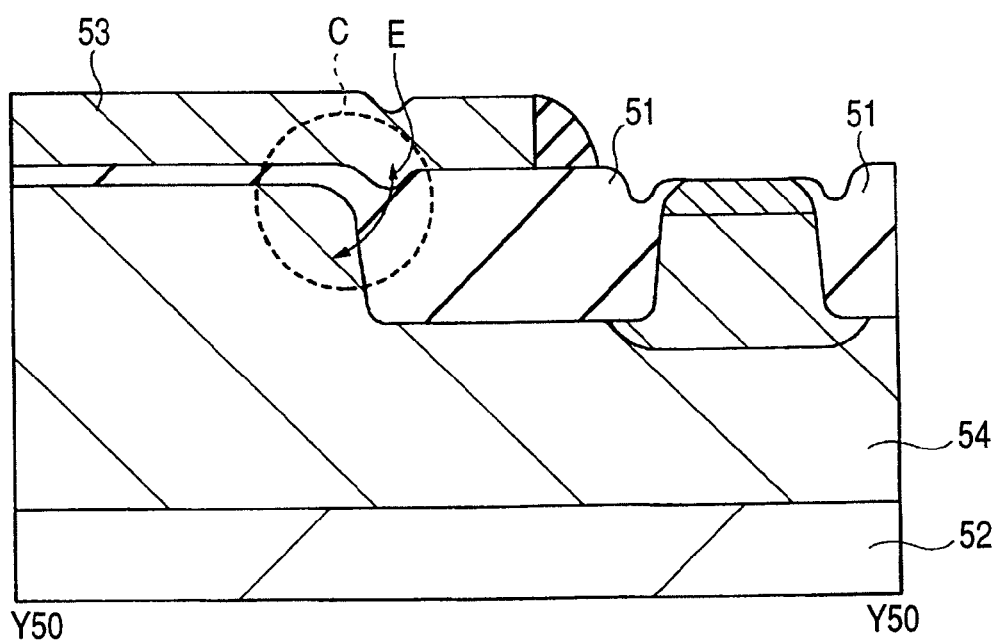
FIG. 110 is a cross-sectional view taken along line Y50-Y50 of FIG. 109.

A second reason will be explained using FIGS. 109 and 110. FIG. 109 is a plan view showing one example of a high breakdown voltage MIS50 that is free of application of any kink countermeasures thereto, and FIG. 110 is a cross-sectional view taken along line Y50-Y50 of FIG. 109. Symbols V0 indicate semiconductor regions each having a field relaxing function of the high breakdown voltage MIS50, Symbol S0 indicates a source region, and symbol D0 indicates a drain region. The kink effect is easy to occur in regions C at both ends of a channel region, as viewed in its longitudinal direction (gate width direction). This results for the following reasons: The upper surface of a trench type isolation portion 51 might be recessed as viewed from an upper surface of a semiconductor substrate 52 due to a wet etching process or the like. In such a case, however, the distance E between each of both ends of a gate electrode 53 and a semiconductor substrate 52 portion at the sidewall of the trench type isolation portion 51 becomes short, with the result that an electric field produced by the gate electrode 53 is applied to the semiconductor substrate 52 portion at the sidewall of the trench type isolation portion 51 to induce carriers at the semiconductor substrate 52 portion, thus forming a channel even at the semiconductor substrate 52 portion at the sidewall of the trench type isolation portion 51. However, since the impurity concentration profile of a deep well 54 becomes gradually low as it becomes deep from a main surface of the semiconductor substrate 52 in the high breakdown voltage MIS, the threshold voltage at the semiconductor substrate 52 portion at the sidewall of the trench type isolation portion 51 becomes lower than that at the main surface portion of the semiconductor substrate 52. Since the channel width at the semiconductor substrate 52 portion at the sidewall of the isolation portion 51 is narrow, a saturation current is also less reduced and the current is regarded as the sum of currents that flow through two types of MISs (main surface portion and sidewall portion of semiconductor substrate 52), whereby a stepwise kink waveform is produced.

As described in each of the patent documents 1 through 3, there is a known method of providing the high concentration regions at both ends, as viewed in the gate width direction, to thereby suppress or prevent the kink effect at the low breakdown voltage MIS. However, since the high breakdown voltage MIS and the low breakdown voltage MIS are different in configuration, as described above, and are also different in terms of the cause of the kink effect due to the configuration, the technique of forming the high concentration regions at both ends in the gate width direction cannot be simply applied to the high breakdown voltage MIS as it is. This is because, since the high concentration regions are provided so as to contact the source and drain in each of the techniques described in the patent documents 1 and 2, for example, malfunctions like an inability to ensure a drain breakdown voltage necessary for the high breakdown voltage MIS, etc. occur if it is applied to the high breakdown voltage MIS as it is.

First Preferred Embodiment

Figure 4:
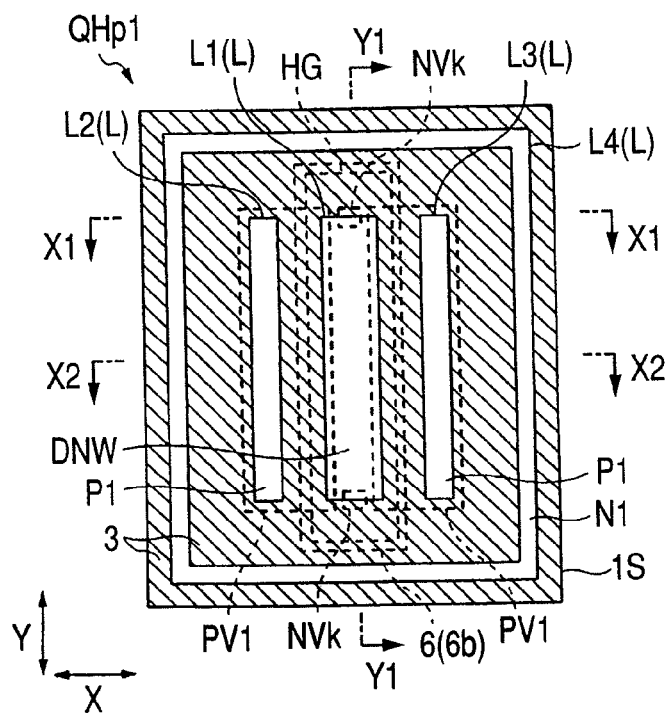
FIG. 4 shows the same spot as FIG. 1 and is a fragmentary plan view particularly illustrating isolation regions and active regions.

A first embodiment of the present invention will be described with reference to FIGS. 1 through 9. Although a description will be made here of a case in which the present invention is applied to a high breakdown voltage pMIS, the present invention can also be applied to a high breakdown voltage nMIS by setting p and n conduction types in reverse. Although FIG. 4 is a plan view, the isolation regions are given hatching to make it easy to read the drawings. A first direction X corresponds to a transverse direction as viewed from side to side in each drawing and indicates a gate length direction (channel length direction) or lateral direction of the gate electrode HG. A second direction Y corresponds to the direction normal to the first direction X. Further, the second direction Y indicates a vertical direction as seen in upward and downward directions and indicates a gate width direction or a longitudinal direction of the gate electrode HG.

The high breakdown voltage pMIS (first, fifth and sixth high breakdown voltage field effect transistors) QHp1 of the semiconductor device according to the present embodiment is applied to, for example, a driver circuit of a liquid crystal display device, a motor control driver circuit for performing high current control, etc. A power supply voltage on the high potential side is about 40V, and a power supply voltage on the low potential (reference potential) side is, for example, 1.5 (zero) V and is set to have such a structure as to be able to realize, for example, a breakdown voltage of 100V.

A semiconductor substrate (hereinafter called simply "substrate") 1S comprises, e.g., a p type silicon (Si) monocrystal. The high breakdown voltage pMISQHp1 is disposed over its main surface (device forming surface). The high breakdown voltage pMISQHp1 is surrounded by a deep n type well (third, seventh and eighth semiconductor regions) DNW and a plane-frame shaped $n^+$ type well NW1 electrically connected thereto even on plane and sectional bases. Thus, the high breakdown voltage pMISQHp1 is electrically isolated from the substrate 1. An impurity like, for example, phosphor (P) or the like is introduced into both the deep n type well DNW and the $n^+$ type well NW1. However, the impurity concentration of the $n^+$ type well NW1 is set so as to be higher than the impurity concentration of the deep n type well DNW. An $n^+$ type semiconductor region N1 which is higher in impurity concentration is formed over the $n^+$ type well NW1 to make ohmic contact with a metal wiring corresponding to a wiring layer. A silicide layer 2 like, for example, cobalt silicide ($CoSi_2$ or the like) is formed over the upper surface of the $n^+$ type semiconductor region N1. As the silicide layer 2, various silicide layers, such as titanium silicide ($TiSi_2$), platinum silicide ($PtSi_2$), nickel silicide ($NiSi_2$) or tungsten silicide ($WSi_2$), etc. may be used as an alternative to the cobalt silicide.

As shown in FIG. 4, trench type isolation portions 3, each referred to as, for example, "STI (Shallow Trench Isolation) or SGI (Shallow Groove Isolation)" as a device isolation region, are formed over the main surface of the substrate 1S. Consequently, active regions L (L1 through L4) are defined. In FIG. 4, regions given hatching correspond to regions in which the isolation portions 3 are formed. The trench type isolation portions 3 are formed by embedding an insulating film like, for example, silicon oxide ($SiO_2$ or the like) into their corresponding trenches defined in the main surface of the substrate 1.

Figure 5:
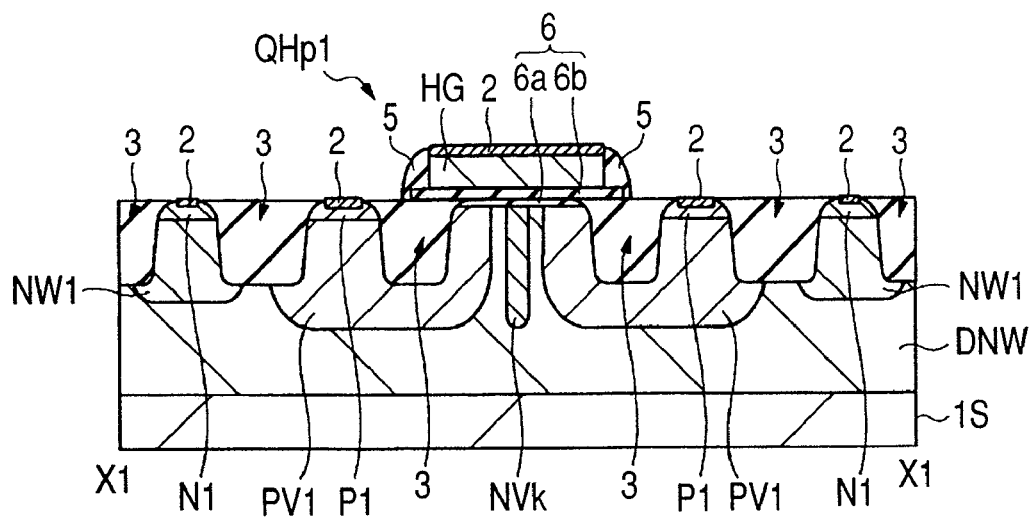
FIG. 5 is a cross-sectional view taken along lines X1-X1 of FIGS. 1 through 4.
Figure 6:
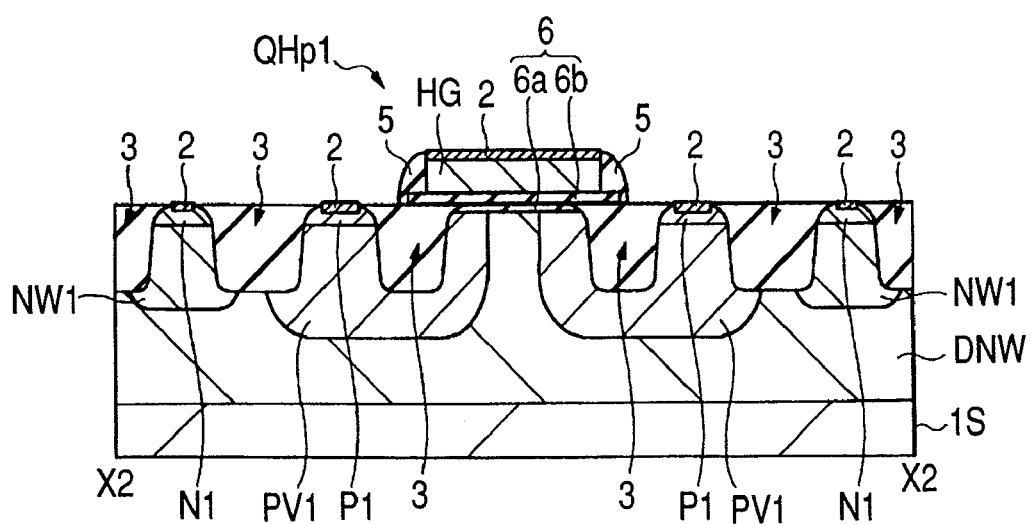
FIG. 6 is a cross-sectional view taken along lines X2-X2 of FIGS. 1 through 4.
Figure 7:
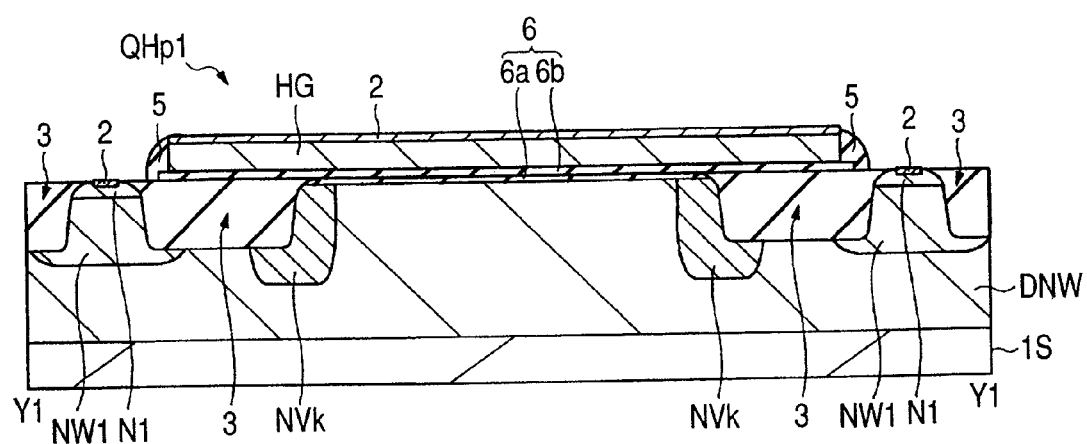
FIG. 7 is a cross-sectional view taken along lines Y1-Y1 of FIGS. 1 through 4.

As shown in FIGS. 5 through 7, shoulder portions (corner portions formed by the main surface of the substrate 1S and upper side surfaces of the isolation portions 3) of the substrate 1S, which are brought into contact with the upper parts of the isolation portions 3, are formed so as to produce a rounding. It is known that, since mechanical stress concentrates on the shoulder portions of the substrate 1S when the isolation portions 3 are configured as trench type structures, the lattice constant of silicon at the shoulder portions changes and the mobility of carriers at the shoulder portions rises, so that a kink effect is easy to occur. Thus, since it is possible to relax the mechanical stress applied on the shoulder portions owing to the formation of rounding at the shoulder portions of the substrate 1S, the occurrence of the kink effect in the high breakdown voltage pMISQHp1 can be suppressed. However, the kink effect at the high breakdown voltage MIS cannot be sufficiently suppressed only by use of such a configuration as described above. Incidentally, the bottoms of trenches of the isolation portions 3 are terminated at positions shallower than the deep n type well DNW.

Of the active regions L defined by such isolation portions 3, the central active region L shaped in the form of a plane strip is a region including a region (channel region) in which a channel of the high breakdown voltage pMISQHp1 is formed. The deep n type well DNW is placed in the channel region of the active region L1. That is, the channel region is set to an n type upon non-operation. By controlling the impurity concentration of the deep n type well DNW in the channel region of the active region L1 and the concentration of an impurity introduced therein, the threshold voltage of the high breakdown voltage pMISQHp1 is determined.

p+ type semiconductor regions (first, eleventh and twelfth semiconductor regions) P1 and P1 for the source and drain of the high breakdown voltage pMISQHp1 are respectively disposed in the active regions L2 and L3 located on both sides of the central active region L1. Although the p+ type semiconductor regions P1 and P1 for the source and drain thereof are isolated from the channel region of the central active region L1 owing to the existence of the isolation portion 3 between the central active region L1 and the right and left active regions L2 and L3, they are electrically connected to the channel region through p− type semiconductor regions (second semiconductor region) PV1 and PV1 each having a field relaxing function, which involve therein the p+ type semiconductor regions P1 and P1.

In the p− type semiconductor regions PV1 and PV1, one of the ends thereof extending in the first direction X is formed to protrude, as seen in plan view, by a predetermined length toward the active region L1 (i.e., below the gate electrode HG) across the isolation portion 3 between the active region L1 and the active regions L2 and L3 in such a manner that the deep n type well DNW corresponding to the channel region remains between the p− type semiconductor regions PV1 and PV1. On the other hand, the other ends in the first direction X, of the p− type semiconductor regions PV1 and PV1 and both ends thereof in the second direction Y are respectively terminated at positions where they are not brought into contact with the n+ type well NW1. Although the bottoms of the p− type semiconductor regions PV1 and PV1 extend to their corresponding positions deeper than the isolation portion 3, as seen in section, they are respectively terminated at positions shallower than the deep n type well DNW. With the adoption of such a configuration, the drain breakdown voltage of the high breakdown voltage pMISQHp1 can be ensured.

Although an impurity like, for example, boron (B) or the like has been introduced in both of the p+ type semiconductor regions P1 and P1 for the source and drain and the p− type semiconductor regions PV1 and PV1, the p+ type semiconductor regions P1 and P1 are set so as to become higher in impurity concentration than the p− type semiconductor regions PV1 and PV1 in order to provide ohmic contact with metal wirings. The silicide layer 2 is formed over the upper surfaces of the p+ type semiconductor regions P1 and P1 for the source and drain.

A gate electrode HG of the high breakdown voltage pMISQHp1 is disposed over the central active region L1 so as to cover the full area of the active region L1. Some of both ends of the gate electrode HG, as seen in the second direction Y (gate width direction), extend to positions where some portions thereof overlap the n+ type well NW1 on a plane basis. Thus, it is possible to suppress or prevent the occurrence of a parasitic MIS in the surface of the deep n type well DNW to which the gate electrode HG is opposed, without reducing the breakdown voltage of the high breakdown voltage pMISQHp1. The gate electrode HG is formed of a conductor film, e.g., a low-resistance polycrystalline silicon obtained by being doped with phosphor (P) or the like, for example. The silicide layer 2 is formed over its upper surface. Although the silicide layer 2 is shown diagrammatically in the present embodiment, the present embodiment does not necessarily require the formation of the silicide layer 2. For instance, the gate electrode HG may be formed of only the low-resistance polycrystalline silicon doped with phosphor or the like.

Sidewalls 5 each formed of, for example, silicon oxide as an insulting film are formed over the side surfaces of the gate electrodes HG. A gate insulating film 6 is formed between the gate electrode HG and the main surface of the substrate 1S.

The gate insulating film 6 is formed of a laminated film consisting of an insulating film 6a comprising silicon oxide or the like formed over the main surface of the substrate 1S by, for example, a thermal oxidation method or the like, and an insulating film 6b comprising silicon oxide or the like deposited thereon by a Chemical Vapor Deposition (CVD, e.g., low pressure CVD method) method. The insulating film 6b formed by the CVD method, of the gate insulating film 6, is formed in such a way that its outer periphery slightly protrudes from the outer periphery of the gate electrode HG, as seen in plan view.

The n+ type semiconductor region N1 is disposed in the outermost peripheral active region L4 shaped in the form of a plane frame. Incidentally, the active region L4, n+ type semiconductor region N1 and n+ type well NW1 generally surround a plurality of high breakdown voltage MISs in an actual semiconductor device. The manner in which they surround one high breakdown voltage pMISQHp1 will be illustrated for the sake of simplification of explanation.

On the other hand, when the high breakdown voltage MIS is used as mentioned above, the kink effect cannot sufficiently be suppressed only by the technique of rounding the shoulder portions (corner portions formed by the main surface of the substrate 1S and the upper side surfaces of the isolation portions 3) of the substrate 1S, which are brought into contact with the upper parts of the isolation portions 3, which technique has been illustrated as a countermeasure against the kink effect for the low breakdown voltage MIS. Thus, in the present embodiment, n+ type semiconductor regions (fourth, thirteenth and fourteenth semiconductor regions) NVk, which are opposite in conduction type to the p+ type semiconductor regions P1 and P1 for the source and drain, are partially formed at both ends in the second direction Y, of the central active region L1, in boundary regions between the trench type isolation portions 3 at both ends in the second direction Y, of the channel region of the high breakdown voltage pMISQHp1 and the substrate 1S, as shown in FIGS. 1 through 5 and FIG. 7. Thus, the threshold voltages at both ends (i.e., the sidewall portions) in the second direction Y, of the channel region can be set higher than the threshold voltage in the center (i.e., the main surface portion) of the channel region. That is, the MIS is easy to operate in the center of the channel region, whereas the MIS is hard to operate at both ends of the channel region, as viewed in the second direction Y. Therefore, even if the upper surface of the isolation portion 3 is recessed, the occurrence of the kink effect can be suppressed or prevented. Thus, it is possible to improve the characteristic of the high breakdown voltage MIS. Incidentally, although the threshold voltages are expressed as high here, the negative side is expressed as high as viewed from a source potential (e.g., 0V) because the high breakdown voltage pMIS is being considered by way of example here.

The technique of forming the high concentration regions at both ends in the channel width direction (second direction Y) as countermeasures against the kink effect at the low breakdown voltage MIS cannot be applied to the high breakdown voltage MIS according to the present embodiment as it is. This is because a problem arises in that, if a high breakdown voltage MIS like the present embodiment follows the countermeasures against the kink effect at the low breakdown voltage MIS as it is and the n+ type semiconductor regions NVk and the p− type semiconductor regions PV1 and PV1 are brought into contact with one another, then the high concentration regions contact each other, so that the drain breakdown voltage necessary for the high breakdown voltage MIS cannot be ensured. Since it is necessary to reduce the impurity concentrations of both ends in the channel width direction in the case of a product whose targeted drain breakdown voltage is high in particular, the $n^+$ type semiconductor regions NVk cannot be simply disposed. Thus, in the present embodiment, the $n^+$ type semiconductor regions NVk for the kink countermeasures are placed at positions spaced away from the $p^-$ type semiconductor regions PV1 and PV1 so as not to contact the $p^-$ type semiconductor regions PV1 and PV1 (the drain side in particular), each having the field relaxing function. Therefore, it is possible to prevent a reduction in the drain breakdown voltage of the high breakdown voltage pMISQHp1. Thus, according to the present embodiment, the suppression or prevention of the kink effect and the ensuring of the drain breakdown voltage can be made compatible.

The $n^+$ type semiconductor regions NVk for the kink countermeasures are disposed so as to straddle both regions of the active region L1 and the isolation portion 3. The concentration of the n type impurity of each $n^+$ type semiconductor region NVk is set higher than that of the n type impurity of the deep n type well DNW of the channel region. As seen in section, the $n^+$ type semiconductor regions NVk extend to positions each deeper than the bottom of the isolation portion 3 from the main surface of the substrate 1S and reach approximately the same depth as the bottom of each of the $p^+$ type semiconductor regions P1 and P1. However, the $n^+$ type semiconductor regions NVk are terminated at positions shallower than the deep n type well DNW. Forming the $n^+$ type semiconductor regions NVk for the kink countermeasures to positions deeper than the isolation portion 3 in this way makes it possible to enhance the capability of suppressing or preventing the occurrence of the kink effect. That is, since the threshold value or voltage at the shoulder portion of the substrate 1S, which contacts its corresponding upper portion of the isolation portion 3, can be made high, the occurrence of the kink effect can be suppressed.

When the potential of the $p^+$ type semiconductor region P1 for the source, of the $p^+$ type semiconductor regions P1 and P1 for the source and drain, is used at a potential always identical to the n type well DNW, the $n^+$ type semiconductor regions NVk for the kink countermeasures may be brought into contact with the $p^+$ type semiconductor region P1 for the source. Thus, since an allowance for alignment of each $n^+$ type semiconductor region NVk for the kink countermeasures can be increased, its layout can be facilitated.

Figure 8:
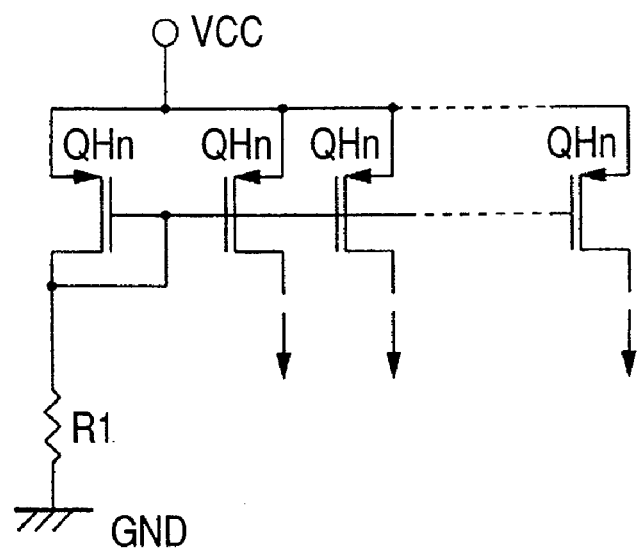
FIG. 8 is a circuit diagram showing one example of a circuit using high breakdown voltage field effect transistors.
Figure 9:
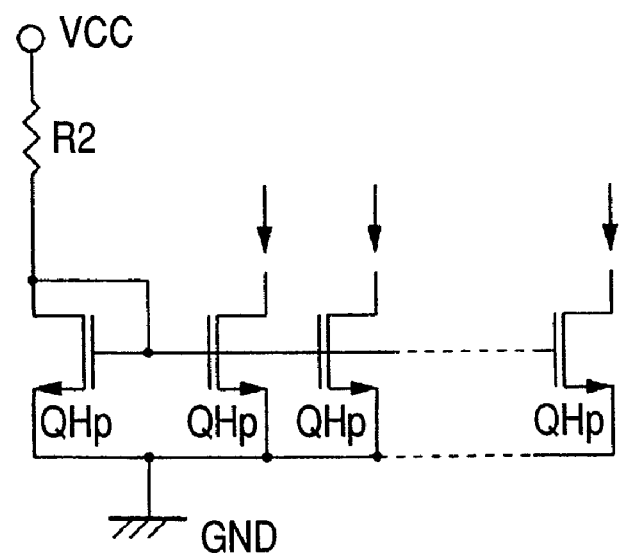
FIG. 9 is a circuit diagram illustrating another example of a circuit using high breakdown voltage field effect transistors.

FIGS. 8 and 9 respectively show examples of circuits using high breakdown voltage MISs. FIGS. 8 and 9 illustrate constant current circuits each having a differential circuit using high breakdown voltage MISs. FIG. 8 depicts a constant current source push circuit heavily used in analog circuits. FIG. 8 illustrates, as an example, a case in which the constant current source push circuit comprises a plurality of high breakdown voltage nMISQHn which make use of gate electrodes and a source or power supply potential Vcc on the high potential side in common. That is, the power supply potential Vcc is applied to drain regions of the high breakdown voltage nMISQHn. Also, FIG. 9 illustrates a constant current source pull-in circuit frequently used in analog circuits. FIG. 9 illustrates, as an example, a case in which the constant current source pull-in circuit is formed of a plurality of high breakdown voltage pMISQHp which make use of gate electrodes and a source or power supply potential GND on the reference potential side in common. That is, the power supply potential Vcc is applied to the gate electrodes and drain regions of the high breakdown voltage pMISQHp. The power supply potential Vcc on the high potential side ranges from approximately 20 to 100V, for example, whereas the power supply potential GND on the reference potential side is 0 (zero) V, for example.

Symbols R1 and R2 in FIGS. 8 and 9 indicate resistors. The kink effect becomes a problem in particular in these circuits. This is because, assuming that no countermeasure against the kink effect is taken in these circuits, the actual current value is shifted from a design value due to the current that flows at each of both ends (sidewall portions of isolation portion 3) in the channel width direction even if an attempt is made to design a predetermined current value in the sizes (channel length and channel width) of each high breakdown voltage MIS. Since the kink effect can be suppressed or prevented in the present embodiment, in contrast, the error between the design value corresponding to the predetermined current value of each of the circuits and an actually measured value can be reduced. Thus, it is possible to improve the characteristics of these circuits.

Figure 111:
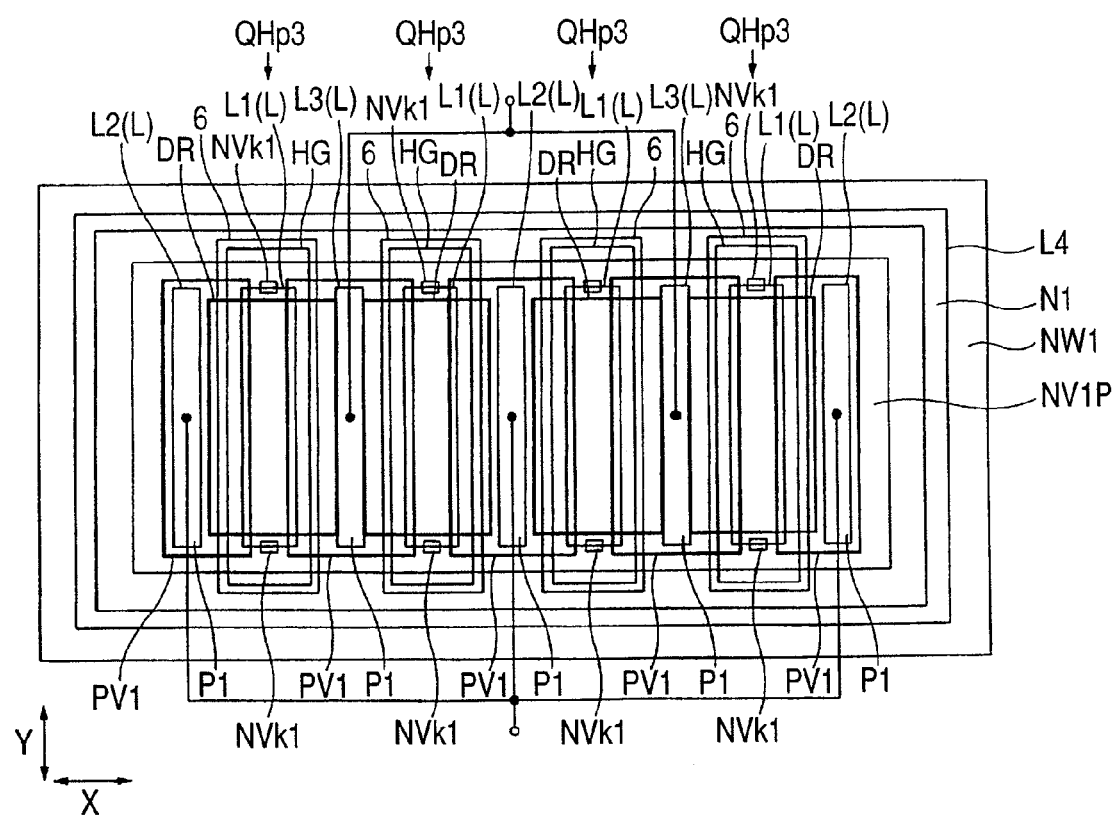
FIG. 111 is a fragmentary plan view showing one example in which the high breakdown voltage field effect transistor shown in FIG. 1, of the semiconductor device illustrative of the first embodiment of the present invention, is arranged in plural form.

Next, FIG. 111 shows one example of a fragmentary plan view in which a plurality of high breakdown voltage pMISQHp3 are arranged. The high breakdown voltage pMISQHp3 are disposed adjacent to one another in such a state that the directions (direction in which current flows) of their channels extend along a first direction X. The high breakdown voltage pMISQHp3 adjacent to one another are placed so as to share $p^+$ type semiconductor regions P1 and P2 for the source and drain. Then, an $n^+$ type semiconductor region N1 and an n type well NW1 are disposed so as to surround a group of the plural high breakdown voltage pMISQHp3.

Even in the case in which a reduction in the size of each high breakdown voltage pMISQHp3 is promoted with its miniaturization or scale-down, the kink effect can be suppressed or prevented owing to the provision of $n^+$ type semiconductor regions NVk1 in the present embodiment. Therefore, it is effective in reducing the size of each high breakdown voltage pMISQHp3. Thus, since a large size reduction is enabled as a whole even if the amount of the reduction in the size of each individual high breakdown voltage pMISQHp3 is assumed to be small, the size of a semiconductor chip having the high breakdown voltage pMISQHp3 can be greatly reduced.

Second Preferred Embodiment

While the first embodiment is directed to a configuration wherein both the source and drain are capable of ensuring their breakdown voltages between the source and drain and the well, the second embodiment will provide one example of a high breakdown voltage MIS structure in which no large breakdown voltage is required between the source and well. That is, since a source potential is different from a p type well potential in a circuit in which a p type well is connected to a common GND (an n type well is connected to a common Vcc in the case of a pMIS) in the case of an nMIS, a reverse bias breakdown voltage is needed to ensure the breakdown voltage between the source and well. Therefore, the source side is set to have the same structure as the drain side. That is, since about −16.5V is applied to the p type well as the reverse bias breakdown voltage and about 1.5V is applied to the source of the nMIS in the case of the nMIS, for example, the source side is set to the same structure as the drain side to ensure the breakdown voltage between the source and well. Thus, it is configured as a structure that is capable of ensuring a breakdown voltage of 40V or more. At this time, a low breakdown voltage MIS assumes such a structure that 10V or so can be ensured as the breakdown voltage between the source and well of the low breakdown voltage MIS. That is, the breakdown voltage between the source and well of the high breakdown voltage MIS is formed so as to become larger than the breakdown voltage between the source and well of the low breakdown voltage MIS. As such a circuit, for example, an output circuit, a step-up circuit or the like may be mentioned by way of example. However, such a circuit in which a difference in potential does not occur between the source and well does not require a reverse bias breakdown voltage for ensuring the breakdown voltage between the source and well. Therefore, only the drain side can be configured as a high breakdown voltage structure. With the adoption of such a structure, the size of the MIS can be reduced and the size of the area of the semiconductor chip can be scaled down.

Figure 10:
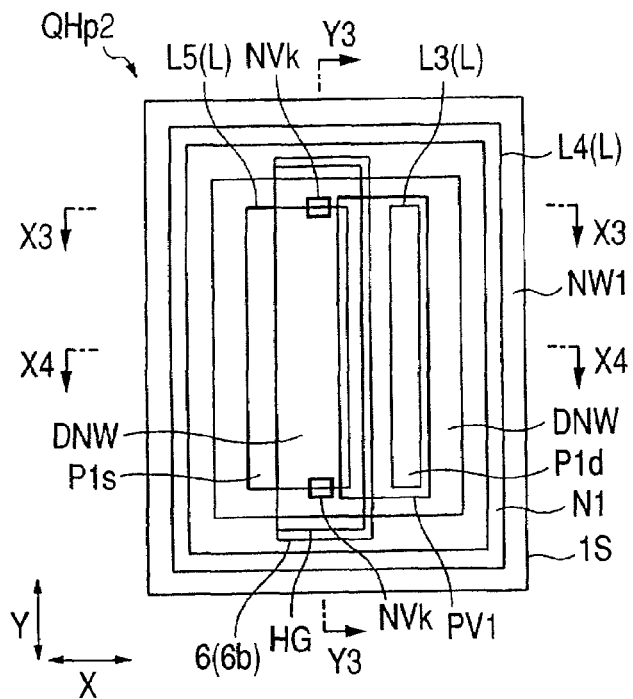
FIG. 10 is a fragmentary plan view illustrative of one example of a high breakdown voltage field effect transistor of a semiconductor device representing a second embodiment of the present invention.
Figure 11:
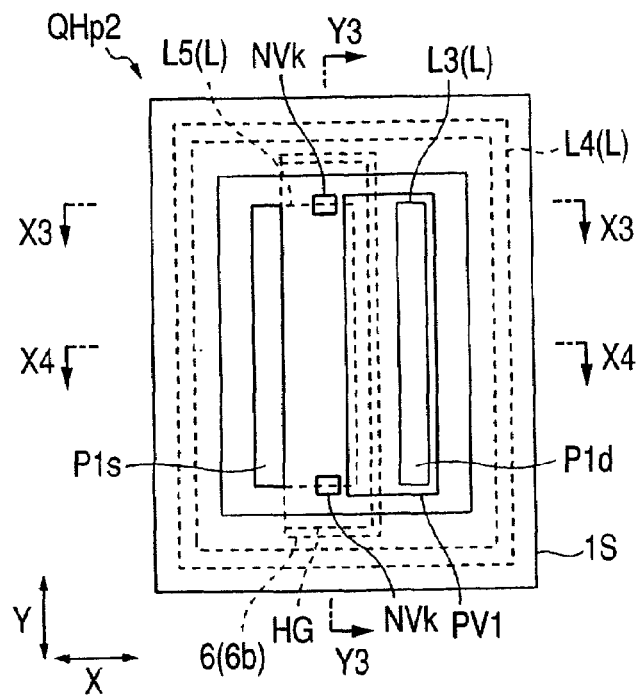
FIG. 11 shows the same spot as FIG. 10 and is a fragmentary plan view particularly illustrating a layout relationship among a semiconductor region having a field relaxing function of the high breakdown voltage field effect transistor, a $p^+$ type semiconductor region for a source thereof, and $n^+$ type semiconductor regions thereof.
Figure 12:
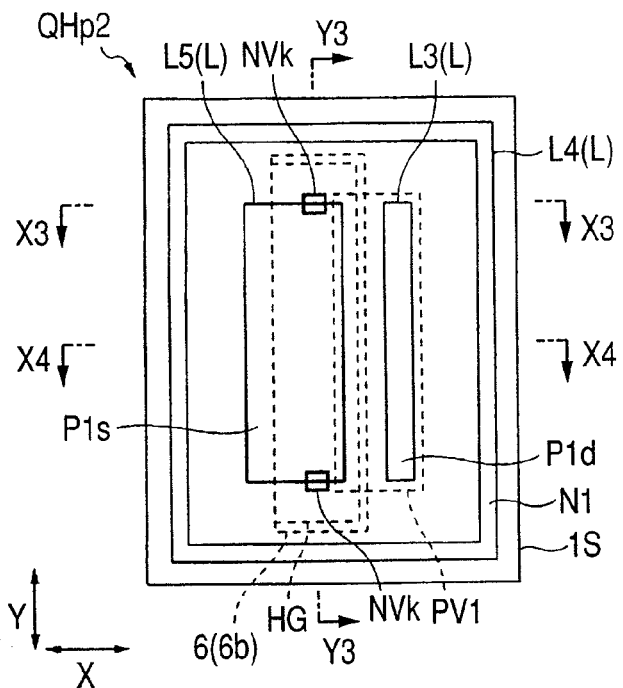
FIG. 12 shows the same spot as FIG. 10 and is a fragmentary plan view particularly illustrating a layout relationship among a gate electrode of the high breakdown voltage field effect transistor, active regions thereof, and $n^+$ type semiconductor regions thereof.
Figure 13:
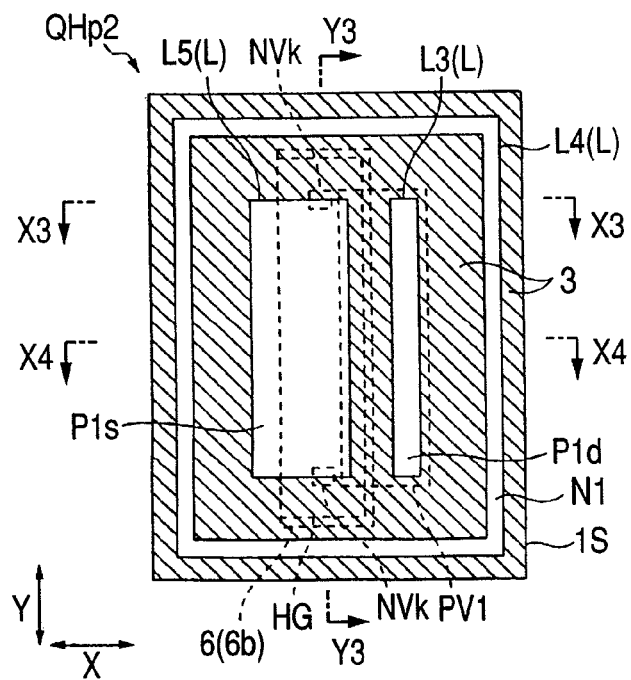
FIG. 13 shows the same spot as FIG. 10 and is a fragmentary plan view particularly illustrating isolation regions and active regions.
Figure 14:
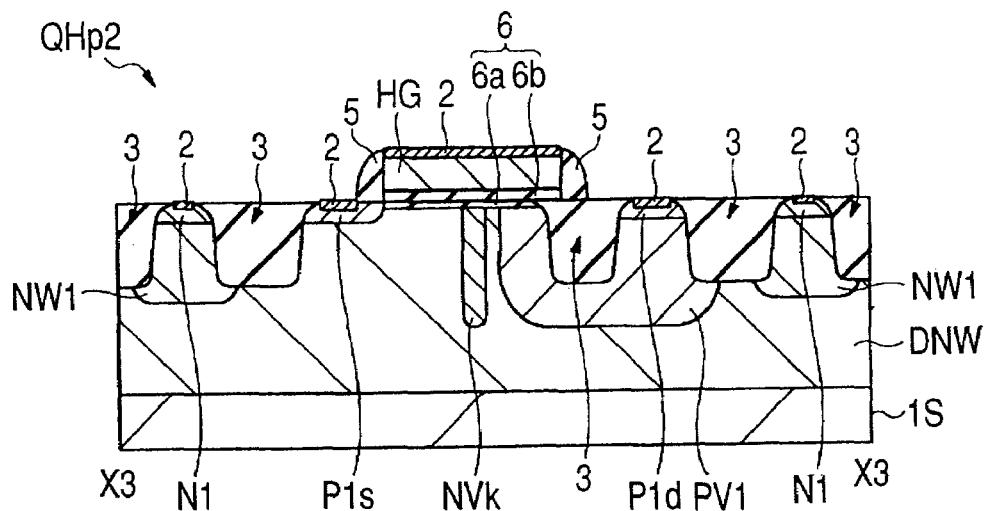
FIG. 14 is a cross-sectional view taken along lines X3-X3 of FIGS. 10 through 13.
Figure 15:
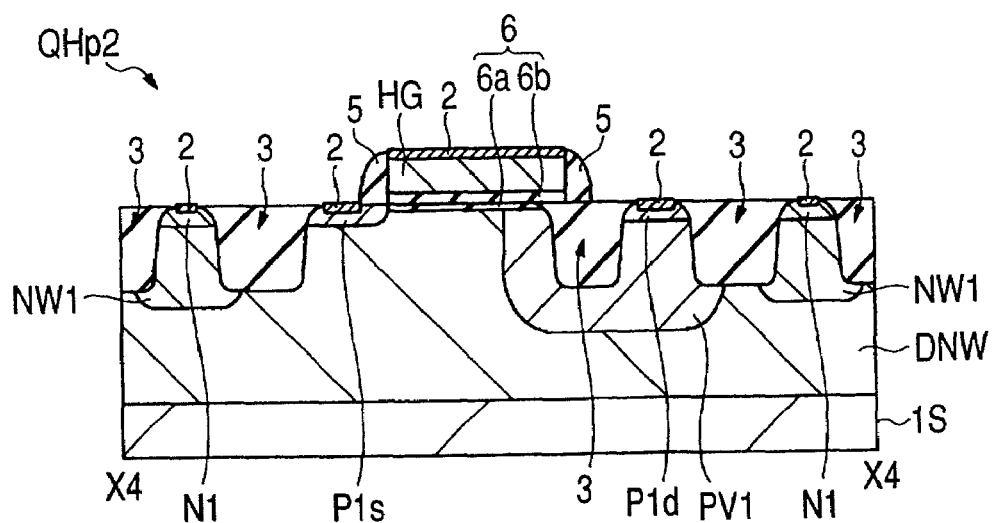
FIG. 15 is a cross-sectional view taken along lines X4-X4 of FIGS. 10 through 13.
Figure 16:
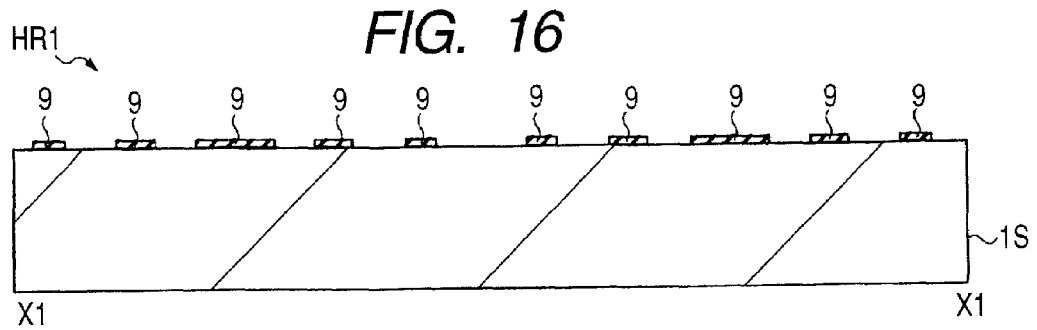
FIG. 16 is a fragmentary cross-sectional view showing a first forming region of a high breakdown voltage field effect transistor in a manufacturing process of a semiconductor device representing a third embodiment of the present invention.
Figure 17:
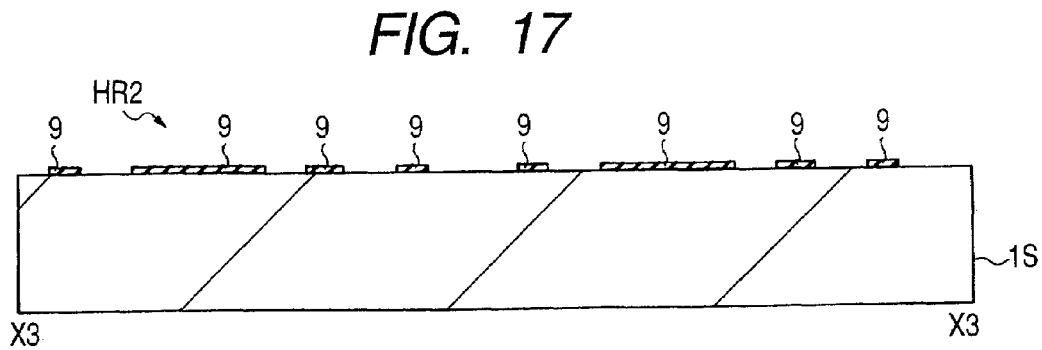
FIG. 17 is a fragmentary cross-sectional view illustrating a second forming region of the high breakdown voltage field effect transistor of the semiconductor device in the same manufacturing process as FIG. 16.
Figure 18:
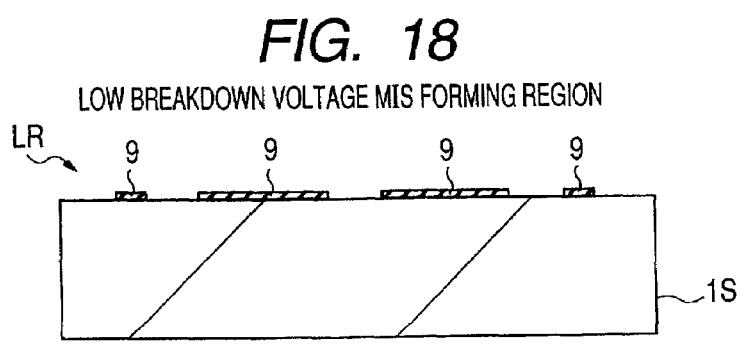
FIG. 18 is a fragmentary cross-sectional view showing a forming region of a low breakdown voltage field effect transistor of the semiconductor device in the same manufacturing process as FIG. 16.

FIG. 10 is a fragmentary plan view showing one example of the high breakdown voltage pMISQHp2, FIG. 11 is a fragmentary plan view particularly illustrating a layout relationship among a p⁻ type semiconductor region PV1 having a field relaxing function of the high breakdown voltage pMISQHp2, a p⁺ type semiconductor region PIs for a source thereof, and n⁺ type semiconductor regions NVk thereof, FIG. 12 is a fragmentary plan view particularly illustrating a layout relationship among a gate electrode HG of the high breakdown voltage pMiSQHp2, active regions L thereof, and n⁺ type semiconductor regions NVk thereof, FIG. 13 is a fragmentary plan view illustrating isolation regions and the active regions L, FIG. 14 is a cross-sectional view taken along lines X3-X3 of FIGS. 10 through 13, and FIG. 15 is a cross-sectional view taken along lines X4-X4 of FIGS. 10 through 13. Incidentally, since the cross-sectional view taken along lines Y3-Y3 of FIGS. 10 through 13 is identical to FIG. 7, which is illustrative of the cross-sectional view taken along lines Y1-Y1 shown in FIGS. 1 through 4, a repeated description thereof will be omitted. Although FIG. 13 is a plan view, the isolation regions are given hatching to make it easy to see the drawing. While a high breakdown voltage pMIS is being considered by way of example in the present embodiment, the present invention can be applied even to a high breakdown voltage nMIS in a manner similar to the first embodiment.

In the high breakdown voltage pMIS (second, seventh and eighth field effect transistors) QHp2 according to the present embodiment, an isolation portion 3 is interposed between a p⁺ type semiconductor region PId for a drain and a channel region in a manner similar to the first embodiment. The p⁺ type semiconductor region PId for the drain is electrically connected to the channel region of an active region L5 through the p⁻ type semiconductor region PV1 having the field relaxing function. On the other hand, no channel region 3 is interposed between the p⁺ type semiconductor region PIs for the source and the channel region. The p⁺ type semiconductor region PIs for the source and the channel region are disposed adjacent to each other within one active region L5 and are electrically connected to each other without via the p⁻ type semiconductor region PV1 having the field relaxing function. The gate electrode HG is not formed so as to cover the full area of the active region L5. In the active region L5, the channel region is formed at a portion (exclusive of the portion where the p⁻ type semiconductor region PV1 having the field relaxing function on the drain side is disposed) where the gate electrode HG overlaps on a plane basis, and the p⁺ type semiconductor region PIs for the source is disposed at a portion where the gate electrode HG does not overlap on a plane basis. In the present structure, a circuit configuration is adopted so that the potential supplied to the p⁺ type semiconductor region PIs for the source and the potential supplied to a deep n type well DNW become equal, i.e., no difference in potential occurs between the p⁺ type semiconductor region PIs and the deep n type well DNW.

In such an embodiment as mentioned above, the isolation portion 3 may not be provided between the p⁺ type semiconductor region PIs for the source and the channel region. The p⁻ type semiconductor region PV1 having the field relaxing function may not be provided on the p⁺ type semiconductor region PIs side. Therefore, it is possible to reduce the size of the high breakdown voltage pMISQHp2. In the actual semiconductor device as described above, a plurality of high breakdown voltage MISs are integrally disposed over the main surface of the substrate 1S. 1000-output type (1000) high breakdown voltage MISs might be disposed at a circuit's total output point or spot. Thus, even if a small size reduction is made to one high breakdown voltage pMISQHp2, a large size reduction can be realized as a whole. Therefore, the size of a semiconductor chip having the high breakdown voltage pMISQHp2 can be scaled down.

In such a configuration, the n⁺ type semiconductor regions NVk for the kink countermeasures may be brought into contact with the p⁺ type semiconductor region PIs for the source. Thus, since the allowance for alignment of the n⁺ type semiconductor regions NVk for the kink countermeasures can be increased, their layout can be facilitated.

In a manner similar to the first embodiment, the n⁺ type semiconductor regions NVk for the kink countermeasures are disposed so as to straddle both regions of the active region L and the isolation portion 3. The concentration of an n type impurity of each n⁺ type semiconductor region NVk is set higher than an n type impurity of the deep n type well DNW of the channel region. Also, the n⁺ type semiconductor regions NVk are formed to positions deeper than the isolation portion 3. Thus, it is possible to further enhance the capability of suppressing or preventing the occurrence of the kink effect.

Third Preferred Embodiment

A third embodiment will consider one example of a method of manufacturing a semiconductor device having high breakdown voltage MISs and low breakdown voltage MISs having the structures described in conjunction with the first and second embodiments, which are provided over the same substrate 1S, using FIGS. 16 through 63. Incidentally, symbol HR1 in FIGS. 16 through 63 indicates a region for forming the high breakdown voltage MISs, each having the structure described in the first embodiment, symbol HR2 indicates a region for forming the high breakdown voltage MISs, each having the structure described in the second embodiment, and symbol LR indicates a region for forming the low breakdown voltage MISs. Sections of the regions HR1 and HR2 for forming the high breakdown voltage MISs represent sectional views of spots corresponding to line X1-X1 of FIG. 1 and line X3-X3 of FIG. 10, respectively.

Figure 19:
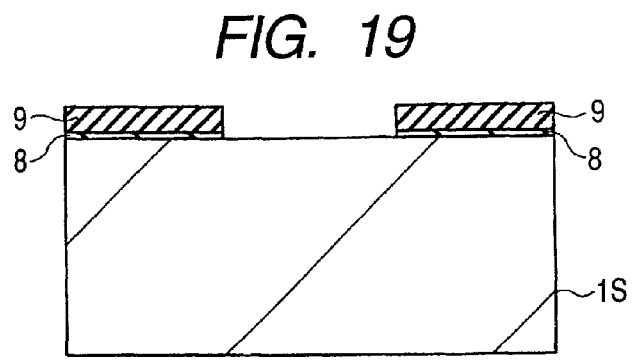
FIG. 19 is a fragmentary enlarged cross-sectional view illustrative of the structure of FIGS. 16 through 18.
Figure 20:
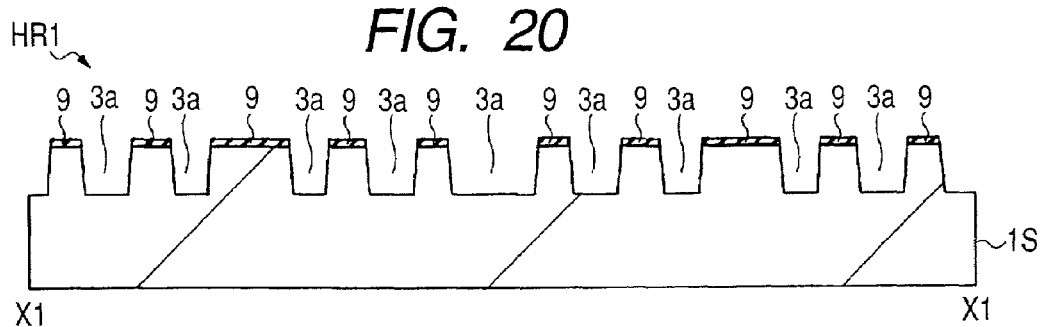
FIG. 20 is a fragmentary cross-sectional view following the manufacturing steps of FIGS. 16 through 19, showing the first forming region of the high breakdown voltage field effect transistor in the manufacturing process of the semiconductor device.
Figure 21:
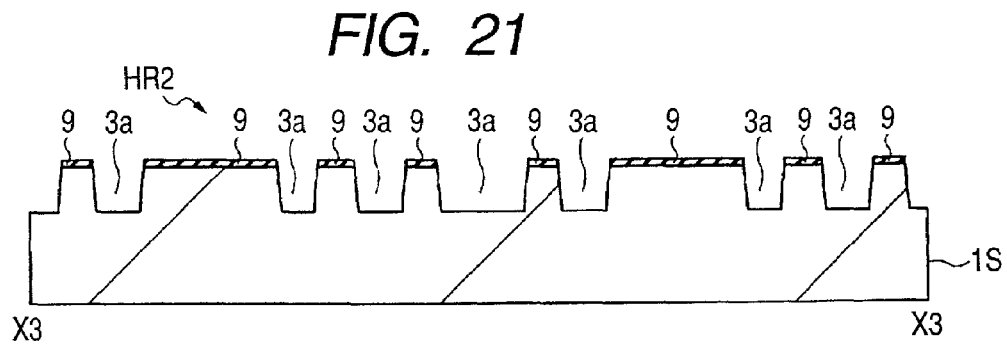
FIG. 21 is a fragmentary cross-sectional view illustrating the second forming region of the high breakdown voltage field effect transistor of the semiconductor device in the same manufacturing process as FIG. 20.
Figure 22:
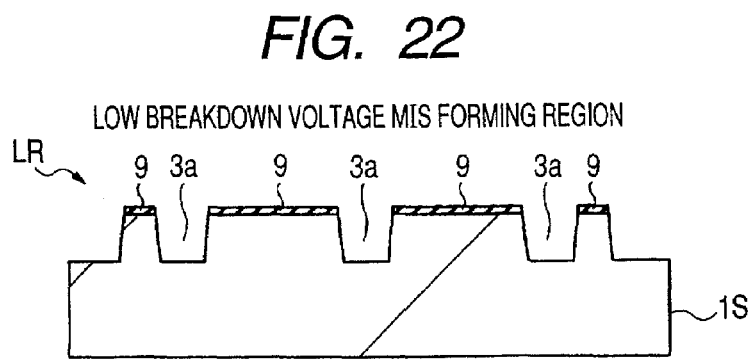
FIG. 22 is a fragmentary cross-sectional view showing the forming region of the low breakdown voltage field effect transistor of the semiconductor device in the same manufacturing process as FIG. 20.

Thermal oxidation processing is effected on the substrate 1S (plane circular wafer in the present embodiment) comprising a p type silicon (Si) monocrystal whose resistivity is, for example, 10 Ω·cm or less, as shown in fragmentary cross-sections of the substrate 1S in the same manufacturing process of FIGS. 16 through 19, whereby a thin insulating film 8 (see FIG. 19) comprising, for example, silicon oxide is formed over the main surface of the substrate 1S. Subsequently, an insulating film 9 comprising, for example, silicon nitride ($Si_3N_4$ or the like) is deposited over the insulating film 8 by a CVD method or the like. Further, a photoresist film (hereinafter called simply "resist film") is applied thereon and subjected to a dry etching process via a series of photolithography (hereinafter called simply lithography) processes like exposure and development, etc., to thereby form a layered pattern of the insulating films 8 and 9 in the forming region of the active region. Incidentally, FIG. 19 shows a fragmentary enlarged cross-sectional view illustrative of FIGS. 16 through 18.

Figure 23:
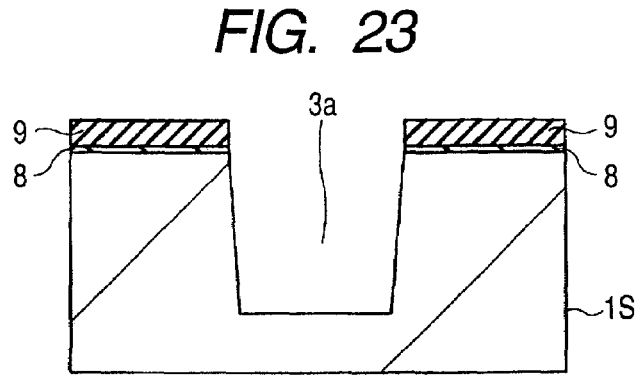
FIG. 23 is a fragmentary enlarged cross-sectional view of the structure of FIGS. 20 through 22.
Figure 24:
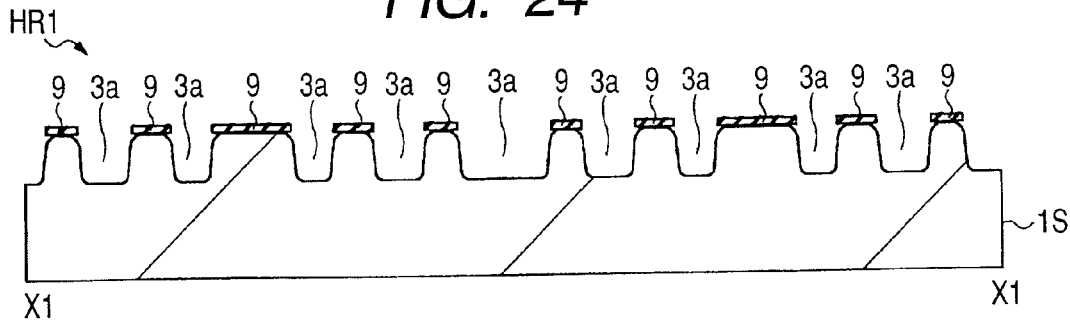
FIG. 24 is a fragmentary cross-sectional view following the steps of FIGS. 20 through 22, showing the first forming region of the high breakdown voltage field effect transistor in the manufacturing process of the semiconductor device.
Figure 25:
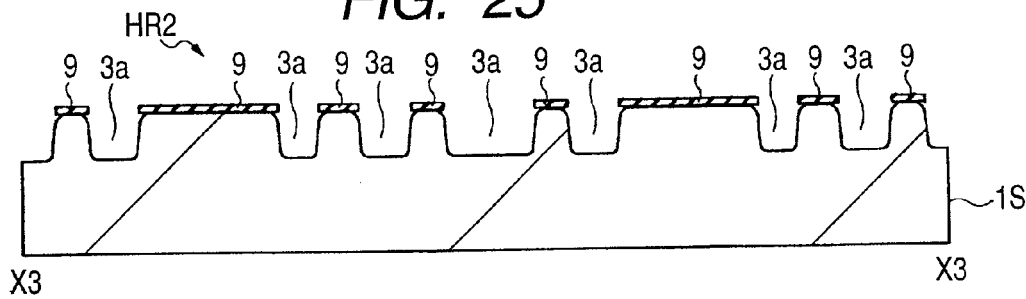
FIG. 25 is a fragmentary cross-sectional view illustrating the second forming region of the high breakdown voltage field effect transistor of the semiconductor device in the same manufacturing process as FIG. 24.
Figure 26:
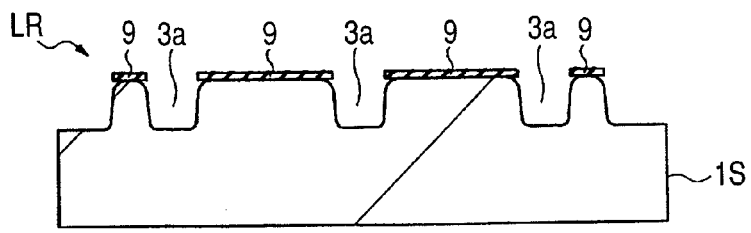
FIG. 26 is a fragmentary cross-sectional view showing the forming region of the low breakdown voltage field effect transistor of the semiconductor device in the same manufacturing process as FIG. 24.
Figure 27:
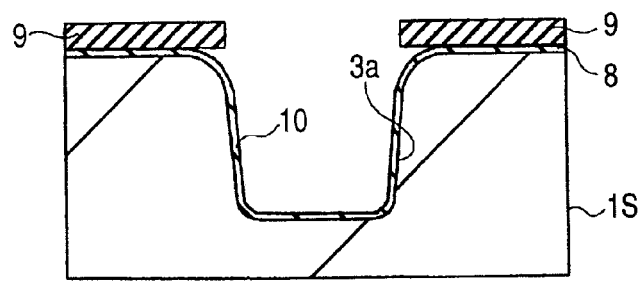
FIG. 27 is a fragmentary enlarged cross-sectional view of the structure of FIGS. 24 through 26.

Next, as shown in fragmentary cross-sections of the substrate 1S in the same manufacturing process of FIGS. 20 through 23, trenches 3a are defined in the main surface (device forming surface) of the substrate 1S with the insulating film 9 serving as an etching mask. In this stage, shoulder portions formed by the sidewalls of the trenches 3a and the main surface of the substrate 1S are angulated. FIG. 23 is a fragmentary enlarged cross-sectional view illustrative of FIG. 20 through 22. As shown in fragmentary cross-sections of the substrate 1S in the same manufacturing process of FIGS. 24 through 27, a dry oxidation process is subsequently effected on the substrate 1S (i.e., wafer) to form an insulating film 10 formed of silicon oxide or the like over the exposed surface of the substrate 1S including the inner surfaces of the trenches 3a, etc. Thus, the shoulder portions formed by the sidewalls of the trenches 3a and the main surface of the substrate 1S are formed with roundness or rounds.

Figure 28:
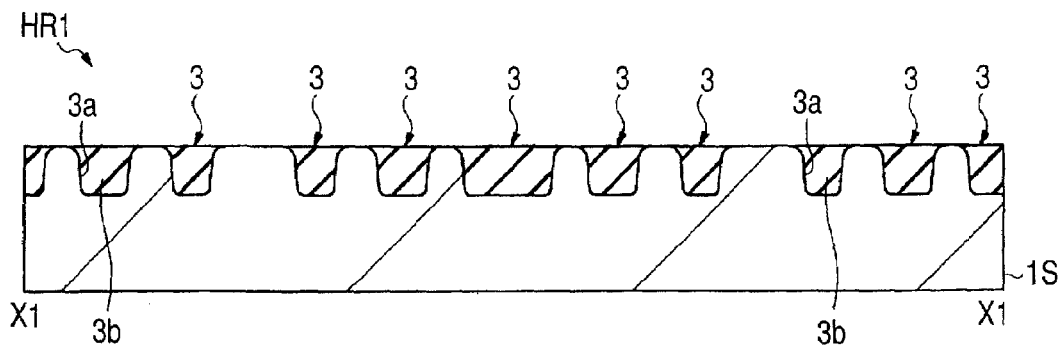
FIG. 28 is a fragmentary cross-sectional view following the steps of FIGS. 23 through 27, showing the first forming region of the high breakdown voltage field effect transistor in the manufacturing process of the semiconductor device.
Figure 29:
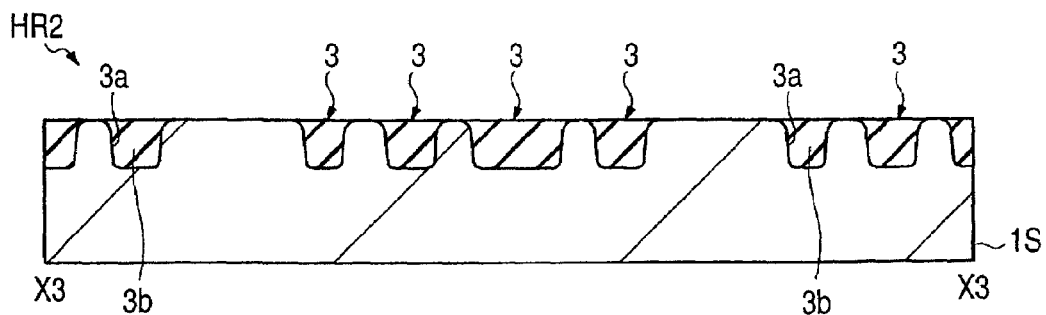
FIG. 29 is a fragmentary cross-sectional view illustrating the second forming region of the high breakdown voltage field effect transistor of the semiconductor device in the same manufacturing process as FIG. 28.
Figure 30:
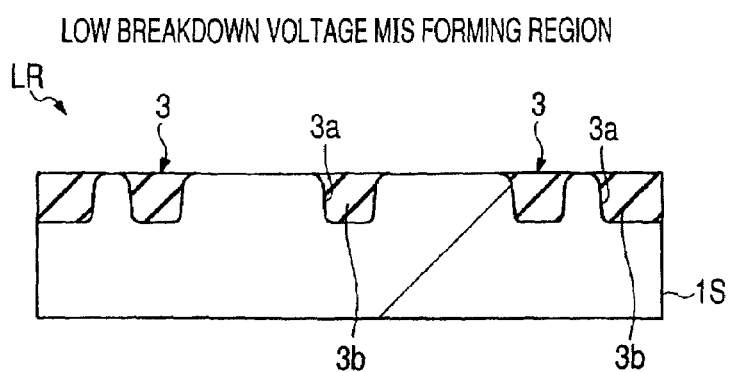
FIG. 30 is a fragmentary cross-sectional view showing the forming region of the low breakdown voltage field effect transistor of the semiconductor device in the same manufacturing process as FIG. 28.
Figure 31:
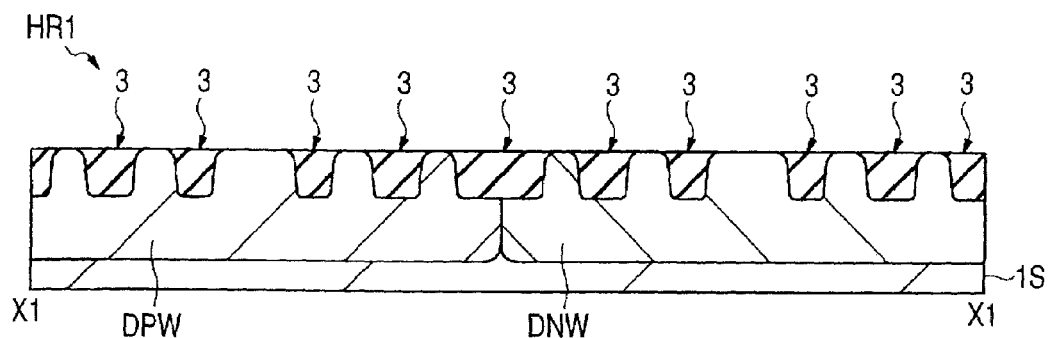
FIG. 31 is a fragmentary cross-sectional view following the steps of FIGS. 28 through 30, showing the first forming region of the high breakdown voltage field effect transistor in the manufacturing process of the semiconductor device.
Figure 32:
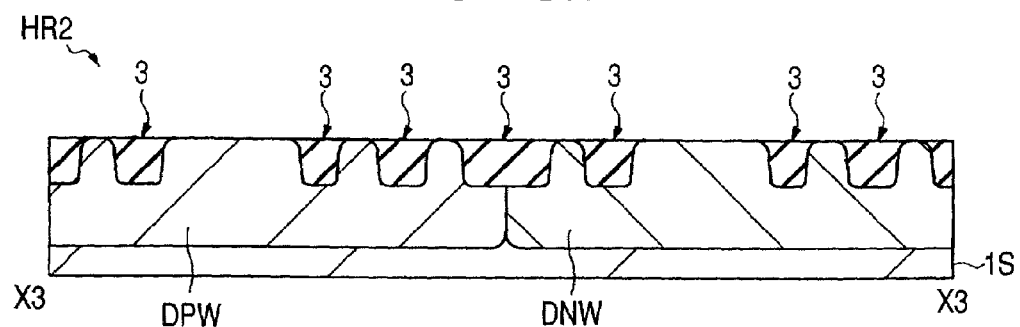
FIG. 32 is a fragmentary cross-sectional view illustrating the second forming region of the high breakdown voltage field effect transistor of the semiconductor device in the same manufacturing process as FIG. 31.
Figure 33:
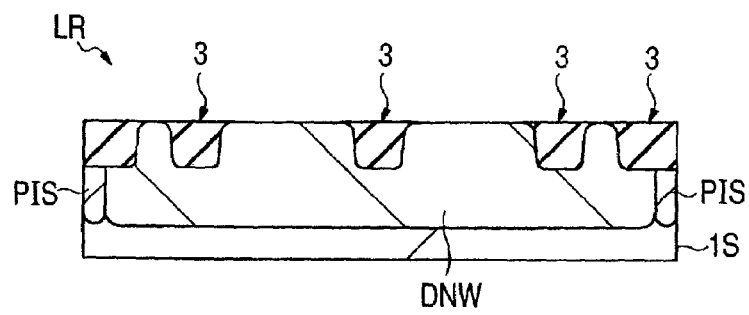
FIG. 33 is a fragmentary cross-sectional view showing the forming region of the low breakdown voltage field effect transistor of the semiconductor device in the same manufacturing process as FIG. 31.

Next, as shown in fragmentary cross-sections of the substrate 1S in the same manufacturing process of FIGS. 28 through 30, an insulating film 3b comprising, for example, silicon oxide is deposited over the main surface of the substrate 1S (i.e., wafer) by a CVD method or the like. Thereafter, it is polished by a Chemical Mechanical Polishing (CMP) method or the like to remove the insulating film 3b lying outside the trenches 3a. The insulating film 3b is embedded into the trenches 3a alone to form isolation portions 3. Subsequently, the insulating film 9 is removed by thermal phosphoric acid or the like and the insulating film 8 located therebelow is removed by a wet etching method to thereby expose the main surface of the active region. Thereafter, the subject 1S is subjected to the thermal oxidation process to form a thin insulating film comprising, for example, silicon oxide over the main surface of the active region. The thin insulating film serves as a through film at an ion implantation process step.

Next, for example, phosphor is selectively ion-implanted in a deep n type well forming region of the substrate 1S using the resist film as a mask and thereafter the resist film is removed. Subsequently, for example, boron (B) is selectively ion-implanted in a deep p type well forming region and p type semiconductor regions for isolation, of the substrate 1S using another resist film as a mask, and thereafter the resist film is removed. Afterwards, annealing or heat treatment is effected on the substrate 1S (i.e., wafer) in such a manner that the phosphor and boron introduced into the substrate 1S are diffused to, for example, a depth of 10 μm or so from the main surface of the substrate 1S, whereby a deep n type well DNW, a deep p type well (third, seventh and eighth semiconductor regions) DPW, and p type semiconductor regions PIS for isolation as shown in fragmentary cross-sections of the substrate 1S in the same manufacturing process of FIGS. 31 through 33.

Figure 34:
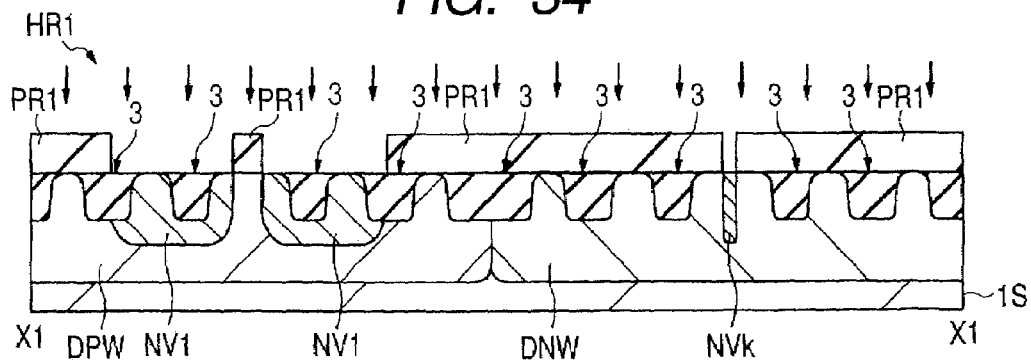
FIG. 34 is a fragmentary cross-sectional view following the steps of FIGS. 31 through 33, showing the first forming region of the high breakdown voltage field effect transistor in the manufacturing process of the semiconductor device.
Figure 35:
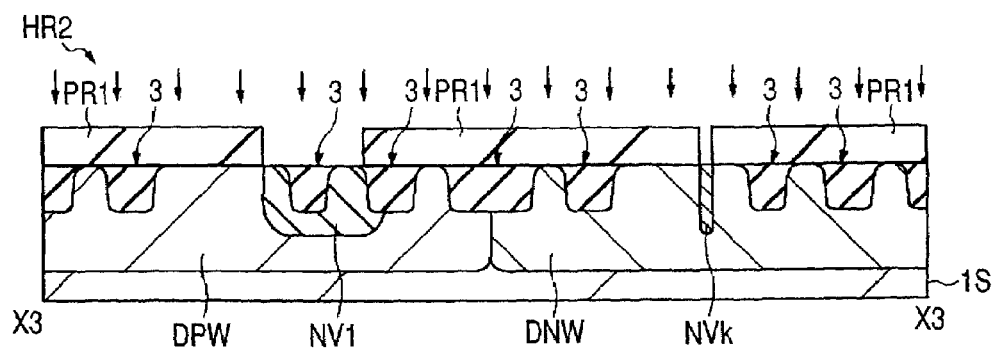
FIG. 35 is a fragmentary cross-sectional view illustrating the second forming region of the high breakdown voltage field effect transistor of the semiconductor device in the same manufacturing process as FIG. 34.
Figure 36:
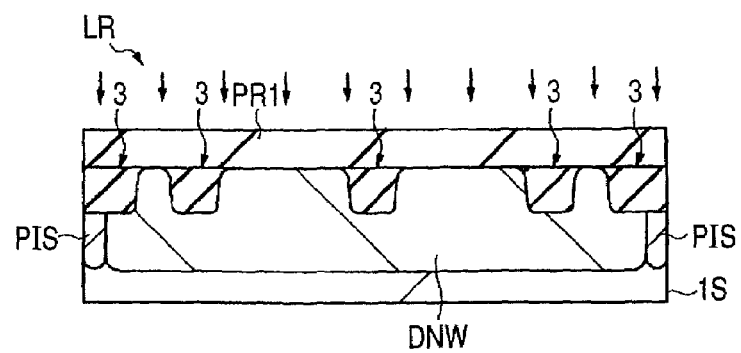
FIG. 36 is a fragmentary cross-sectional view showing the forming region of the low breakdown voltage field effect transistor of the semiconductor device in the same manufacturing process as FIG. 34.

Next, as shown in fragmentary sections of the substrate 1S in the same manufacturing process of FIGS. 34 through 36, a pattern of a resist film PR1 is formed over the main surface of the substrate 1 by a lithography process. The pattern of the resist film PR1 is formed in such a manner that both forming regions of n⁻ type semiconductor regions (second, ninth and tenth semiconductor regions) NV1 each having a field relaxing function in a high breakdown voltage nMIS forming region and n⁺ type semiconductor regions NVk for kink countermeasures in a high breakdown voltage pMIS forming region are exposed and ones other than them are covered. Subsequently, for example, phosphor is selectively introduced in the substrate 1S by ion implantation or the like using the pattern of the resist film PR1 as a mask. At this time, the semiconductor regions NV1 and the semiconductor regions NVk are formed so as to be deeper than the isolation portion 3. Forming the semiconductor regions NV1 in this way makes it possible to enhance the capability of suppressing or preventing the occurrence of a kink effect. Incidentally, in this stage, although the n⁻ type semiconductor regions NV1 each having the field relaxing function in the high breakdown voltage nMIS forming region, and the n⁺ type semiconductor regions NVk for the kink countermeasures in the high breakdown voltage pMIS forming region are not formed perfectly in a stage at which the impurities for forming these are introduced, those regions are also illustrated to make it easy to understand the description thereof.

Figure 37:
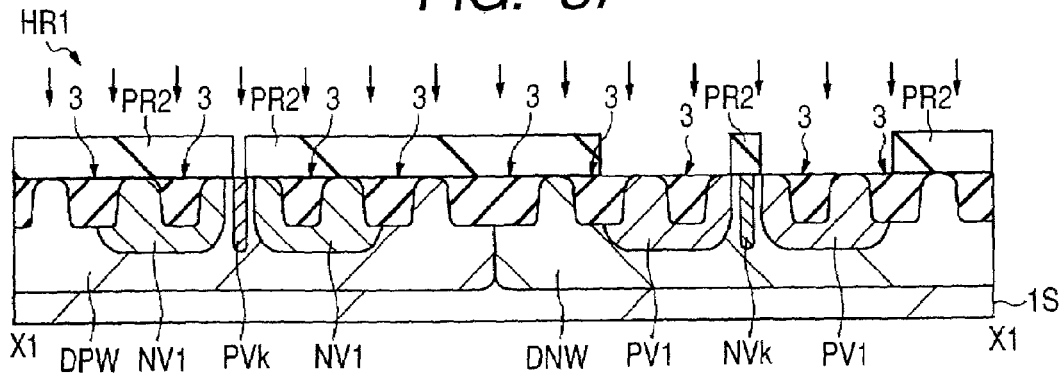
FIG. 37 is a fragmentary cross-sectional view following the steps of FIGS. 34 through 36, showing the first forming region of the high breakdown voltage field effect transistor in the manufacturing process of the semiconductor device.
Figure 38:
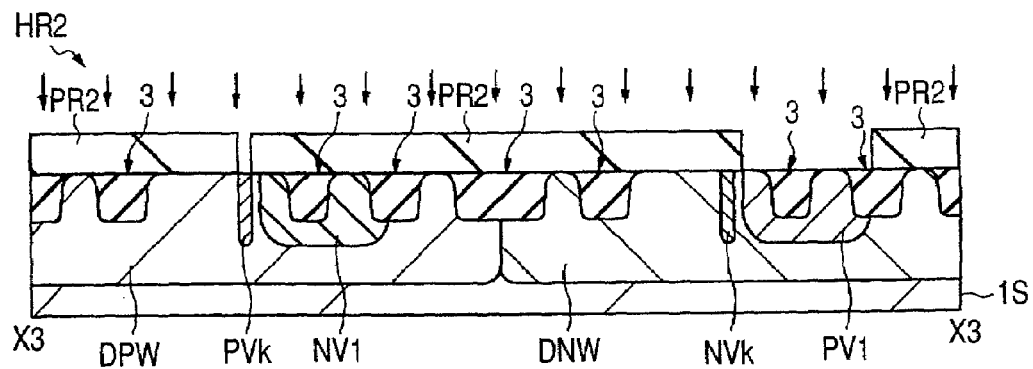
FIG. 38 is a fragmentary cross-sectional view illustrating the second forming region of the high breakdown voltage field effect transistor of the semiconductor device in the same manufacturing process as FIG. 37.
Figure 39:
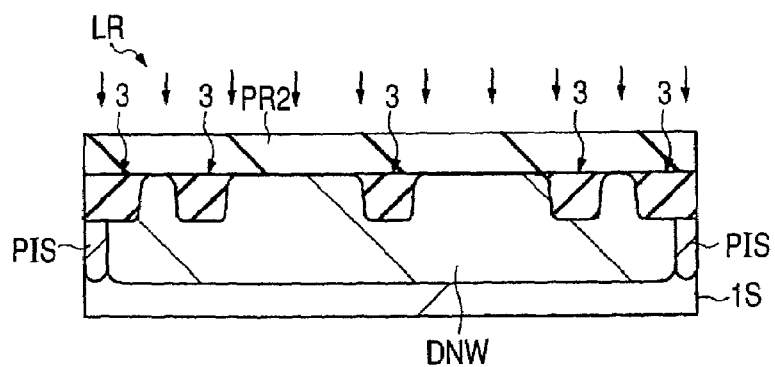
FIG. 39 is a fragmentary cross-sectional view showing the forming region of the low breakdown voltage field effect transistor of the semiconductor device in the same manufacturing process as FIG. 37.
Figure 40:
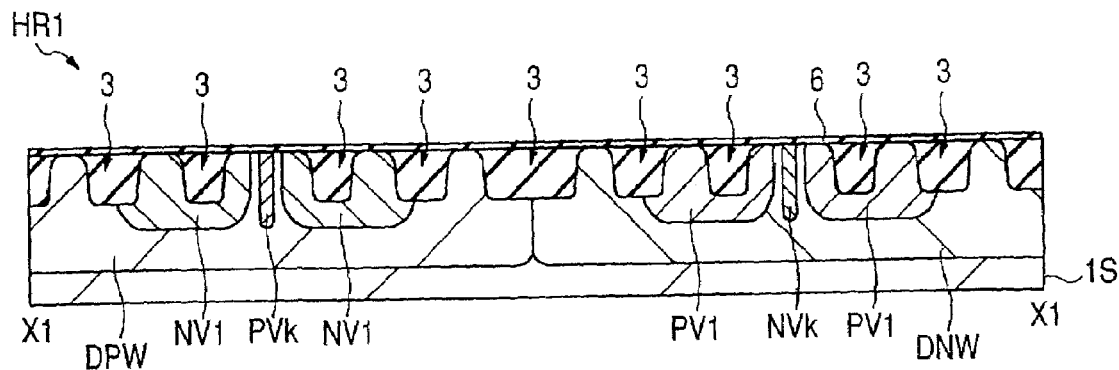
FIG. 40 is a fragmentary cross-sectional view following the steps of FIGS. 37 through 39, showing the first forming region of the high breakdown voltage field effect transistor in the manufacturing process of the semiconductor device.
Figure 41:
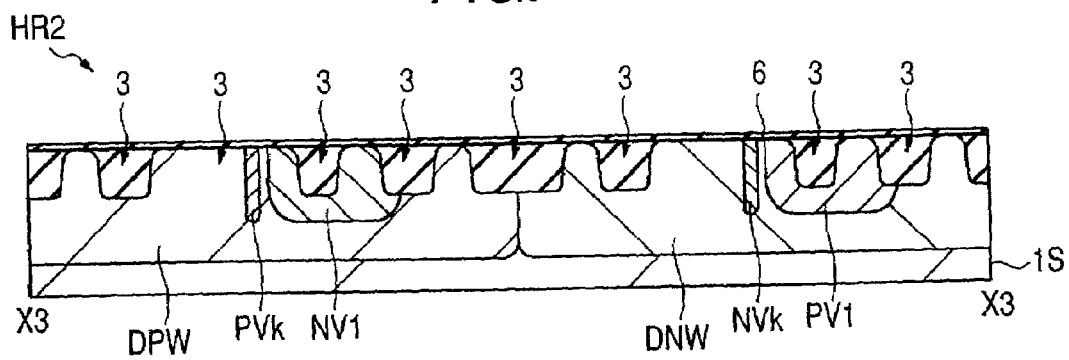
FIG. 41 is a fragmentary cross-sectional view depicting the second forming region of the high breakdown voltage field effect transistor of the semiconductor device in the same manufacturing process as FIG. 40.
Figure 42:
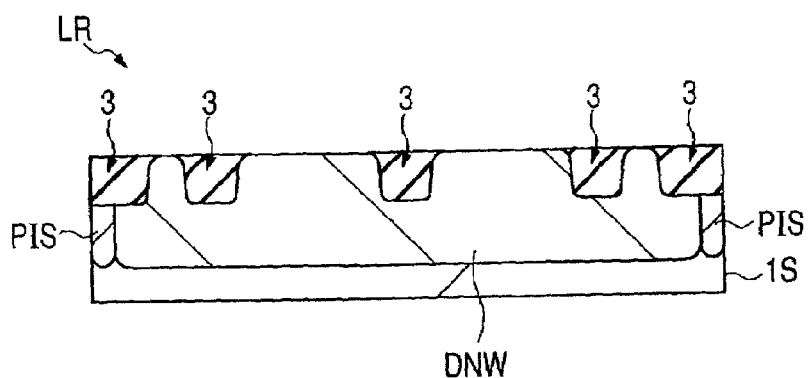
FIG. 42 is a fragmentary cross-sectional view showing the forming region of the low breakdown voltage field effect transistor of the semiconductor device in the same manufacturing process as FIG. 40.
Figure 43:
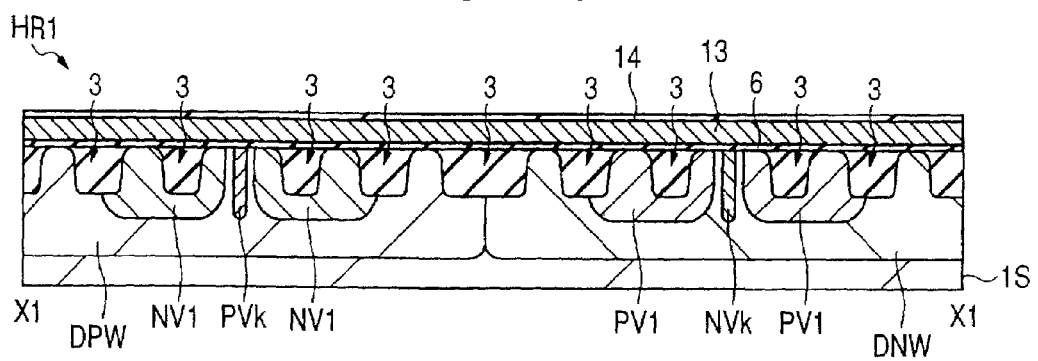
FIG. 43 is a fragmentary cross-sectional view following the steps of FIGS. 40 through 42, showing the first forming region of the high breakdown voltage field effect transistor in the manufacturing process of the semiconductor device.
Figure 44:
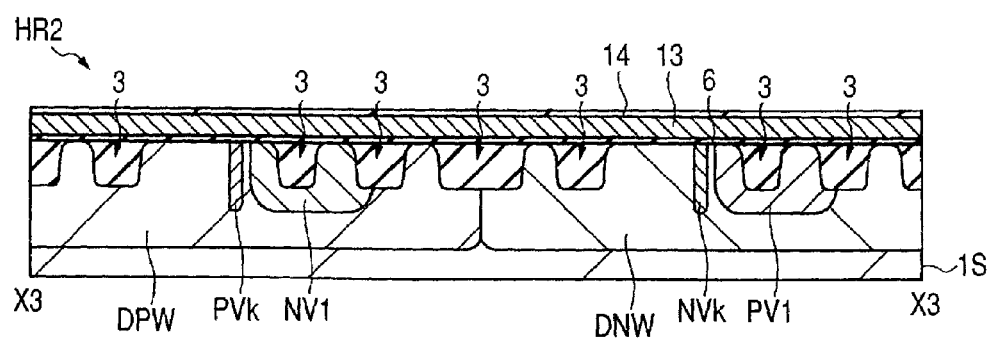
FIG. 44 is a fragmentary cross-sectional view depicting the second forming region of the high breakdown voltage field effect transistor of the semiconductor device in the same manufacturing process as FIG. 43.
Figure 45:
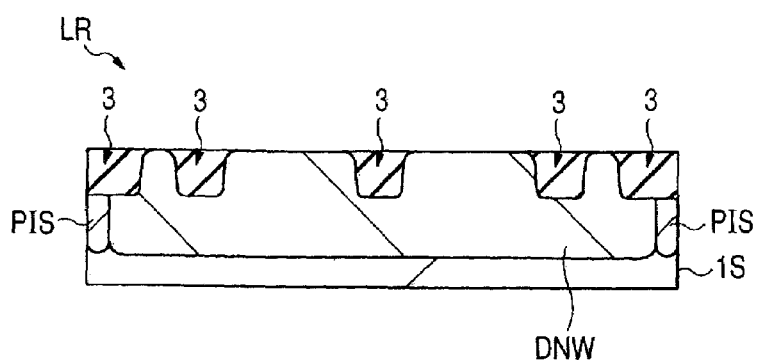
FIG. 45 is a fragmentary cross-sectional view showing the forming region of the low breakdown voltage field effect transistor of the semiconductor device in the same manufacturing process as FIG. 43.

Next, the resist film PR1 is removed and thereafter a pattern of a resist film PR2 is formed over the main surface of the substrate 1S by a lithography process as shown in fragmentary cross-sections of the substrate 1S in the same manufacturing process of FIGS. 37 through 39. The pattern of the resist film PR2 is formed in such a manner that both forming regions of p⁻ type semiconductor regions PV1 each having a field relaxing function in a high breakdown voltage pMIS forming region and p⁺ type semiconductor regions (fourth, thirteenth and fourteenth semiconductor regions) PVk for kink countermeasures in a high breakdown voltage nMIS forming region are exposed and ones other than them are covered. Subsequently, for example, boron is selectively introduced in the substrate 1S by ion implantation or the like using the pattern of the resist film PR2 as a mask. At this time, the semiconductor regions PV1 and the semiconductor regions PVk are formed so as to be deeper than the isolation portion 3 in a manner similar to the semiconductor regions NV1 and the semiconductor regions NVk. Consequently, the capability of suppressing or preventing the occurrence of a kink effect can be enhanced. Incidentally, although the n⁻ type semiconductor regions NV1 each having the field relaxing function in the high breakdown voltage nMIS forming region, the n⁺ type semiconductor regions NVk for the kink countermeasures in the high breakdown voltage pMIS forming region, the p⁻ type semiconductor regions PV1 each having the field relaxing function in the high breakdown voltage pMIS forming region, and the p⁺ type semiconductor regions PVk for the kink countermeasures in the high breakdown voltage nMIS forming region are not formed perfectly in this stage, those regions are also illustrated to make it easy to understand the description thereof.

Next, the resist film PR2 is removed and thereafter the substrate 1S is subjected to an enlargement diffusion process (annealing) to form the corresponding n⁻ type semiconductor regions NV1 each having the field relaxing function in the high breakdown voltage nMIS forming region, p⁺ type semiconductor regions PVk for kink countermeasures in the high breakdown voltage nMIS forming region, p⁻ type semiconductor regions PV1 each having the field relaxing function in the high breakdown voltage pMIS forming region, and n⁺ type semiconductor regions NVk for kink countermeasures in the high breakdown voltage pMIS forming region. Thus, in the third embodiment, the p⁺ type semiconductor regions PVk for the kink countermeasures and the n⁺ type semiconductor regions NVk are formed at the same forming process as the p⁻ type semiconductor regions PV1 each having the field relaxing function and the n⁻ type semiconductor regions NV1. Therefore, no manufacturing process increases even where the p⁺ type semiconductor regions PVk for the kink countermeasures and the n⁺ type semiconductor regions NVk are provided. Thus, a semiconductor device high in performance and reliability can be provided without increasing the manufacturing time and cost of the semiconductor device. Thereafter, shallow channel implantation may be effected on the channel region of the high breakdown voltage MIS to adjust the threshold voltage of each high breakdown voltage MIS. Afterwards, the insulating film for the through film used at the time of ion implantation is removed by wet etching processing. Thereafter, the substrate 1S is subjected to a thermal oxidation process to thereby form an insulating film 6a (omitted from the drawings to make it easy to see the drawings in the present embodiment) comprising silicon oxide or the like having a thickness of, for example, 10 nm or so with a silicon oxide conversion thickness over the main surface (main surface of active region) of the substrate 1S. When the required gate insulating breakdown voltage is low at this time, the gate insulating film may be formed of only a silicon oxide film by the thermal oxidation method. However, when a high voltage similar to the drain is applied even to a gate electrode, an insulating film 6b formed of, for example, silicon oxide or the like formed by the CVD method or the like is deposited over the silicon oxide film based on the thermal oxidation method, whereby a gate insulating film 6 is formed of a laminated film of the silicon oxide film based on the thermal oxidation method and the silicon oxide film based on the CVD method. The present embodiment shows the case in which the gate insulating film 6 is formed by a laminated film. Thus, it is possible to cause the high breakdown voltage MISs and low breakdown voltage MISs which are greatly different in the thickness of the gate insulating film to coexist with one another over the same substrate 1S. The insulating film 6b formed by the CVD method is formed not only over the active region, but also over the isolation portions 3. With the deposition of the insulating film 6b by the CVD method, the amount of etching of the upper portions of the isolation portions 3 in a subsequent process can be reduced. Therefore, it is possible to ensure the breakdown voltage for the isolation portion 3 and suppress or prevent the occurrence of a parasitic MIS. Accordingly, the reliability of the semiconductor device can be enhanced.

Next, of the insulating film 6b of the gate insulating film 6, which is formed by the CVD method, unnecessary portions, such as like portions or the like formed with the n+ type semiconductor regions and the p+ type semiconductor regions that make ohmic contact even in the low breakdown voltage MIS forming region and the high breakdown voltage MIS forming region, are selectively removed via a lithography process and wet etching process. During the etching process, the insulating film 6b, based on the CVD method for the formation of the gate insulating film, has a fast etching speed as compared with the thermal oxidation film (insulating film 6a). When etching is advanced so that the thermal oxidation film (insulating film 6a) below the insulating film 6b formed by the CVD method is exposed, the etching speed is significantly slow, thereby making it possible to prevent a reduction in the thickness of an insulating film 3b of each isolation portion 3. Thus, the isolation portions 3 uncovered with the resist film, as in the low breakdown voltage MIS forming region or the like, may simply return to the state prior to the insulating film 6b based on the CVD method for the gate insulating film 6 being deposited thereon. That is, when the high breakdown voltage MISs and the low breakdown voltage MISs are formed over the same substrate, the thickness of the isolation portion 3 in the low breakdown voltage MIS forming region can be ensured, and, hence, an adverse effect on the low breakdown voltage MISs can be avoided. Thus, it is possible to enhance the reliability of the semiconductor device having the high breakdown voltage MISs and the low breakdown voltage MISs over the same substrate 1S. With execution of a densify process (heat-treating process), subsequently, the insulating film 6b formed by the CVD method is reduced in traps like electrons, positive holes or the like held therein upon film deposition and moisture (moisture produced by reaction depending on film composition) contained in the film. Therefore, the insulating film 6b changes into a film of substantially the same quality as the thermal oxidation film. Thereafter, a light thermal oxidation process is effected on the substrate 1S.

Next, a conductor film comprising, for example, low-resistance polycrystalline silicon is deposited over the main surface of the substrate 1S (i.e., wafer) by the CVD method. The surface thereof is oxidized and thereafter an insulating film formed of silicon nitride or the like is deposited thereon. Further, the surface thereof is oxidized to form an insulating film. Subsequently, a laminated film consisting of the conductor film and the insulating film is patterned via the lithography process and dry etching process to thereby form a laminated pattern of the conductor film 13 and insulating film 14, as shown in fragmentary sections of the substrate 1S in the same manufacturing process of FIGS. 43 through 45. The laminated pattern of the conductor film 13 and insulating film 14 are formed so as to cover the high breakdown voltage MIS forming regions HR1 and HR2 and so as not to cover the low breakdown voltage MIS forming region LR. The conductor film 13 is a conductor film for forming a gate electrode of each high breakdown voltage MIS. The reason why it is not patterned as the gate electrode for each high breakdown voltage MIS in this stage is to avoid a defective condition which is developed in the high breakdown voltage MIS forming region HR2, in particular, upon formation of the gate electrode of each low breakdown voltage MIS. This will be explained in conjunction with the process of forming the gate electrode of each low breakdown voltage MIS.

Figure 46:
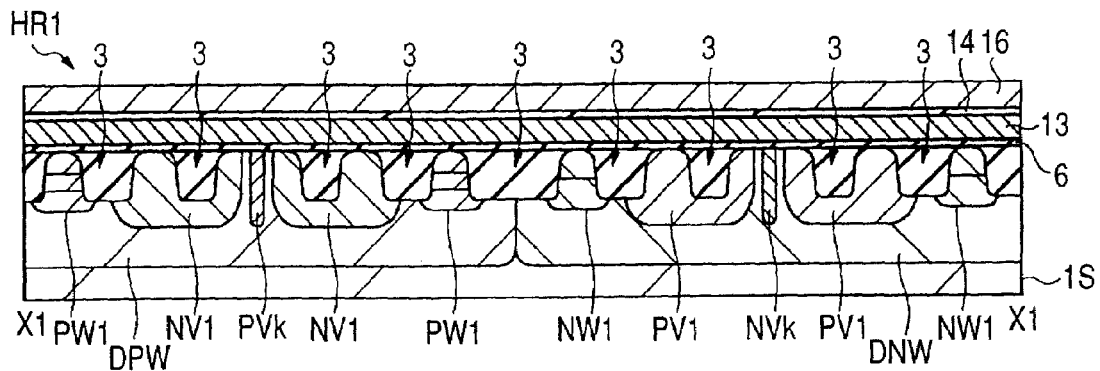
FIG. 46 is a fragmentary cross-sectional view following the steps of FIGS. 43 through 45, showing the first forming region of the high breakdown voltage field effect transistor in the manufacturing process of the semiconductor device.
Figure 47:
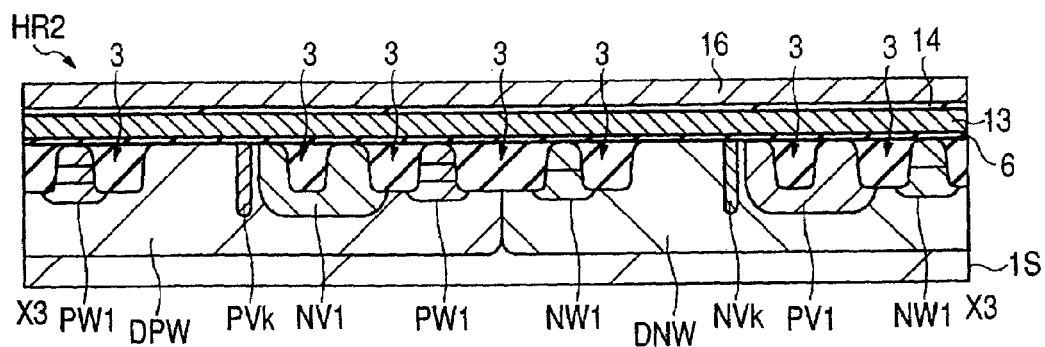
FIG. 47 is a fragmentary cross-sectional view depicting the second forming region of the high breakdown voltage field effect transistor of the semiconductor device in the same manufacturing process as FIG. 46.
Figure 48:
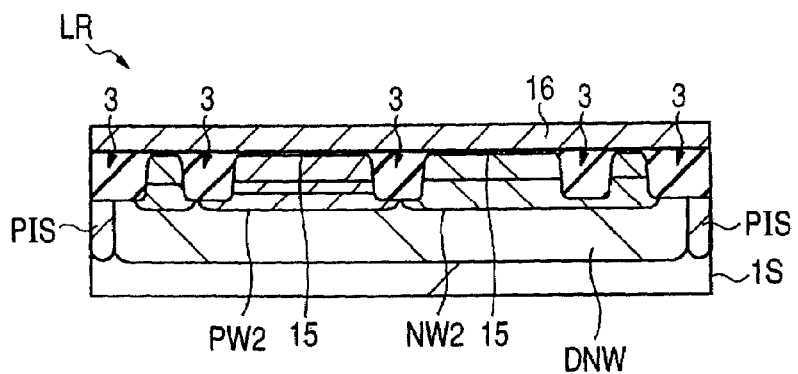
FIG. 48 is a fragmentary cross-sectional view showing the forming region of the low breakdown voltage field effect transistor of the semiconductor device in the same manufacturing process as FIG. 46.
Figure 49:
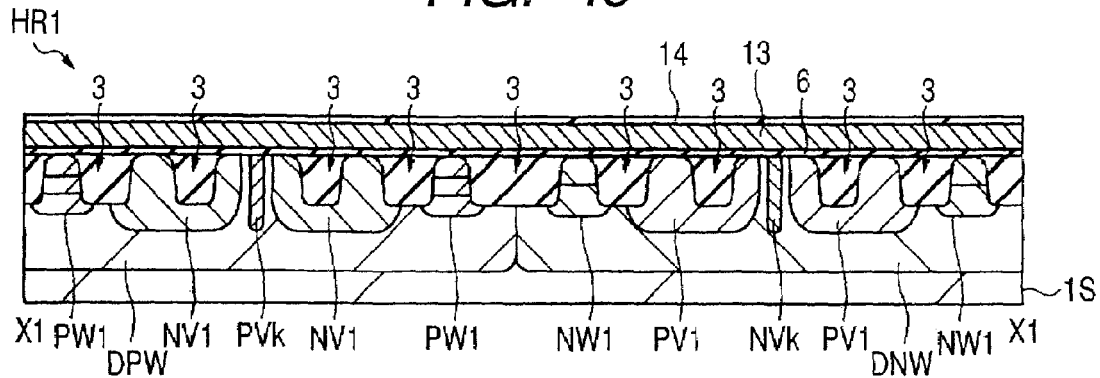
FIG. 49 is a fragmentary cross-sectional view following the steps of FIGS. 46 through 48, showing the first forming region of the high breakdown voltage field effect transistor in the manufacturing process of the semiconductor device.
Figure 50:
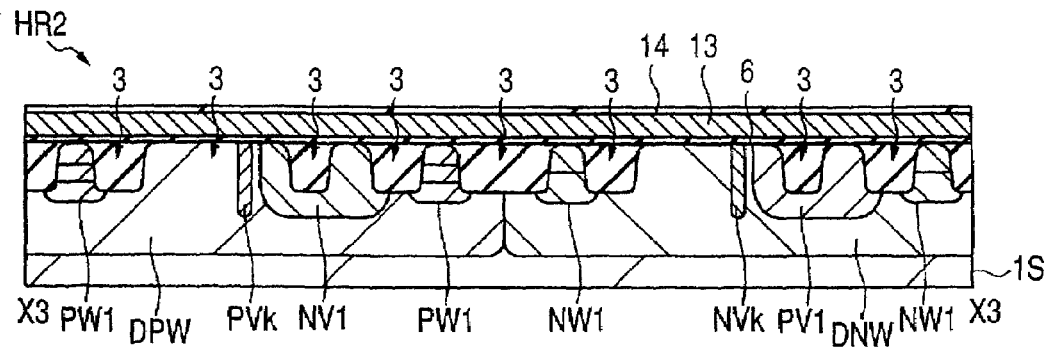
FIG. 50 is a fragmentary cross-sectional view depicting the second forming region of the high breakdown voltage field effect transistor of the semiconductor device in the same manufacturing process as FIG. 49.
Figure 51:
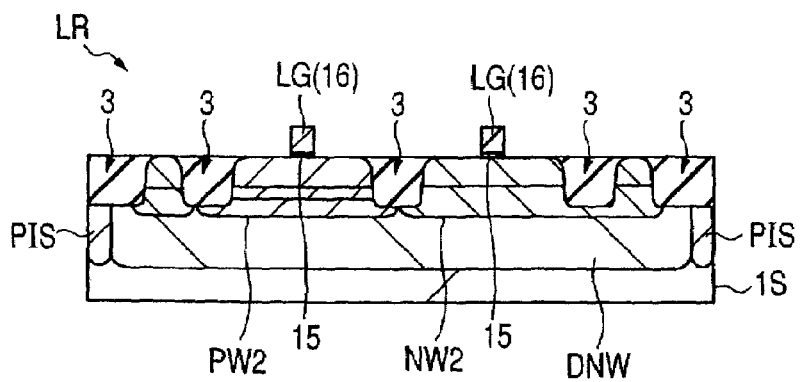
FIG. 51 is a fragmentary cross-sectional view showing the forming region of the low breakdown voltage field effect transistor of the semiconductor device in the same manufacturing process as FIG. 49.

Next, for example, boron is introduced into the substrate 1S by ion implantation or the like using the pattern of the resist film formed by the lithography process as a mask, thereby to form p+ type wells PW1 in the high breakdown voltage nMIS forming region and a p+ type well PW2 in the low breakdown voltage MIS forming region, as shown in fragmentary sections of the substrate 1S in the same manufacturing process of FIGS. 46 through 48. On the high breakdown voltage pMIS side, the boron is now caused to pass through the conductor film 13 and to be introduced into the substrate 1S. Subsequently, the resist film for forming the p+ type wells PW1 and PW2 is removed, and, thereafter, a pattern of another resist film is formed over the main surface of the substrate 1S by the lithography process. Further, for example, phosphor is introduced in the substrate 1S by ion implantation or the like using the pattern of the resist film as a mask thereby to form n+ type wells NW1 in the high breakdown voltage pMIS forming region and an n+ type well NW2 in the low breakdown voltage pMIS forming region. On the high breakdown voltage nMIS side, the phosphor is now caused to pass through the conductor film 13 and to be introduced in the substrate 1S. Afterwards, the resist film is removed, and, thereafter, the substrate 1S is heat-treated to activate the p+ type wells PW1 and PW2 and n+ type wells NW1 and NW2. With the execution of the processes for forming the wells for the high breakdown voltage MISs and the wells for the low breakdown voltage MISs under the same process in this way, a series of lithography process steps, such as resist application, exposure and development, etc., can be reduced in the present embodiment as compared with the case in which the wells for the high breakdown voltage MIS and the wells for the low breakdown voltage MIS are formed using discrete resist films as the masks, thereby making it possible to avoid a significant increase in the number of manufacturing process steps of the semiconductor device provided with the high breakdown voltage MISs and the low breakdown voltage MISs over the same substrate 1S. Further, the high breakdown voltage MISs and the low breakdown voltage MISs can be made coexistent with one another.

Next, the silicon oxide film of the low breakdown voltage MIS forming region LR is removed by a wet etching method or the like, followed by execution of the thermal oxidation process, thereby forming a low breakdown voltage MIS gate insulating film 15 in the low breakdown voltage MIS forming region. The gate insulating film 15 is formed of, for example, silicon oxide and has a thickness of, for example, about 7 nm with a silicon dioxide conversion thickness. Thereafter, for example, a polycrystalline silicon film 16 is deposited over the main surface of the substrate 1S (i.e., wafer) by the CVD method or the like. At this time, the polycrystalline silicon film 16 is deposited even over the surface of the laminated pattern of the conductor film 13 and the insulating film 14 in the high breakdown voltage MIS forming region. Thereafter, for example, phosphor and boron are respectively introduced in the nMIS forming region and the pMIS forming region by ion implantation or the like in the polycrystalline silicon film 16 using patterns of discrete resist films as masks. Afterwards, the polycrystalline silicon film 16 is patterned through the lithography process and dry etching process to form low breakdown voltage MIS gate electrodes LG (16), as shown in fragmentary sections of the substrate 1S in the same manufacturing process of FIGS. 49 through 51. The gate electrode LG for the low breakdown voltage nMIS is set to an n type, and the gate electrode LG for the low breakdown voltage pMIS is set to a p type. In the etching process, the polycrystalline silicon film 16, which is deposited over the surface of the laminated pattern of the conductor film 13 and insulating film 14 in the high breakdown voltage MIS forming region, is also removed. The non-formation of the high breakdown voltage MIS gate electrodes in the above-described manner results due to, for example, the following reasons. That is, there may be a case in which, if the high breakdown voltage MIS gate electrodes are formed prior to the patterning process of the gate electrodes LG for the low breakdown voltage MISs, then the polycrystalline silicon film 16 for forming the low breakdown voltage MIS gate electrodes LG remains in the sidewalls of each already-formed high breakdown voltage MIS gate electrode when the low breakdown voltage MIS gate electrodes LG are patterned. Even if the polycrystalline silicon film 16 remains in the side surface of each gate electrode in the high breakdown voltage forming region HR1, no problem arises in particular because the thick isolation portions 3 exist therebelow. In the high breakdown voltage MIS forming region HR2, however, no isolation portion 3 is disposed on the side of one side surface of each gate electrode, and, hence, only the gate insulating film 6 exists therebelow. Thus, a problem arises in that, if the polycrystalline silicon film 16 remains on one side of the gate electrode in the high breakdown voltage MIS forming region HR, then the residual of etching of the polycrystalline silicon film 16 exists in the semiconductor region for the source of the high breakdown voltage MIS when the semiconductor region is formed, so that the region is spaced away from the side surface of the gate electrode for the high breakdown voltage MIS correspondingly. In order to avoid such a problem, the high breakdown voltage MIS gate electrodes are not patterned before patterning of the low breakdown voltage MIS gate electrodes LG in the third embodiment.

Figure 52:
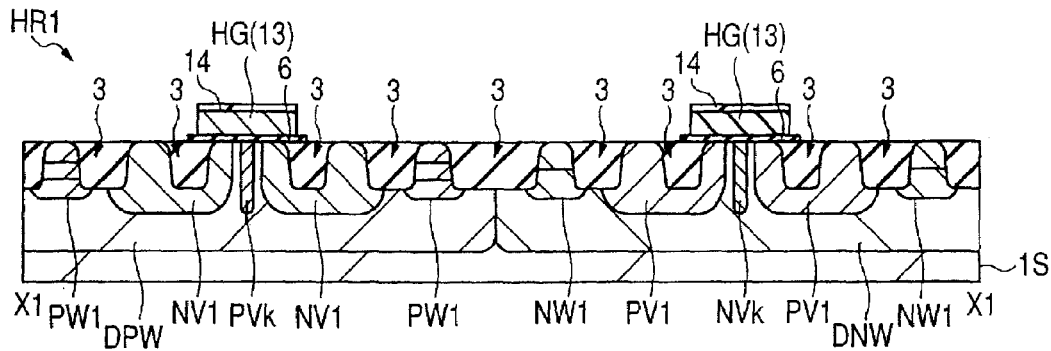
FIG. 52 is a fragmentary cross-sectional view following the steps of FIGS. 49 through 51, showing the first forming region of the high breakdown voltage field effect transistor in the manufacturing process of the semiconductor device.
Figure 53:
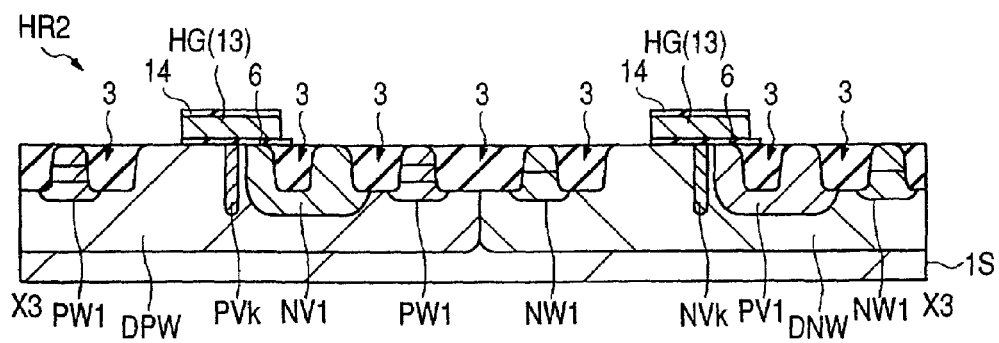
FIG. 53 is a fragmentary cross-sectional view depicting the second forming region of the high breakdown voltage field effect transistor of the semiconductor device in the same manufacturing process as FIG. 52.
Figure 54:
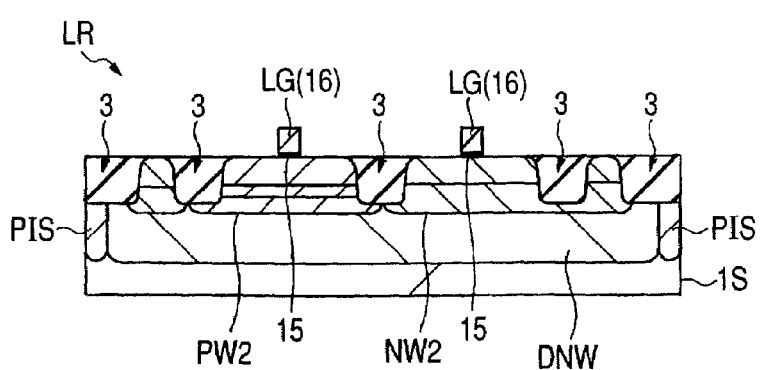
FIG. 54 is a fragmentary cross-sectional view showing the forming region of the low breakdown voltage field effect transistor of the semiconductor device in the same manufacturing process as FIG. 52.
Figure 55:
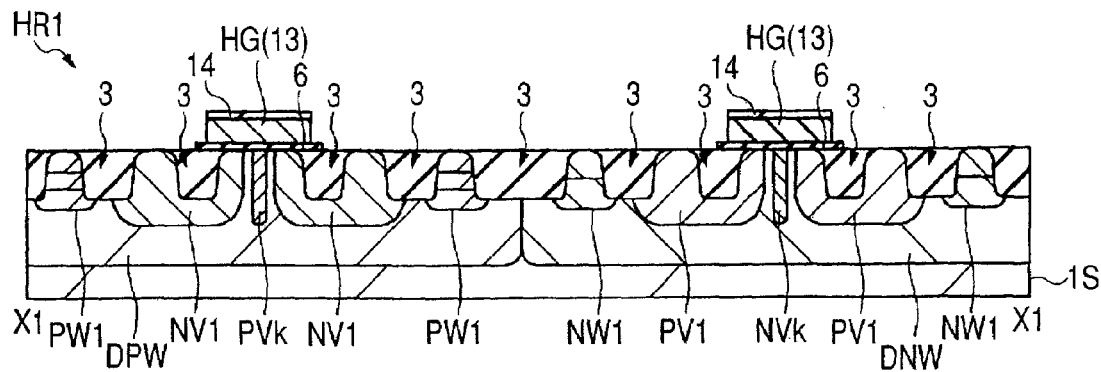
FIG. 55 is a fragmentary cross-sectional view following the steps of FIGS. 52 through 54, showing the first forming region of the high breakdown voltage field effect transistor in the manufacturing process of the semiconductor device.
Figure 56:
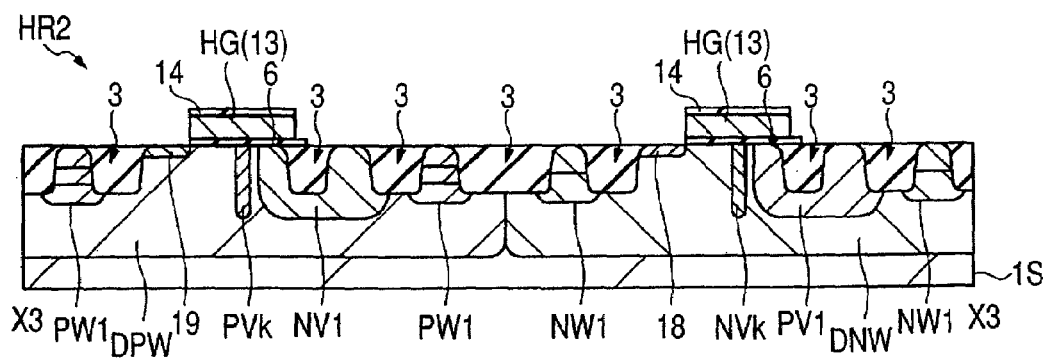
FIG. 56 is a fragmentary cross-sectional view depicting the second forming region of the high breakdown voltage field effect transistor of the semiconductor device in the same manufacturing process as FIG. 55.
Figure 57:
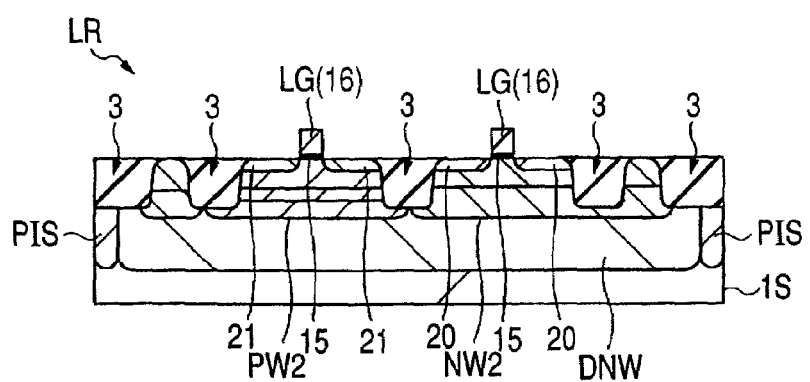
FIG. 57 is a fragmentary cross-sectional view showing the forming region of the low breakdown voltage field effect transistor of the semiconductor device in the same manufacturing process as FIG. 55.
Figure 58:
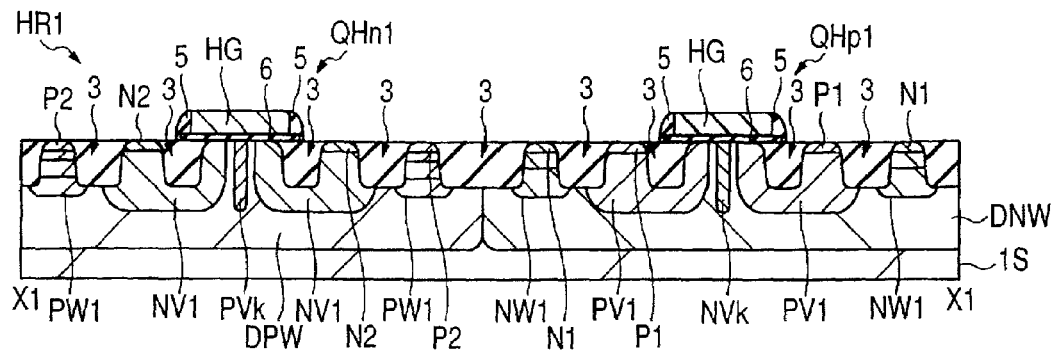
FIG. 58 is a fragmentary cross-sectional view following the steps of FIGS. 55 through 57, showing the first forming region of the high breakdown voltage field effect transistor in the manufacturing process of the semiconductor device.
Figure 59:
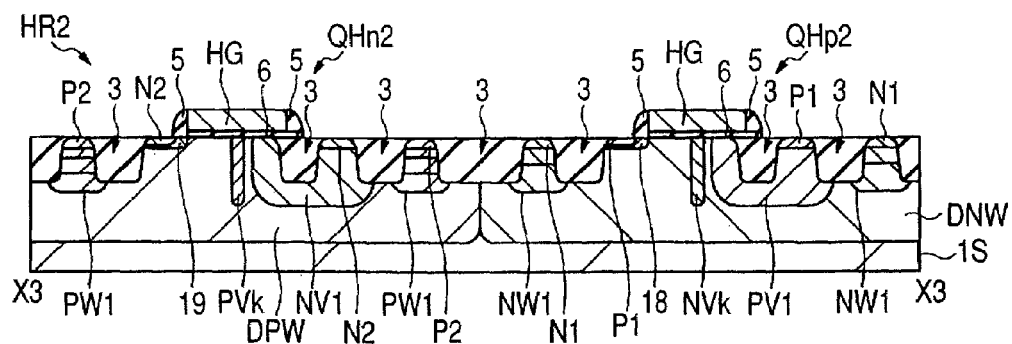
FIG. 59 is a fragmentary cross-sectional view illustrating the second forming region of the high breakdown voltage field effect transistor of the semiconductor device in the same manufacturing process as FIG. 58.
Figure 60:
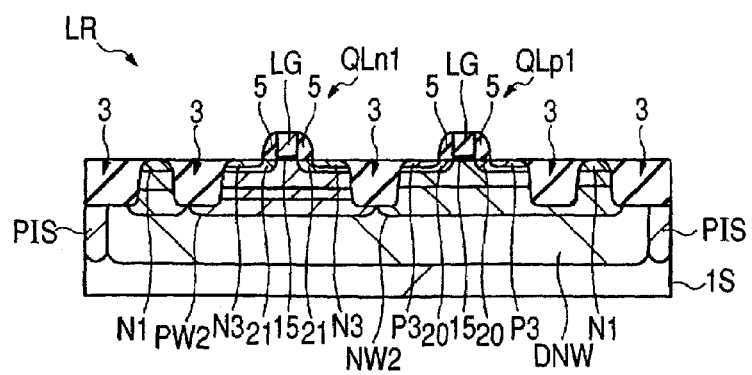
FIG. 60 is a fragmentary cross-sectional view showing the forming region of the low breakdown voltage field effect transistor of the semiconductor device in the same manufacturing process as FIG. 58.
Figure 61:
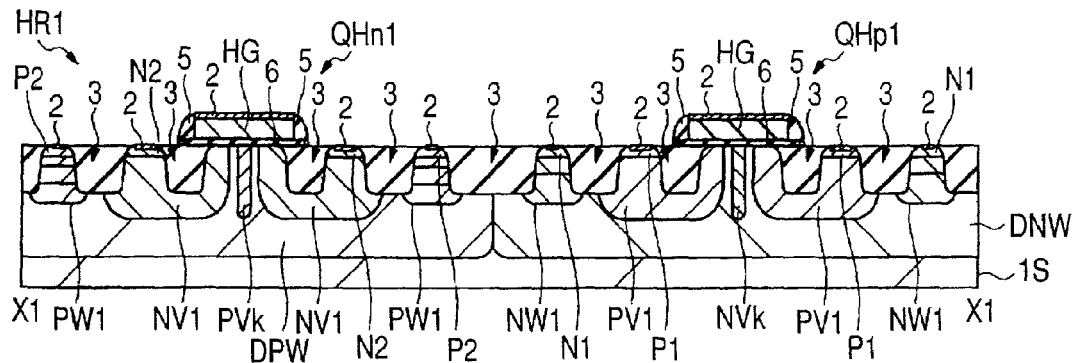
FIG. 61 is a fragmentary cross-sectional view following the steps of FIGS. 58 through 60, showing the first forming region of the high breakdown voltage field effect transistor in the manufacturing process of the semiconductor device.
Figure 62:
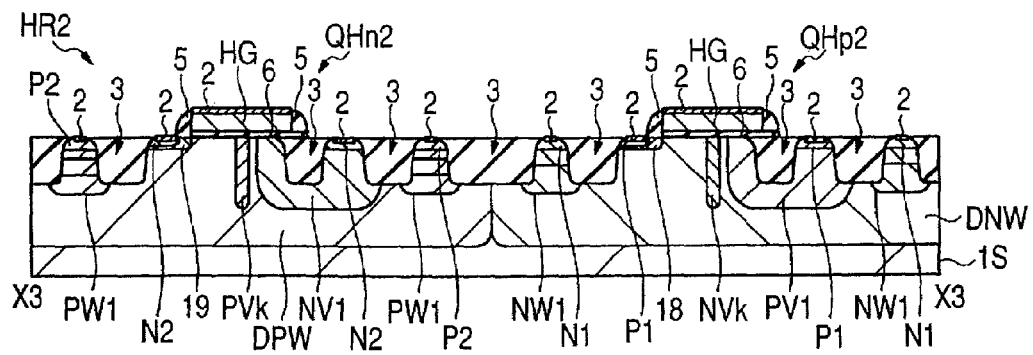
FIG. 62 is a fragmentary cross-sectional view illustrating the second forming region of the high breakdown voltage field effect transistor of the semiconductor device in the same manufacturing process as FIG. 61.
Figure 63:
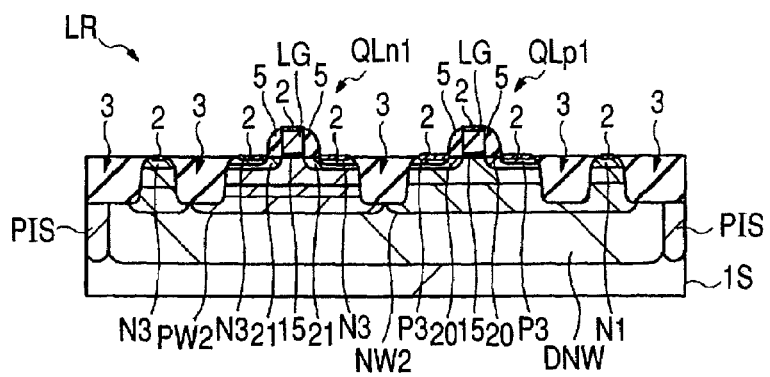
FIG. 63 is a fragmentary cross-sectional view showing the forming region of the low breakdown voltage field effect transistor of the semiconductor device in the same manufacturing process as FIG. 61.

Next, the conductor film 13, the insulating film 14 and the insulating film 6b formed by the CVD method, of the gate insulating film 6, are patterned through the lithography process and the dry etching process to thereby form gate electrodes HG (13) in the high breakdown voltage MIS forming regions HR1 and HR2, as shown in fragmentary sections of the substrate 1S in the same manufacturing process of FIGS. 52 through 54. The insulating film 6b formed by the CVD method, of the gate insulating film 6, is formed so as to protrude from the full outer periphery of each gate electrode HG in the high breakdown voltage MIS forming region HR1 and to protrude from the outer periphery of each gate electrode HG in the high breakdown voltage MIS forming region HR2 exclusive of its side on the source side. Subsequently, for example, boron is introduced in the main surface of the substrate 1S by ion implantation or the like to form a $p^-$ type semiconductor region 18 serving as an extension for the high breakdown voltage pMIS on a self-alignment basis with respect to the corresponding gate electrode HG in the high breakdown voltage MIS forming region HR2. Subsequently, a pattern of a resist film is formed over the main surface of the substrate 1S through the lithography process. Thereafter, for example, phosphor is introduced in the main surface of the substrate 1S by ion implantation or the like using its pattern as a mask to thereby form an $n^-$ type semiconductor region 19 serving as an extension for the high breakdown voltage nMIS on a self-alignment basis with respect to the corresponding gate electrode HG in the high breakdown voltage MIS forming region HR2. Subsequently, a pattern of a resist film is formed over the main surface of the substrate 1S through the lithography process after the removal of the resist film. Using it as a mask, for example, boron is introduced in the main surface of the substrate 1S by ion implantation or the like to thereby form $p^-$ type semiconductor regions 20 serving as an extension for the low breakdown voltage pMIS on a self-alignment basis with respect to each gate electrode LG in the low breakdown voltage MIS forming region LR. At this time, phosphor may be introduced by ion implantation or the like to form an n type semiconductor region (hollow region) for a punch through stopper of the low breakdown voltage pMIS below the $p^-$ type semiconductor regions 20. Afterwards, the resist film is removed and the substrate 1S is thereafter heat-treated. Subsequently, a pattern of a resist film is formed over the main surface of the substrate 1S through the lithography process. With it as a mask, for example, phosphor is introduced in the main surface of the substrate 1S by ion implantation or the like to form $n^-$ type semiconductor regions 21 serving as an extension for the low breakdown voltage nMIS on a self-alignment basis with respect to the corresponding gate electrode HG in the low breakdown voltage MIS forming region LR. At this time, boron may be introduced by ion implantation or the like to form a p type semiconductor region (hollow region) for a punch through stopper of the low breakdown voltage nMIS below the $n^-$ type semiconductor regions 20.

Next, an insulating film comprising, for example, silicon oxide is deposited over the main surface of the substrate 1S (i.e., wafer) by the CVD method or the like. Thereafter, it is etched back by anisotropic dry etching to form sidewalls 5 formed of, for example, silicon oxide or the like over their corresponding side surfaces of the gate electrodes HG and LG, as shown in fragmentary sections of the substrate 1S in the same manufacturing process of FIGS. 58 through 60. At this time, the insulating film 14 on the gate electrodes HG is also removed. Subsequently, a pattern of a resist film is formed over the main surface of the substrate 1S through the lithography process. Thereafter, for example, phosphor is introduced in the main surface of the substrate 1S by ion implantation or the like using its pattern as a mask to form $n^+$ type semiconductor regions N1, N2 and N3. The n+ type semiconductor region N1 corresponds to a pull-out or drawing region of the n+ type well NW1. The n+ type semiconductor region (first, eleventh and twelfth semiconductor regions) N2 is a semiconductor region for the source and drain of each of the high breakdown voltage nMISQHn1 and QHn2. The n+ type semiconductor region N3 is a semiconductor region for the source and drain of the low breakdown voltage nMISQLn1. Subsequently, a pattern of a resist film is formed over the main surface of the substrate 1S through the lithography process after the removal of the resist film. Using it as a mask, for example, boron is introduced into the main surface of the substrate 1S by ion implantation or the like to form p+ type semiconductor regions P1, P2 and P3. The p+ type semiconductor region P1 is a semiconductor region for the source and drain of each of the high breakdown voltage pMISQHp1 and QHp2. The p+ type semiconductor region P2 is a pull-out region of the p+ type well PW1. The p+ type semiconductor region P3 is a semiconductor region for the source and drain of the low breakdown voltage pMISQLp1. Thereafter, the substrate 1S is heat-treated to activate the n+ type semiconductor regions N1, N2 and N3 and the p+ type semiconductor regions P1, P2 and P3. Thus, the high breakdown voltage nMIS (fifth high breakdown voltage field effect transistor) QHn1, high breakdown voltage nMIS (seventh high breakdown voltage field effect transistor) QHn2, high breakdown voltage pMIS (sixth high breakdown voltage field effect transistor) QHp1, high breakdown voltage pMIS (eighth high breakdown voltage field effect transistor) QHp2, low breakdown voltage nMISQLn1 and low breakdown voltage pMISQLp1 are formed over the same substrate 1S. The present embodiment illustrates, as an example, where each of the semiconductor regions for the sources and drains of the low breakdown voltage nMISQLn1 and low breakdown voltage pMISQLp1 has an LDD (Lightly Doped Drain) configuration. Operating voltages for the low breakdown voltage nMISQLn1 and low breakdown voltage pMISQLp1 are lower than those for the high breakdown voltage nMISQHp1, QHp2, QHn1 and QHn2. A source or power supply voltage on the reference potential side is 0V, for example, and a source or power supply voltage on the high potential side is about 1.5V, for example.

Next, a light etching process is effected on the main surface of the substrate 1S to expose the main surface (main surface of active region) of the substrate 1S and the upper surfaces of the gate electrodes HG and LG. Thereafter, as shown in fragmentary sections of the substrate 1S in the same manufacturing process of FIGS. 61 through 63, a silicide layer 2 like, for example, cobalt silicide or the like is formed over the upper surfaces of the n+ type semiconductor regions N1, N2 and N3, p+ type semiconductor regions P1, P2 and P3 and gate electrodes HG and LG on a self-alignment basis according to a salicide (Self Align Silicide) process. The salicide process is performed as follows, for example. A metal film like cobalt (Co) or the like is deposited over the main surface of the substrate 1S by a sputtering method or the like after the light etching process. Subsequently, the substrate 1S is heat-treated for a few ten seconds in a temperature range from, for example, 400° C. to 550° C. to thereby cause cobalt of the metal film and silicon of the substrate 1S and gate electrodes HG and LG to react with each other, thereby forming a silicide layer formed of a mixed crystal of cobalt and silicon at portions where the metal film contacts the substrate 1S and gate electrodes HG and LG. Thereafter, only unreacted cobalt is selectively wet-etched using an aqueous solution like, for example, an ammonia hydrogen peroxide solution or the like.

At this time, the silicide layer remains without being etched. Thereafter, the substrate 1S is heat-treated at, for example, 800° C. for 90 seconds or so to phase-change the mixed crystal of cobalt and silicon to $CoSi_2$, thereby bringing it to a low resistance. Thus, the silicide layer 2 is formed on a self-alignment basis. The metal film is not limited to cobalt and can be changed in various ways. For instance, titanium (Ti), platinum (Pt), nickel (Ni) or tungsten (W) may be adopted. When titanium is selected as the metal film, the silicide layer 2 is brought to titanium silicide ($TiSi_2$). When platinum is selected as the metal film, the silicide layer 2 is brought to platinum silicide ($PtSi_2$). When nickel is selected as the metal film, the silicide layer 2 is brought to nickel silicide ($NiSi_2$). When tungsten is selected as the metal film, the silicide layer 2 is brought to tungsten silicide ($WSi_2$).

Subsequent processing is done via the normal metal wiring forming process of the semiconductor device. That is, an interlayer insulating film depositing process, an interlayer insulating film planarizing process, a contact hole or through hole forming process, a plug forming process, a wiring metal depositing process and a wiring metal patterning process, etc. are repeatedly performed according to the required number of wiring layers, followed by execution of a protective film forming process and a pad opening forming process. Afterwards, the wafer is divided into individual semiconductor chips via an inspecting process and a wafer dicing process, whereby semiconductor devices each having both of a high breakdown voltage MIS and a low breakdown voltage MIS over the same substrate 1S are manufactured.

Thus, according to the third embodiment, the following advantageous effects are obtained, in addition to the effects obtained by the first and second embodiments.

That is, low breakdown voltage MISs and high breakdown voltage MISs can be formed over the same substrate 1S. It is also possible to manufacture a semiconductor device having low breakdown voltage MISs and high breakdown voltage MISs over the same substrate 1S without incurring a significant increase in manufacturing process. That is, a low breakdown voltage MIS manufacturing process and a high breakdown voltage MIS manufacturing process are placed in common use in the manufacturing process, thereby making it possible to reduce the manufacturing process and achieve a reduction in the manufacturing process of the semiconductor device having the low breakdown voltage MISs and high breakdown voltage MISs over the same substrate 1S.

Fourth Preferred Embodiment

Figure 64:
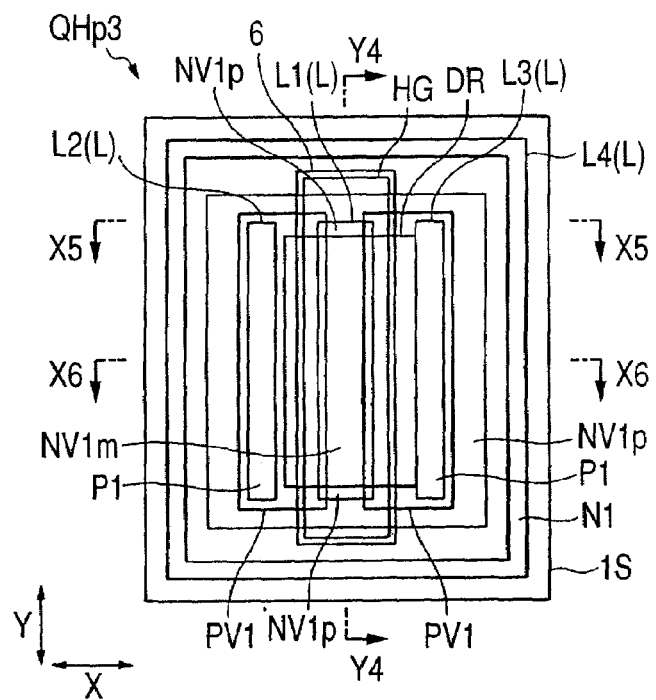
FIG. 64 is a fragmentary plan view illustrative of one example of a high breakdown voltage field effect transistor of a semiconductor device representing a fourth embodiment of the present invention.
Figure 65:
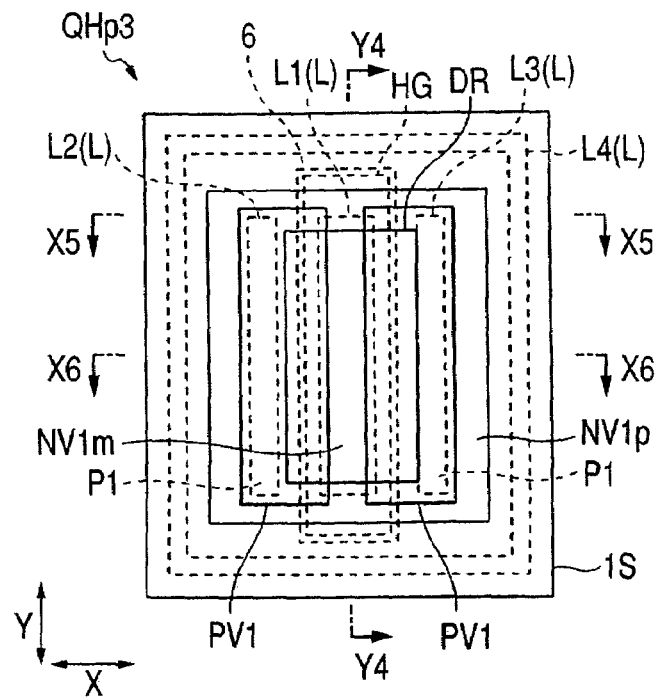
FIG. 65 shows the same spot as FIG. 64 and is a fragmentary plan view particularly illustrating a layout relationship between $p^-$ type semiconductor regions, each having a field relaxing function of the high breakdown voltage field effect transistor, and a counter doped region thereof.
Figure 66:
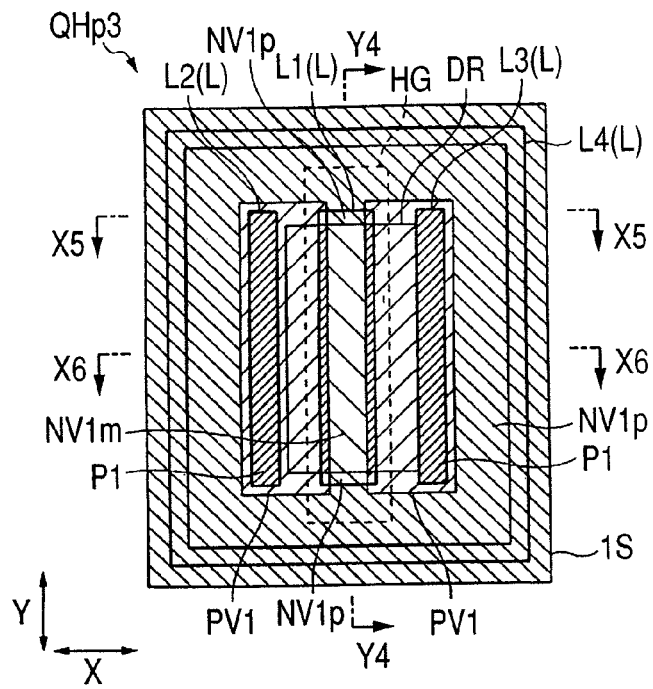
FIG. 66 shows the same spot as FIG. 64 and is a fragmentary plan view particularly illustrating the arrangement of respective semiconductor regions of the high breakdown voltage field effect transistor.
Figure 67:
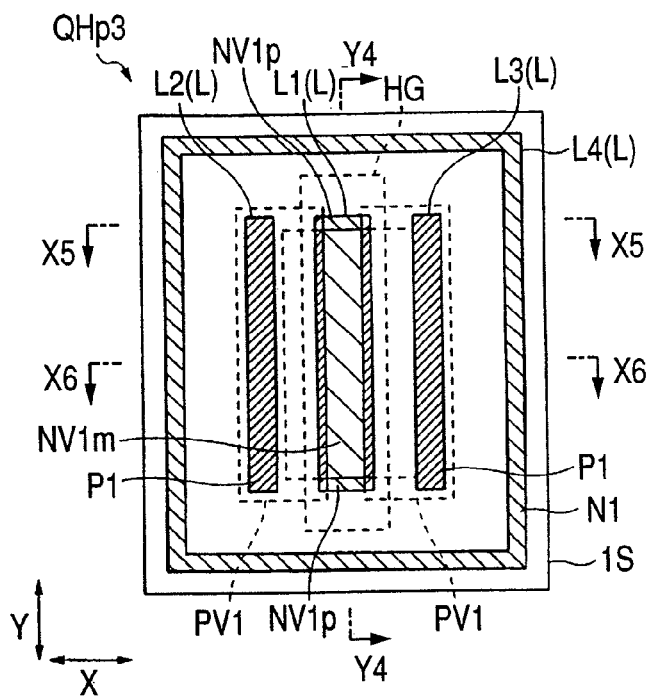
FIG. 67 shows the same spot as FIG. 64 and is a fragmentary plan view illustrating the arrangement of semiconductor regions in active regions.
Figure 68:
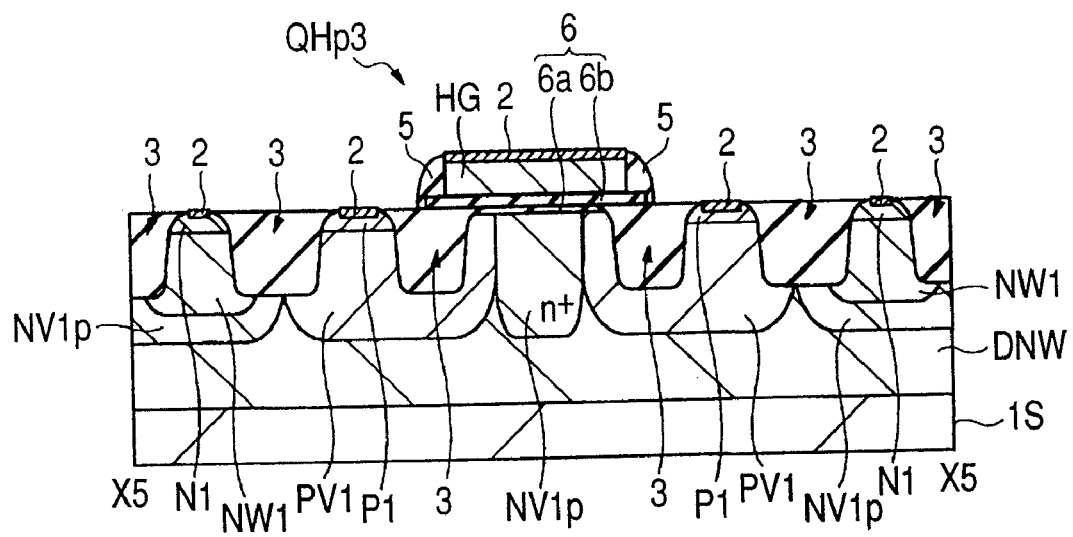
FIG. 68 is a cross-sectional view taken along lines X5-X5 of FIGS. 64 through 67.
Figure 69:
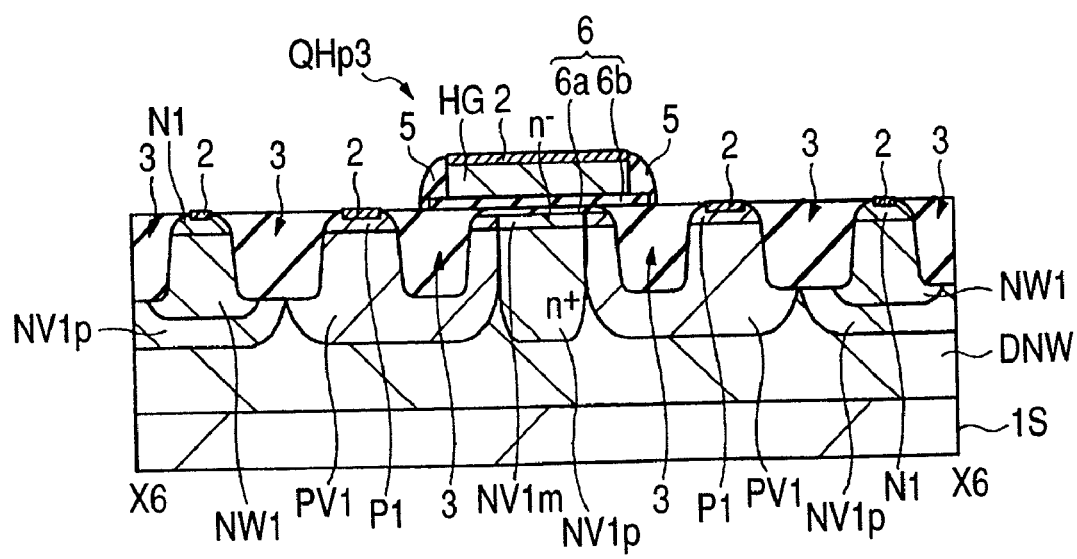
FIG. 69 is a cross-sectional view taken along lines X6-X6 of FIGS. 64 through 67.

A fourth embodiment of the invention involves a modification of the high breakdown voltage MIS. FIG. 64 is a fragmentary plan view showing one example of the high breakdown voltage pMISQHp3, FIG. 65 is a plan view showing the same spot as FIG. 64 and is a fragmentary plan view particularly illustrating a layout relationship between p− type semiconductor regions PV1 each having a field relaxing function of the high breakdown voltage pMISQHp3 and a counter doped region DR, FIG. 66 is a plan view showing the same spot as FIG. 64 and is a fragmentary plan view particularly illustrating the manner of respective semiconductor regions of the high breakdown voltage pMISQHp3, FIG. 67 is a plan view showing the same spot as FIG. 64 and is a fragmentary plan view illustrating the manner of semiconductor regions in active regions L, FIG. 68 is a cross-sectional view taken along lines X5-X5 of FIGS. 64 through 67, FIG. 69 is a cross-sectional view taken along lines X6-X6 of FIGS. 64 through 67, and FIG. 70 is a cross-sectional view taken along lines Y4-Y4 of FIGS. 64 through 67. Incidentally, although the present embodiment is directed to a case in which the present invention is applied to the high breakdown voltage pMIS, the present invention can be applied to a high breakdown voltage nMIS by setting the p and n conduction types in reverse, in a manner similar to the first embodiment. Although FIGS. 66 and 67 are each plan views, the respective semiconductor regions are given hatching to make it easy to see or read the drawings.

The high breakdown voltage pMIS (third, ninth and tenth high breakdown voltage field effect transistors) QHp3 of the semiconductor device according to the fourth embodiment takes a structure in which, for example, a breakdown voltage 60V can be realized. A source or power supply voltage on the high potential side is about 37V, for example, and a source or power supply voltage on the low potential (reference potential) side is 0 (zero) V, for example. In the high breakdown voltage pMISQHp3, an $n^+$ type semiconductor region (fifth, fifteenth and seventeenth semiconductor regions) NV1$p$ is formed in a device region other than $p^-$ type semiconductor regions PV1 each having a field relaxing function inclusive of a channel region (active region L1). An n type well for the high breakdown voltage pMISQHp3 is formed by the $n^+$ type semiconductor region NV1$p$. The threshold voltage of the high breakdown voltage pMISQHp3 is principally determined depending on the impurity concentration (the sum of impurity concentrations of $n^-$ type semiconductor region NV1 and deep n type well DNW, i.e., impurity concentration of $n^+$ type semiconductor region NV1$p$) of the n type well in the channel region, the concentration of the impurity (e.g., boron) for counter dope introduced in the channel region of the substrate 1S, and the thickness of a gate insulting film 6. The counter doped region DR indicates a region in which the impurity for counter dope is introduced. Although the impurity for counter dope is not introduced at both ends (i.e., substrate 1S portions each of which corresponds to the boundary between the active region L and an isolation portion 3 and contacts the sidewalls of the isolation portion 3) in a second direction Y, of the active region L1, the impurity is introduced in the active region L1 interposed therebetween. As a result, the region, in which the impurity for counter dope is not introduced, is set as the $n^+$ type semiconductor region NV1$p$, whereas the region (except for the regions in which the $p^-$ type semiconductor regions PV1 and PV1 each having the field relaxing function are disposed in the active region L1), in which the impurity for counter dope is introduced, is set as an $n^-$ type semiconductor region (sixth, sixteenth and eighteenth semiconductor regions) NV1m. That is, the $n^-$ type semiconductor region NV1$m$ results in an effective channel region of the high breakdown voltage pMISQHp3. Also, the $n^-$ type semiconductor region NV1$m$ is formed in the neighborhood of the surface of the semiconductor substrate and is formed over the $n^+$ type semiconductor region NV1$p$. That is, the $n^-$ type semiconductor region NV1$m$ is formed at a position shallower than the $n^+$ type semiconductor region NV1$p$. Thus, the threshold voltage at the center (main surface portion of substrate 1S) of the channel region of the active region L1 can be set lower than the threshold voltages at both ends (substrate 1S portions that contact the sidewalls of the isolation portion 3) in the second direction Y, of the active region L1. Namely, MIS is easy to operate in the center of the channel region, whereas MISs are hard to operate at both ends in the second direction Y, of the channel region. Therefore, even if the upper surface of the isolation portion 3 is recessed, the occurrence of the kink effect can be suppressed or prevented (the threshold voltages are identical to those described in conjunction with the first embodiment).

Figure 70:
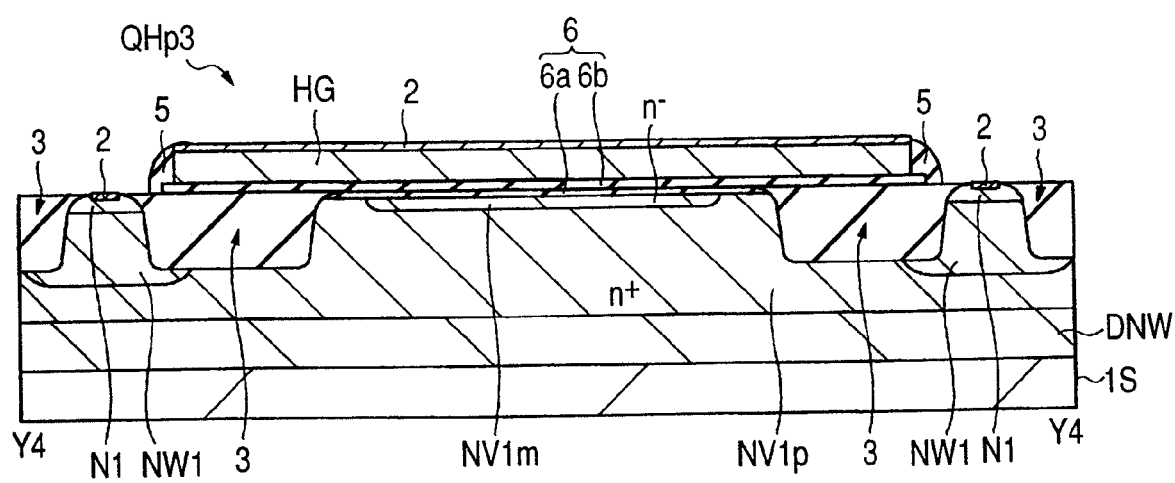
FIG. 70 is a cross-sectional view taken along lines Y4-Y4 of FIGS. 64 through 67.

Now, as shown in FIG. 70, the length of the $n^-$ type semiconductor region NV1$m$, that forms the channel region below the gate electrode HG, and the length of the $n^+$ type semiconductor region NV1$p$ are formed such that the length of the $n^-$ type semiconductor region NV1$m$ becomes longer than that of the $n^+$ type semiconductor region NV1$p$, as viewed in the transverse direction (second direction Y) of the gate electrode in the active region L1. That is, the semiconductor region NV1$m$ in the low concentration region is formed so as to make up more than half of the channel region. Thus, the regions for the hard-to-operate MISs formed at both ends in the second direction Y, of the channel region can be reduced, thus making it possible to prevent a reduction in effective operating speed of the high breakdown voltage MIS (e.g., high breakdown voltage pMISQHp3) according to the present embodiment.

At this time, the semiconductor region NV1$m$ which is relatively low in concentration is surrounded by the semiconductor region NV1$p$ which is relatively high in concentration, as viewed in the gate width direction of the gate electrode HG. The high-concentration semiconductor region NV1$p$ is formed at a position deeper than the low-concentration semiconductor region NV1$m$, as viewed from the main surface of the substrate 1S.

The $n^+$ type semiconductor region NVp1 is formed so as to become deeper than the isolation portion 3. Forming the semiconductor region NVp1 in this way makes it possible to increase the threshold value or voltage at each shoulder portion of the substrate 1S, which contacts the upper portion of the isolation portion 3. It is thus possible to suppress the occurrence of the kink effect.

In the high breakdown voltage pMISQHp3 according to the fourth embodiment, the $n^+$ type semiconductor region NV1$p$ is disposed below the $n^-$ type semiconductor region NV1$m$ that forms a channel as viewed in section. Thus, it is possible to enhance the capability of suppressing or preventing a punch through between $p^+$ type semiconductor regions P1 and P1 ($p^-$ type semiconductor regions PV1 and PV1) for the source and drain. That is, it is possible to suppress the shortening of an effective channel length at the operation of the high breakdown voltage pMISQHp3. Therefore, the design channel length (length in a first direction X) of the high breakdown voltage pMISQHp3 can be shortened. Since the counter doped region DR is large in pattern and has right and left regions which serve as the p type semiconductor regions PV1 and PV1 of the same conduction type as one formed by the impurity for counter dope, no problem occurs even if the counter doped region DR is shifted more or less. The allowance for alignment can be made large as compared with the first embodiment. Namely, the counter dope technique is sufficiently adaptable even to the case in which the size of the high breakdown voltage pMISQHp3 is reduced. Owing to these, the fourth embodiment is capable of reducing the size of the high breakdown voltage pMISQHp3 as compared with the first embodiment. Thus, it is possible to scale down the size of a semiconductor chip having the high breakdown voltage pMISQHp3 according to the fourth embodiment.

Figure 71:
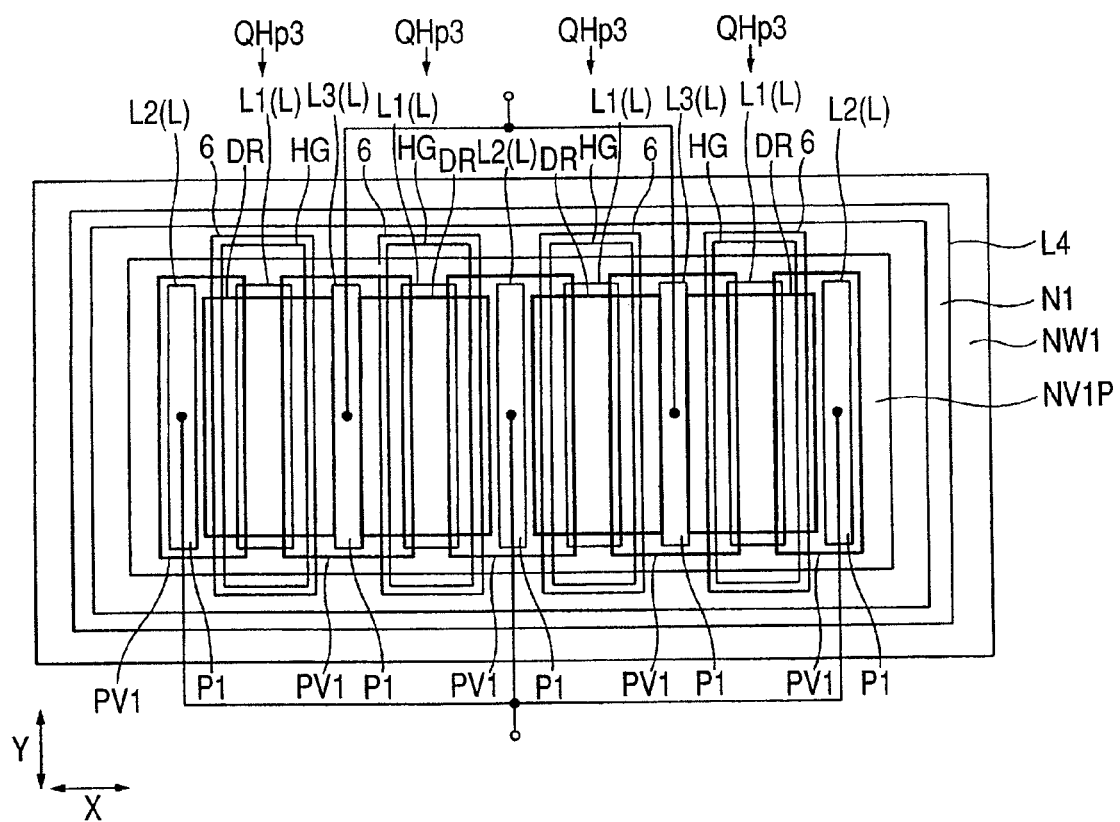
FIG. 71 is a fragmentary plan view showing one example in which the high breakdown voltage field effect transistor shown in FIG. 64 is arranged in plural form.

Next, FIG. 71 shows one example of a fragmentary plan view in which a plurality of high breakdown voltage pMISQHp3 are disposed. The high breakdown voltage pMISQHp3 are disposed adjacent to one another in a state in which their channel directions (current-flowing directions) extend along the first direction X. The high breakdown voltage pMISQHp3 adjacent to each other are arranged so as to share $p^+$ type semiconductor regions P1 and P2 for a source and drain. Then, an $n^+$ type semiconductor region N1 and an n type well NW1 are disposed so as to surround one group of the plural high breakdown voltage pMISQHp3. Thus, even if the amount of a reduction in the size of each individual high breakdown voltage pMISQHp3 is small, a large size reduction is enabled as a whole. Therefore, it is possible to significantly reduce the size of a semiconductor chip having the high breakdown voltage pMISQHp3.

Fifth Preferred Embodiment

A fifth embodiment constitutes a modification of the high breakdown voltage MIS according to the fourth embodiment. A description will be given of one example of a high breakdown voltage MIS structure where no large breakdown voltage is required between a source and a well.

Figure 72:
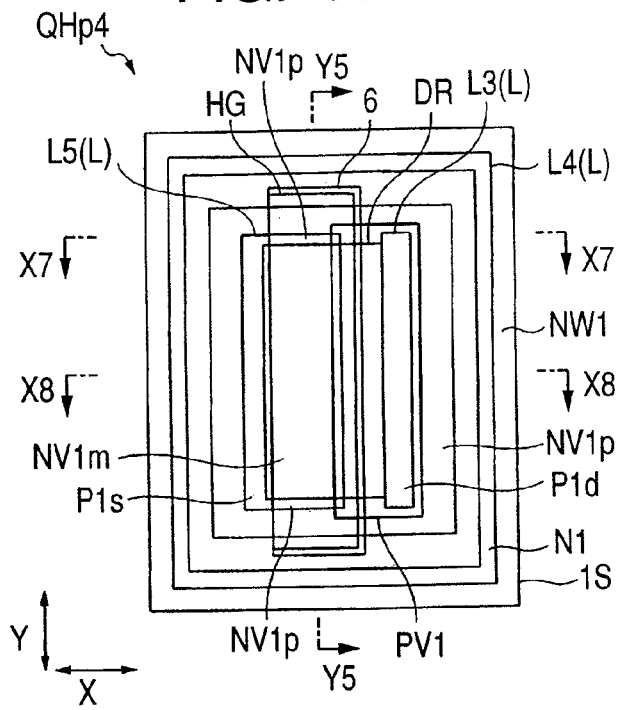
FIG. 72 is a fragmentary plan view illustrating one example of a high breakdown voltage field effect transistor of a semiconductor device representing a fifth embodiment of the present invention.
Figure 73:
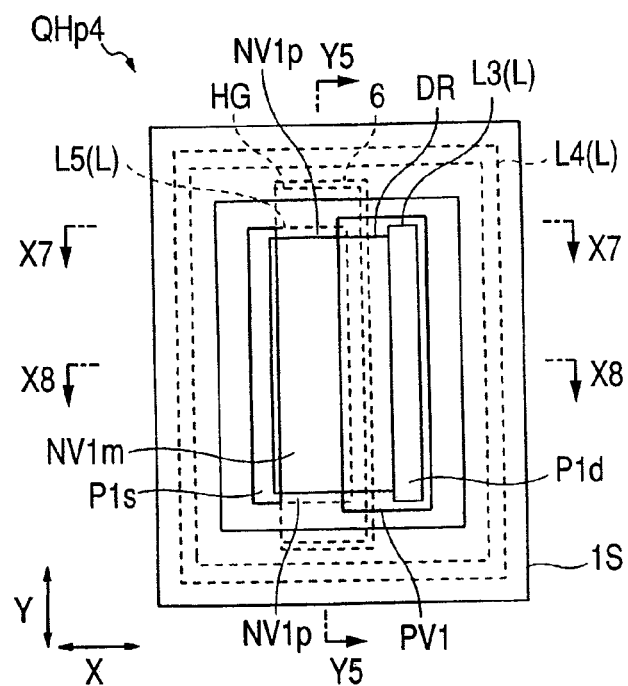
FIG. 73 shows the same spot as FIG. 72 and is a fragmentary plan view particularly showing a layout relationship between a p⁻ type semiconductor region having a field relaxing function of the high breakdown voltage field effect transistor and a counter doped region thereof.
Figure 74:
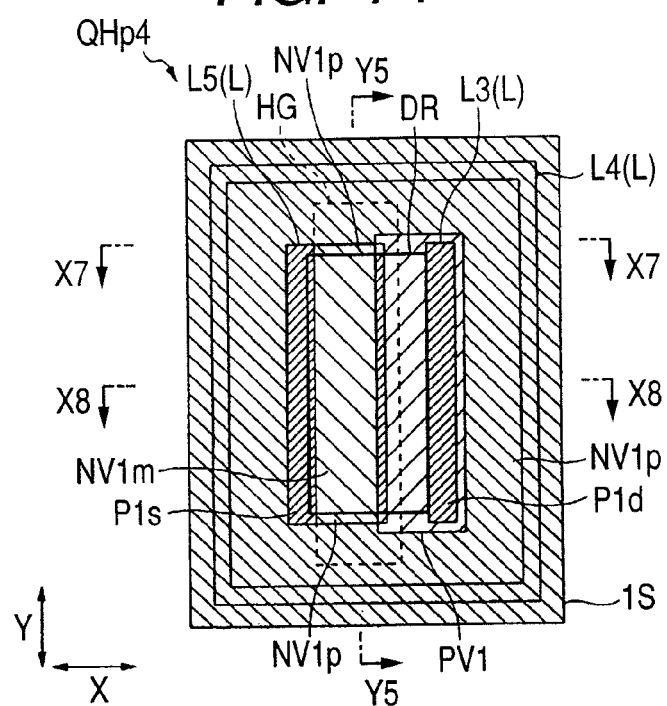
FIG. 74 shows the same spot as FIG. 72 and is a fragmentary plan view particularly showing the manner of respective semiconductor regions of the high breakdown voltage field effect transistor.
Figure 75:
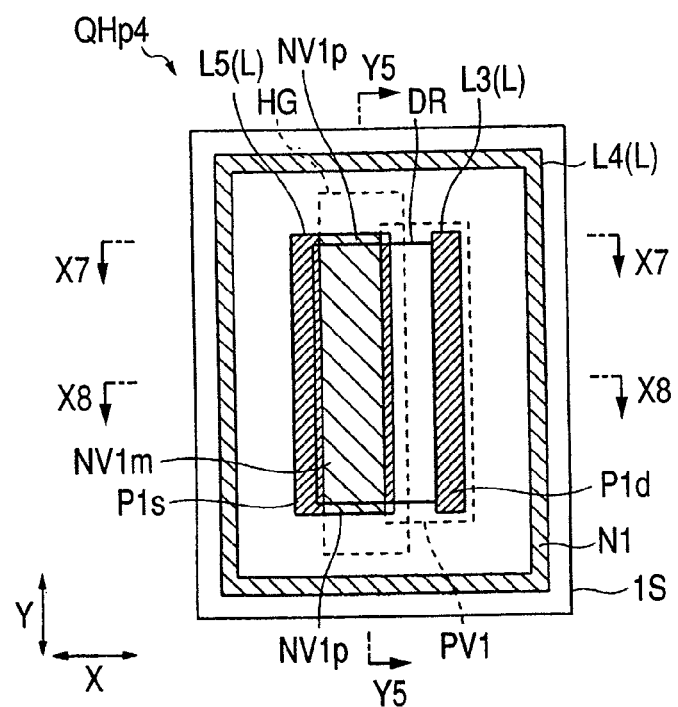
FIG. 75 shows the same spot as FIG. 72 and is a fragmentary plan view particularly showing the manner of semiconductor regions in active regions.
Figure 76:
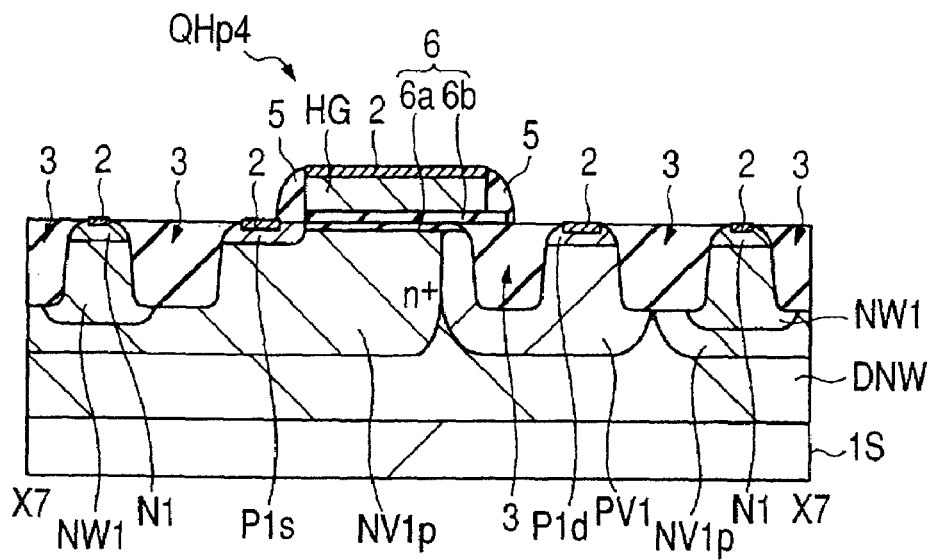
FIG. 76 is a cross-sectional view taken along lines X7-X7 of FIGS. 72 through 75.
Figure 77:
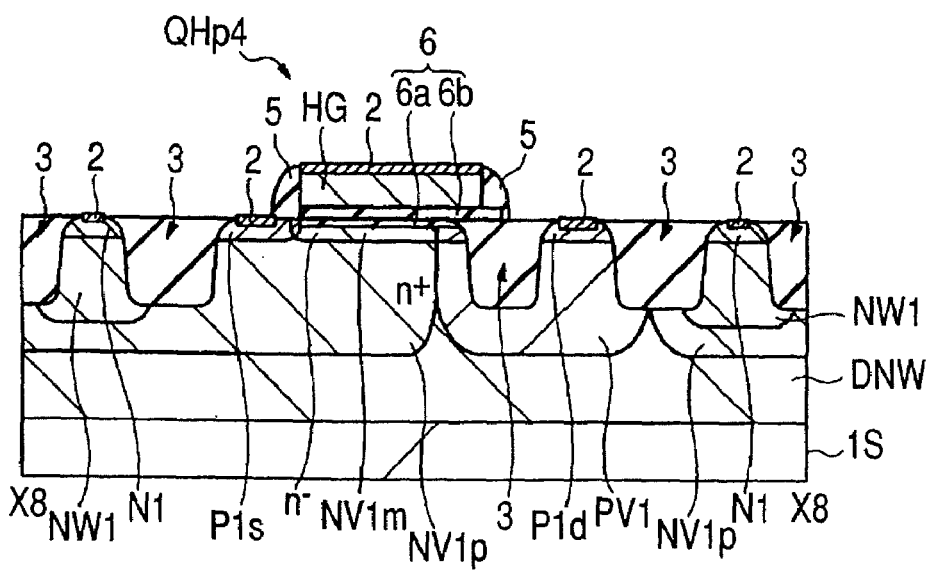
FIG. 77 is a cross-sectional view taken along lines X8-X8 of FIGS. 72 through 75.

FIG. 72 is a fragmentary plan view illustrating one example of a high breakdown voltage pMISQHp4 according to the fifth embodiment, FIG. 73 is a plan view showing the same spot as FIG. 72 and is a fragmentary plan view particularly showing a layout relationship between a p⁻ type semiconductor region PV1 having a field relaxing function of the high breakdown voltage pMISQHp4 and a counter doped region thereof, FIG. 74 is a plan view showing the same spot as FIG. 72 and is a fragmentary plan view particularly showing the arrangement of respective semiconductor regions of the high breakdown voltage pMISQHp4, FIG. 75 is a plan view showing the same spot as FIG. 72 and is a fragmentary plan view particularly showing the arrangement of semiconductor regions in active regions, FIG. 76 is a cross-sectional view taken along lines X7-X7 of FIGS. 72 through 75, and FIG. 77 is a cross-sectional view taken along lines X8-X8 of FIGS. 72 through 75. Incidentally, since sectional views taken along lines Y5-Y5 of FIGS. 72 through 75 are identical to FIG. 70, they are omitted. Although FIGS. 74 and 75 are plan views, isolation regions are given hatching to make it easy to see the drawings. Although a high breakdown voltage pMIS will be explained by way of example in conjunction with the fifth embodiment, the present invention can be applied even to the high breakdown voltage nMIS in a manner similar to the first through fourth embodiments.

The high breakdown voltage pMIS (fourth, eleventh and twelfth high breakdown voltage field effect transistors) QHp4 of the semiconductor device according to the fifth embodiment takes a structure in which, for example, a breakdown voltage 60V can be realized. A source or power supply voltage on the high potential side is about 37V, for example, and a source or power supply voltage on the low potential (reference potential) side is 0 (zero) V, for example. Since the present embodiment is identical to the fourth embodiment in kink countermeasures, a description thereof is omitted. The difference between the fifth embodiment and the fourth embodiment is as follows: In the fifth embodiment, an isolation portion 3 is interposed between a p⁺ type semiconductor region PId for a drain and a channel region in a manner similar to the fourth embodiment. The p⁺ type semiconductor region PId for the drain is electrically connected to its corresponding channel region of the active region L5 through a p⁻ type semiconductor region PV1 having a field relaxing function. No isolation portion 3 is interposed between a p⁺ type semiconductor region PIs for a source and the channel region. The p⁺ type semiconductor region PIs and the channel region are disposed adjacent to each other within one active region L5 and are electrically connected to each other without via the p⁻ type semiconductor region PV1 having the field relaxing function. A gate electrode HG is not formed so as to cover the full area of the active region L. In the active region L5, the channel region is formed at a portion (except for the portion where the p⁻ type semiconductor region PV1 having the field relaxing function on the drain side is disposed) where the gate electrode HG overlaps on a plane basis, whereas the p⁺ type semiconductor region PIs for the source is disposed at a portion where no gate electrode HG overlaps on the plane basis. However, in the fifth embodiment in a manner similar to the fourth embodiment, regions for both ends in a second direction Y, of the active region L5 in which no impurity for counter dope is introduced in the active region L5, are configured as n⁺ type semiconductor regions NV1p. On the other hand, a region (except for the region in which the p⁻ type semiconductor region PV1 having the field relaxing function is disposed), in which the impurity for counter dope is introduced, is configured as an n⁻ type semiconductor region NV1m. The n⁻ type semiconductor region NV1m is formed in the vicinity of the surface of the substrate 1S and is formed over the n⁺ type semiconductor region NV1p. That is, the n⁻ type semiconductor region NV1m is formed at a position shallower than the n⁺ type semiconductor region NV1p. Therefore, even if the gate electrode HG is of the active region L5 that overlaps it on a plane basis, the threshold voltage in the center (main surface portion of substrate 1S) of the channel region, of the active region L5, can be set lower than the threshold voltages at both ends in the second direction Y, of the active region L5. Therefore, it is possible to suppress or prevent the occurrence of the kink effect in a manner similar to the fourth embodiment (the threshold voltages are identical to those described in conjunction with the first embodiment)

In a manner similar to the fourth embodiment, even here, as shown in FIG. 70, the length of the n⁻ type semiconductor region NV1m forming the channel region below the gate electrode HG, and the length of the n⁺ type semiconductor region NV1p are formed such that the length of the n⁻ type semiconductor region NV1m becomes longer than that of the n⁺ type semiconductor region NV1p, as viewed in the transverse direction (second direction Y) of the gate electrode in the active region L5. That is, the n⁻ type semiconductor region NV1m is formed so as to make up more than half of the channel region. Thus, the regions for the hard-to-operate MISs, which are formed at both ends in the second direction Y of the channel region, can be reduced, thus making it possible to prevent a reduction in effective operating speed of the high breakdown voltage MIS (e.g., high breakdown voltage pMISQHp3) according to the present embodiment.

At this time, the semiconductor region NV1m, which is relatively low in concentration, is surrounded by the semiconductor region NV1p, which is relatively high in concentration, as viewed in the gate width direction of the gate electrode HG. The high-concentration semiconductor region NV1p is formed at a position deeper than the low-concentration semiconductor region NV1m, as viewed from the main surface of the substrate 1S.

The n⁺ type semiconductor region NVp1 is formed so as to become deeper than the isolation portion 3. Forming the semiconductor region NVp1 in this way makes it possible to increase the threshold value or voltage at each shoulder portion of the substrate 1S, which contacts the upper portion of the isolation portion 3. It is thus possible to suppress the occurrence of the kink effect.

The structure of the fifth embodiment has such a circuit configuration that the potentials supplied to the p⁺ type semiconductor region PIs for the source, deep n type well DNW, n⁺ type semiconductor region NV1p and n⁻ type semiconductor region NV1m become equal, i.e., no differences in potential occur among the p⁺ type semiconductor region PIs for the source, deep n type well DNW, n⁺ type semiconductor region NV1p and n⁻ type semiconductor region NV1m.

In the fifth embodiment described in this way, the size of the high breakdown voltage pMISQHp4 can be reduced for the same reason as described in conjunction with the second embodiment. Since the capability of suppressing or preventing a punch through can be enhanced in the fifth embodiment, in particular as described in conjunction with the fourth embodiment, the size of the high breakdown voltage pMISQHp4 can be further reduced as compared with the second embodiment. Thus, the size of a semiconductor chip having the high breakdown voltage pMISQHp4 according to the fifth embodiment can be further scaled down as compared with the second embodiment.

Sixth Preferred Embodiment

A sixth embodiment is directed to one example of a method of manufacturing a semiconductor device in which the high breakdown voltage MISs, each having the structure described in conjunction with each of the fourth and fifth embodiments, and the low breakdown voltage MISs thereof are provided over the same substrate 1S, will be described with reference to FIGS. 78 through 101. Incidentally, symbol HR3 indicated in FIGS. 78 through 101 indicates a region (X5-X5) for forming high breakdown voltage MISs each having the structure of the fourth embodiment, symbol HR4 indicates a region (X7-X7) for forming high breakdown voltage MISs each having the structure of the fifth embodiment, and symbol LR indicates a low breakdown voltage MIS forming region.

After completion of the same process steps as described with reference to FIGS. 16 through 33 in conjunction with the third embodiment, a pattern of a resist film PR3 is first formed over the main surface of a substrate 1S by the lithography process as indicated in fragmentary sections of the substrate 1S in the same manufacturing process of FIGS. 78 through 80. The pattern of the resist film PR3 is formed in such a manner that both forming regions of $n^-$ type semiconductor regions each having a field relaxing function in a high breakdown voltage nMIS forming region and $n^+$ type semiconductor regions in a high breakdown voltage pMIS forming region are exposed and ones other than them are covered. Subsequently, for example, phosphor is selectively introduced in the substrate 1S by ion implantation or the like using the pattern of the resist film PR3 as a mask. Thus, since a deep p type well DPW is formed in the high breakdown voltage nMIS forming region, $n^-$ type semiconductor regions NV1 are formed. Since a deep n type well DNW is formed in the high breakdown voltage pMIS forming region, $n^+$ type semiconductor regions NV1$p$ are formed. At this time, the semiconductor regions NV1 and the semiconductor regions NV1$p$ are formed so as to be deeper than the isolation portion 3. Forming the semiconductor regions NV1$p$ in this way makes it possible to enhance the capability of suppressing or preventing the occurrence of a kink effect. Incidentally, in this stage, although the $n^-$ type semiconductor regions NV1 each having the field relaxing function in the high breakdown voltage nMIS forming region, and the $n^+$ type semiconductor regions NV1$p$ in the high breakdown voltage pMIS forming region are not formed perfectly in a stage at which the impurities for forming these are introduced, those regions are also illustrated to make it easy to understand the description thereof.

Figure 81:
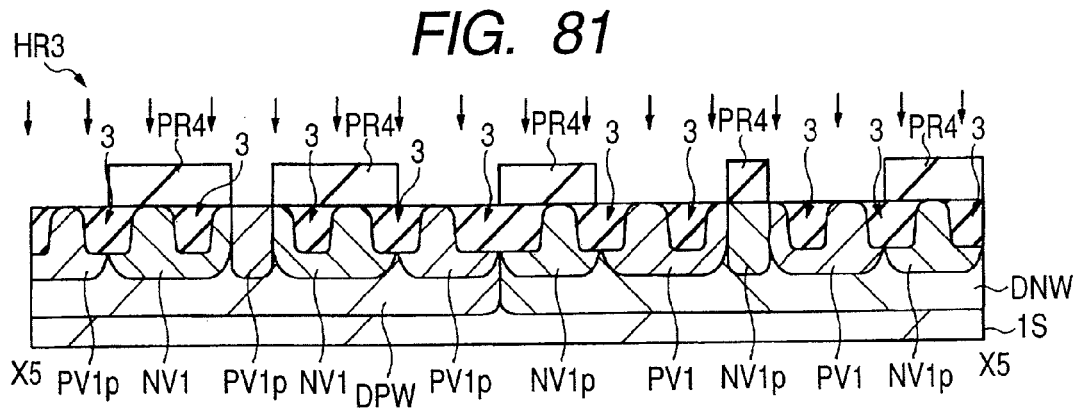
FIG. 81 is a fragmentary cross-sectional view following the steps of FIGS. 78 through 80, showing the third forming region of the high breakdown voltage field effect transistor in the manufacturing process of the semiconductor device.
Figure 82:
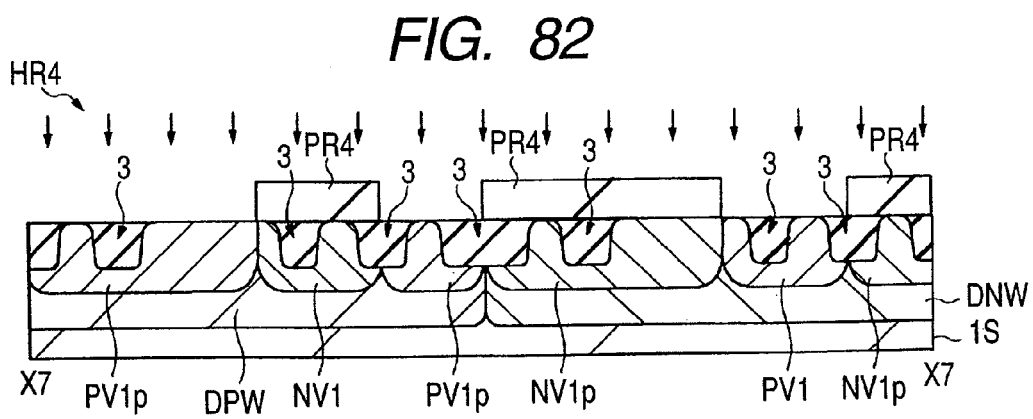
FIG. 82 is a fragmentary cross-sectional view illustrating the fourth forming region of the high breakdown voltage field effect transistor of the semiconductor device in the same manufacturing process as FIG. 81.
Figure 83:
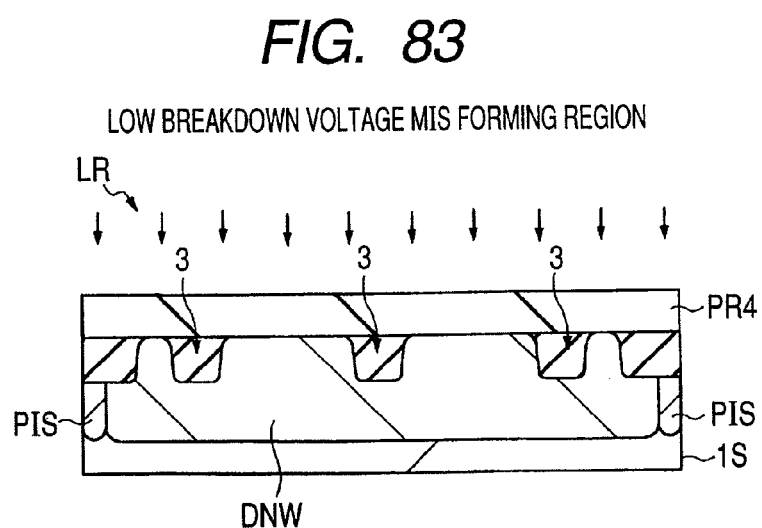
FIG. 83 is a fragmentary cross-sectional view showing the forming region of the low breakdown voltage field effect transistor of the semiconductor device in the same manufacturing process as FIG. 81.
Figure 84:
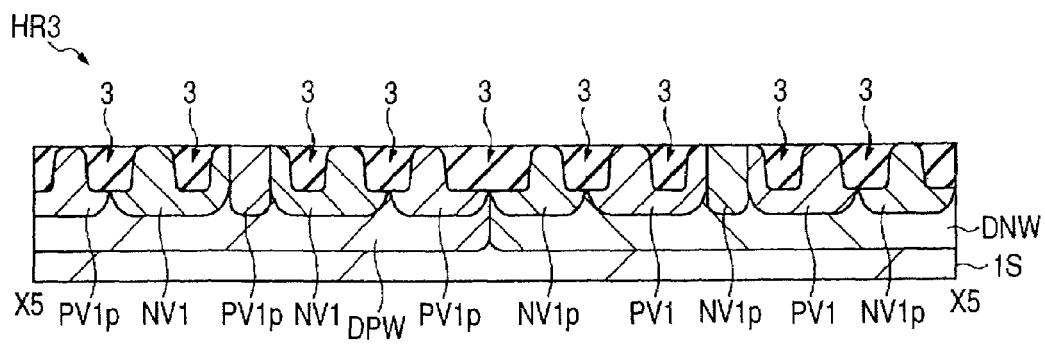
FIG. 84 is a fragmentary cross-sectional view following the steps of FIGS. 81 through 83, showing the third forming region of the high breakdown voltage field effect transistor in the manufacturing process of the semiconductor device.
Figure 85:
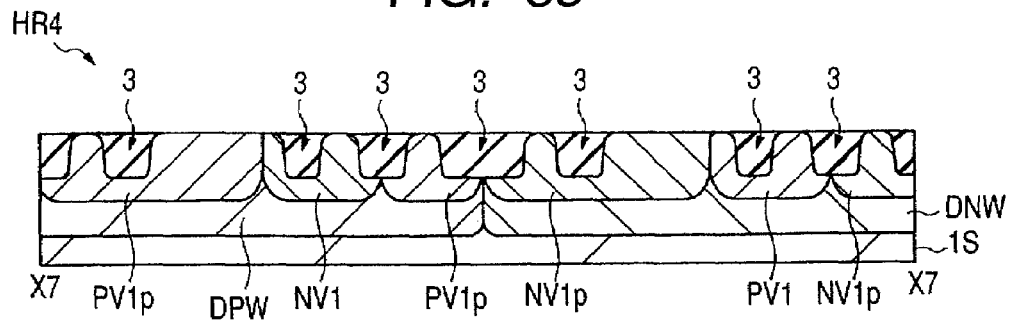
FIG. 85 is a fragmentary cross-sectional view illustrating the fourth forming region of the high breakdown voltage field effect transistor of the semiconductor device in the same manufacturing process as FIG. 84.
Figure 86:
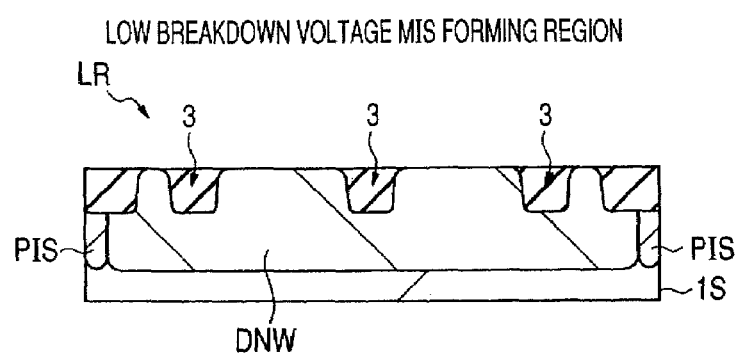
FIG. 86 is a fragmentary cross-sectional view showing the forming region of the low breakdown voltage field effect transistor of the semiconductor device in the same manufacturing process as FIG. 84.

Next, the resist film PR3 is removed, and, thereafter, a pattern of a resist film PR4 is formed over the main surface of the substrate 1S by a lithography process, as shown in fragmentary cross-sections of the substrate 1S in the same manufacturing process of FIGS. 81 through 83. The pattern of the resist film PR4 is formed in such a manner that both forming regions of $p^-$ type semiconductor regions each having a field relaxing function in the high breakdown voltage pMIS forming region and $p^+$ type semiconductor regions in the high breakdown voltage nMIS forming region are exposed and ones other than them are covered. Subsequently, for example, boron is selectively introduced in the substrate 1S by ion implantation or the like using the pattern of the resist film PR4 as a mask. Thus, since a deep n type well DNW is formed in the high breakdown voltage pMIS forming region, p- type semiconductor regions PV1 are formed. Since a deep p type well DPW is formed in the high breakdown voltage nMIS forming region, p+ type semiconductor regions (fifth, fifteenth and seventeenth semiconductor regions) PV1$p$ are formed. At this time, the semiconductor regions PV1 and the semiconductor regions PV1$p$ are formed so as to be deeper than the isolation portion 3. Thus, the capability of suppressing or preventing the occurrence of a kink effect can be enhanced by forming the semiconductor regions NV1$p$. Incidentally, although the $n^-$ type semiconductor regions NV1 each having the field relaxing function in the high breakdown voltage nMIS forming region, the $n^+$ type semiconductor regions NV1$p$ in the high breakdown voltage pMIS forming region, the $p^-$ type semiconductor regions PV1 each having the field relaxing function in the high breakdown voltage pMIS forming region, and the $p^+$ type semiconductor regions PV1$p$ in the high breakdown voltage nMIS forming region are not formed perfectly in this stage, those regions are also illustrated to make it easy to understand the description thereof.

Next, the resist film PR4 is removed, and, thereafter, the substrate 1S is subjected to an enlargement diffusion process (annealing) to form the corresponding $n^-$ type semiconductor regions NV1 each having the field relaxing function in the high breakdown voltage nMIS forming region, $p^+$ type semiconductor regions PV1$p$ in the high breakdown voltage nMIS forming region, $p^-$ type semiconductor regions PV1 each having the field relaxing function in the high breakdown voltage pMIS forming region, and $n^+$ type semiconductor regions NV1$p$ in the high breakdown voltage pMIS forming region in a state of being deeper than the isolation portion 3 and being enlarged to positions shallower than the deep n type well DNW and the deep p type well DPW. Thus, in the sixth embodiment, the $p^+$ type semiconductor regions PV1$p$ and the $n^+$ type semiconductor regions NV1$p$ are formed at the same forming process as the $p^-$ type semiconductor regions PV1 each having the field relaxing function and the $n^-$ type semiconductor regions NV1. Therefore, no semiconductor device manufacturing process step increases even where the $p^+$ type semiconductor regions PV1$p$ and the $n^+$ type semiconductor regions NV1$p$ are formed. Thus, a semiconductor device high in performance and reliability can be provided without significantly increasing the manufacturing time and cost of the semiconductor device.

Figure 87:
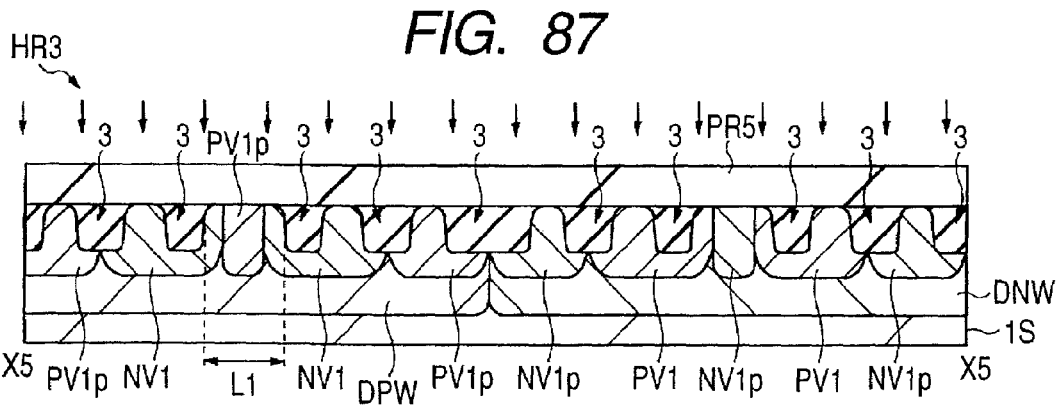
FIG. 87 is a cross-sectional view following the steps of FIGS. 84 through 86, including a section corresponding to each of lines X5-X5 of FIGS. 64 through 67 in the third forming region of the high breakdown voltage field effect transistor in the manufacturing process of the semiconductor device.
Figure 89:
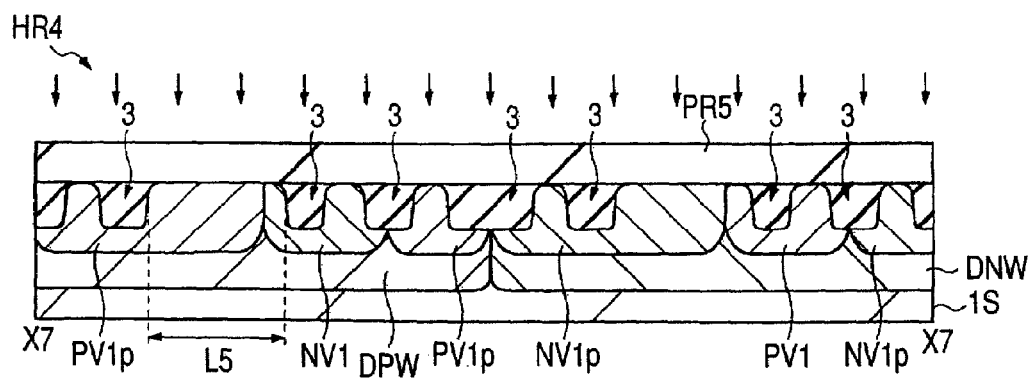
FIG. 89 is a cross-sectional view including a section corresponding to each of lines X7-X7 of FIGS. 72 through 75 in the same manufacturing process as FIG. 87.
Figure 90:
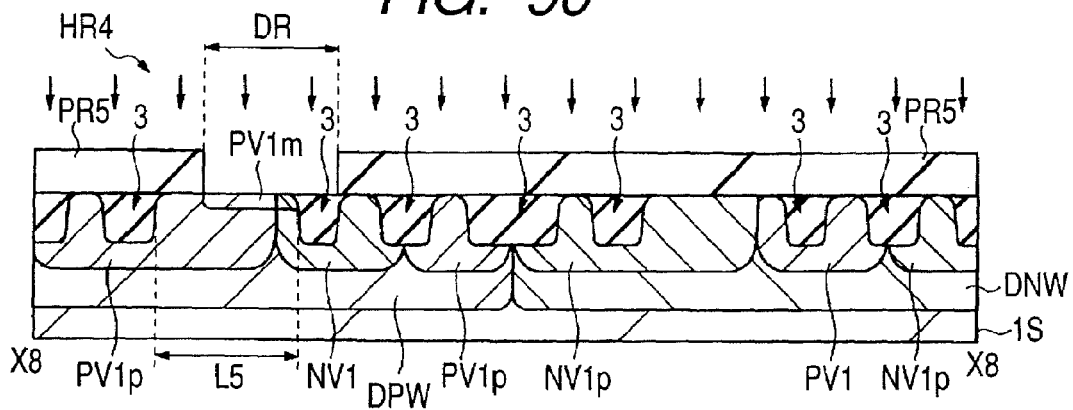
FIG. 90 is a cross-sectional view including a section corresponding to each of lines X8-X8 of FIGS. 72 through 75 in the same manufacturing process as FIG. 87.
Figure 91:
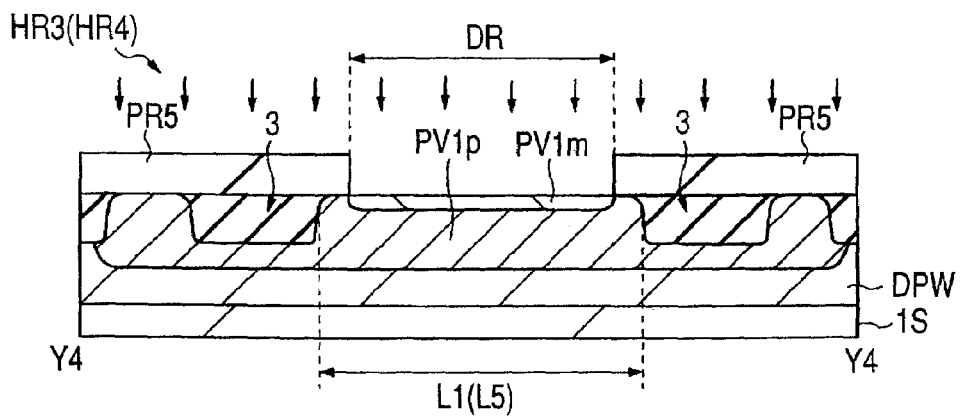
FIG. 91 is a cross-sectional view corresponding to each of lines Y4-Y4 of FIGS. 64 through 67 or each of lines Y5-Y5 of FIGS. 72 through 75 in the same manufacturing process as FIG. 87.
Figure 92:
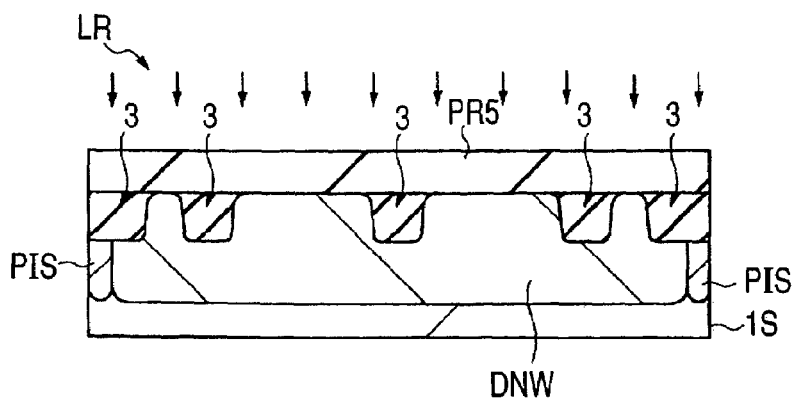
FIG. 92 is a fragmentary cross-sectional view showing a forming region of a low breakdown voltage field effect transistor of the semiconductor device in the same processing process as FIG. 87.

Next, the processing proceeds to a counter dope process. FIGS. 87 through 92 respectively show fragmentary cross-sectional views of the substrate 1S at the counter dope process with respect to the high breakdown voltage nMIS forming region. FIG. 87 is a cross-sectional view including the spots or sections corresponding to lines X5-X5 of FIGS. 64 through 67, FIG. 88 is a cross-sectional view including the spots or sections corresponding to lines X6-X6 of FIGS. 64 through 67, FIG. 89 is a cross-sectional view including the spots or sections corresponding to lines X7-X7 of FIGS. 72 through 75, FIG. 90 is a cross-sectional view including the spots or sections corresponding to lines X8-X8 of FIGS. 72 through 75, FIG. 91 is a cross-sectional view corresponding to each of lines Y4-Y4 of FIGS. 64 through 67 or each of lines Y5-Y5 of FIGS. 72 through 75, and FIG. 92 is a fragmentary cross-sectional view showing a forming region of a low breakdown voltage MIS at the counter dope process. Incidentally, since the cross-sectional views of the spots corresponding to lines Y4-Y4 of FIGS. 64 through 67 at the counter dope process and corresponding to lines Y5-Y5 of FIGS. 72 through 75 are identical, the cross-sectional view corresponding thereto is shown in FIG. 91 alone for simplification of their description.

Figure 88:
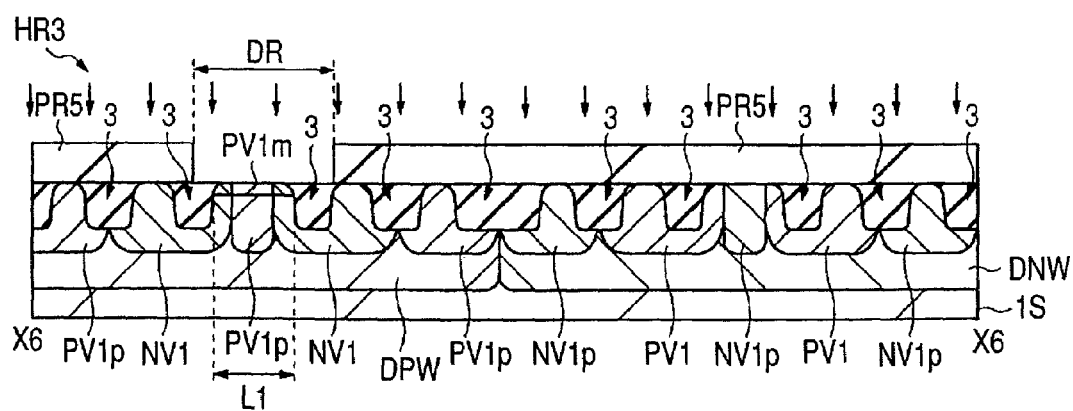
FIG. 88 is a cross-sectional view including a section corresponding to each of lines X6-X6 of FIGS. 64 through 67 in the same manufacturing process as FIG. 87.

A pattern of a resist film PR5 is first formed over the main surface of the substrate 1S (i.e., wafer) via the lithography process. The pattern of the resist film PR5 is formed in such a manner that a counter doped region DR in the high breakdown voltage nMIS forming region is opened and ones other than it are covered. That is, some of both ends in the second direction Y, of the active region L1 on the high breakdown voltage nMIS side are covered with the resist film PR5 in the forming region HR3 as shown in FIGS. 87 and 91. As shown in FIGS. 88 and 91, the active region L1 on the high breakdown voltage nMIS side other than it is exposed from the resist film PR5. In the forming area HR4 as shown in FIGS. 89 and 91, some of both ends in the second direction Y, of the active region L5 on the high breakdown voltage nMIS side are covered with the resist film PR5. As shown in FIGS. 90 and 91, the active region L5 on the high breakdown voltage nMIS side other than it is exposed from the resist film PR5. Subsequently, for example, phosphor or arsenic (As) is selectively and shallowly introduced in the substrate 1S by ion implantation or the like using the pattern of the resist film PR5 as a mask. Consequently, $p^-$ type semiconductor regions (sixth, sixteenth and eighteenth semiconductor regions) PV1$m$ are formed over the $p^+$ type semiconductor regions PV1$p$ of the active regions L1 and L5 on the high breakdown voltage nMIS side, which are exposed from the resist film PR5. On the other hand, the upper portions of the $p^+$ type semiconductor regions PV1$p$ in the regions covered with the resist film PR5 at both ends in the second direction Y remain at a $p^+$ type even in the active regions L1 and L5 on the same high breakdown voltage nMIS side. Also the $p^-$ type semiconductor regions PV1$m$ are formed in the vicinity of the surface of the semiconductor substrate 1S and are formed over the $p^+$ type semiconductor regions PV1$p$. That is, the $p^-$ type semiconductor regions PV1$m$ are formed at positions shallower than the $p^+$ type semiconductor regions PV1$p$. Therefore, the threshold voltages at the centers (main surface portion of substrate 1S) of the channel regions of the active regions L1 and L5 on the high breakdown voltage nMIS side can be set lower than the threshold voltages at both ends (substrate 1S portions that contact the sidewalls of the isolation portion 3) in the second direction Y, of the active regions L1 and L5, thereby making it possible to suppress or prevent the occurrence of the kink effect.

Now, the length of the semiconductor region PV1$m$ forming the channel region below a gate electrode HG, and the length of the semiconductor region PV1$p$ are formed such that the length of the semiconductor region PV1$m$ becomes longer than that of the semiconductor region PV1$p$ as viewed in the transverse direction (second direction Y) of the gate electrode to be formed later. Thus, the regions for the hard-to-operate MISs formed at both ends in the second direction Y, of the channel region can be reduced, thereby making it possible to prevent a reduction in effective operating speed of the high breakdown voltage nMIS according to the present embodiment.

At this time, the semiconductor regions PVp1 are formed so as to become deeper than the isolation portion 3. Forming the semiconductor regions PVp1 in this way makes it possible to increase the threshold value or voltage at each shoulder portion of the substrate 1S, which contacts the upper portion of the isolation portion 3. It is thus possible to suppress the occurrence of the kink effect.

Figure 93:
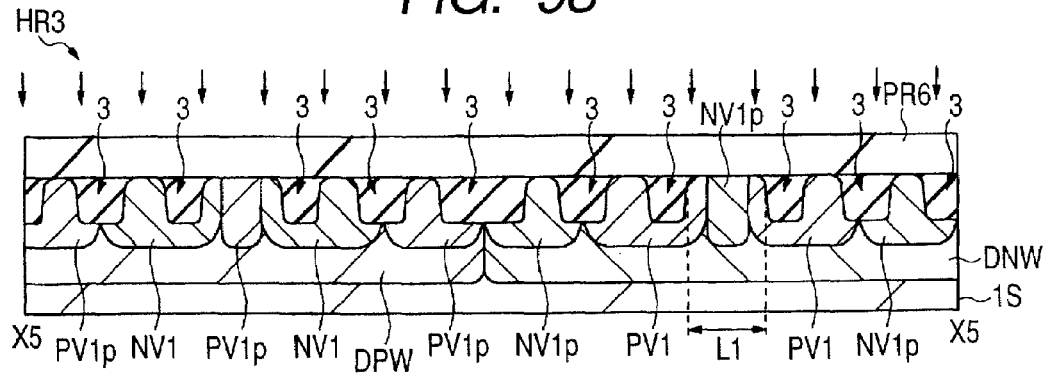
FIG. 93 is a cross-sectional view following the steps of FIGS. 87 through 92, including the section corresponding to each of lines X5-X5 of FIGS. 64 through 67 in the third forming region of the high breakdown voltage field effect transistor in the manufacturing process of the semiconductor device.
Figure 95:
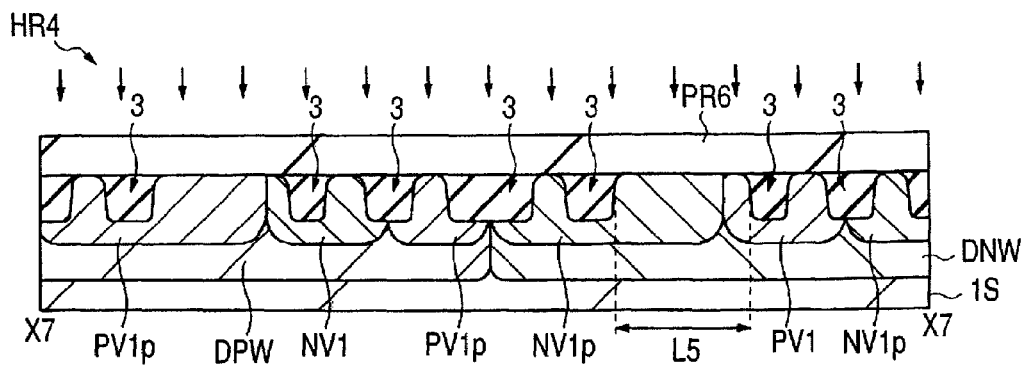
FIG. 95 is a cross-sectional view including the section corresponding to each of lines X7-X7 of FIGS. 72 through 75 in the same manufacturing process as FIG. 93.
Figure 96:
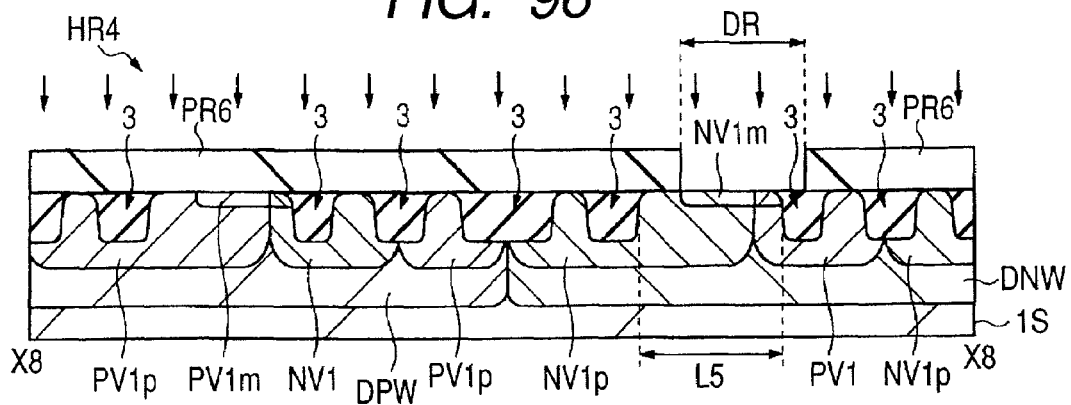
FIG. 96 is a cross-sectional view including the section corresponding to each of lines X8-X8 of FIGS. 72 through 75 in the same manufacturing process as FIG. 93.
Figure 97:
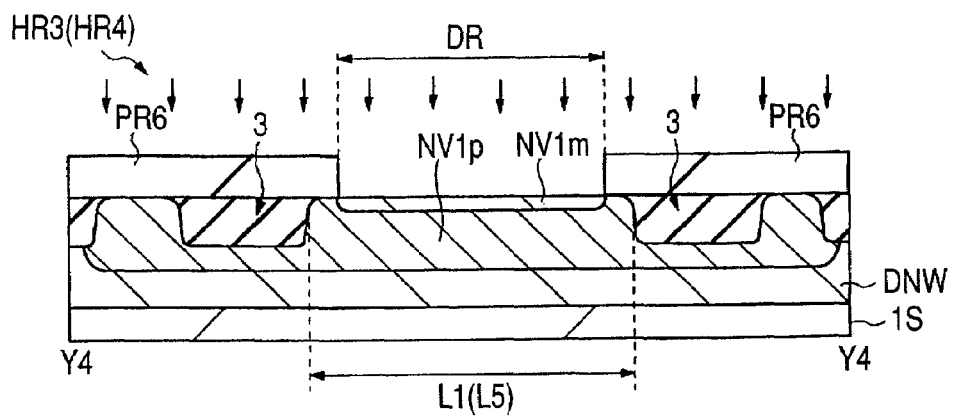
FIG. 97 is a cross-sectional view corresponding to each of lines Y4-Y4 of FIGS. 64 through 67 or each of lines Y5-Y5 of FIGS. 72 through 75 in the same manufacturing process as FIG. 93.
Figure 98:
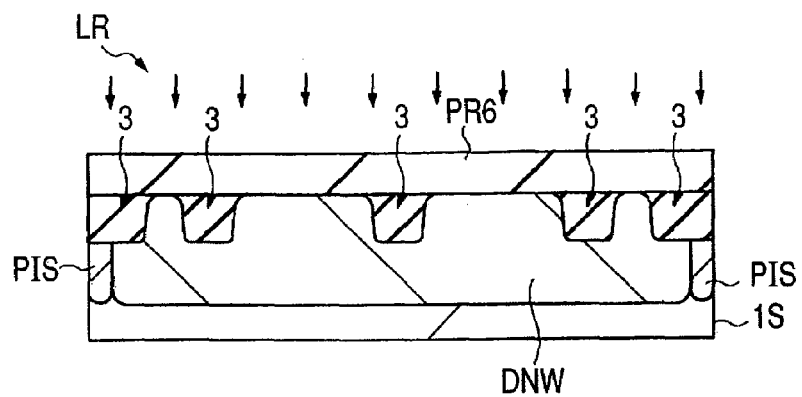
FIG. 98 is a fragmentary cross-sectional view showing the forming region of the low breakdown voltage field effect transistor of the semiconductor device in the same processing process as FIG. 93.

Next, the resist film PR5 is removed, and, thereafter, the processing proceeds to a counter dope process with respect to the high breakdown voltage pMIS forming region. FIGS. 93 through 98 respectively show fragmentary cross-sectional views of the substrate 1S at the counter dope process with respect to the high breakdown voltage pMIS forming region. FIG. 93 is a cross-sectional view including the spots or sections corresponding to lines X5-X5 of FIGS. 64 through 67, FIG. 94 is a cross-sectional view including the spots or sections corresponding to lines X6-X6 of FIGS. 64 through 67, FIG. 95 is a cross-sectional view including the spots or sections corresponding to lines X7-X7 of FIGS. 72 through 75, FIG. 96 is a cross-sectional view including the spots or sections corresponding to lines X8-X8 of FIGS. 72 through 75, FIG. 97 is a cross-sectional view corresponding to each of lines Y4-Y4 of FIGS. 64 through 67 or each of lines Y5-Y5 of FIGS. 72 through 75, and FIG. 98 is a fragmentary cross-sectional view showing a forming region of a low breakdown voltage MIS at the counter dope process, respectively. Incidentally, since the cross-sectional views of the spots corresponding to lines Y4-Y4 of FIGS. 64 through 67 at the counter dope process and corresponding to lines Y5-Y5 of FIGS. 72 through 75 are also identical, the cross-sectional view corresponding thereto is shown in FIG. 97 alone for simplification of their description.

Figure 94:
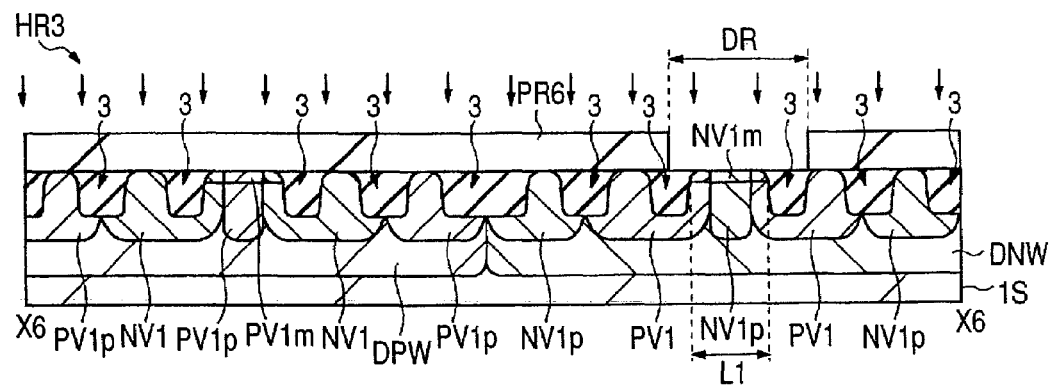
FIG. 94 is a cross-sectional view including the section corresponding to each of lines X6-X6 of FIGS. 64 through 67 in the same manufacturing process as FIG. 93.

A pattern of a resist film PR6 is first formed over the main surface of the substrate 1S (i.e., wafer) via the lithography process. The pattern of the resist film PR6 is formed in such a manner that a counter doped region DR in the high breakdown voltage pMIS forming region is opened and ones other than it are covered. That is, some of both ends in the second direction Y, of the active region L1 on the high breakdown voltage pMIS side are covered with the resist film PR6 in the forming region HR3, as shown in FIGS. 93 and 97. As shown in FIGS. 94 and 97, the active region L1 on the high breakdown voltage pMIS side other than it is exposed from the resist film PR6. In the forming area HR4 as shown in FIGS. 95 and 97, some of both ends in the second direction Y, of the active region L5 on the high breakdown voltage pMIS side are covered with the resist film PR6. As shown in FIGS. 96 and 97, the active region L5 on the high breakdown voltage pMIS side other than it is exposed from the resist film PR6. Subsequently, for example, boron is selectively and shallowly introduced in the substrate 1S by ion implantation or the like using the pattern of the resist film PR6 as a mask. Consequently, $n^-$ type semiconductor regions NV1$m$ are formed over the $n^+$ type semiconductor regions NV1$p$ of the active regions L1 and L5 on the high breakdown voltage pMIS side, which are exposed from the resist film PR6. On the other hand, the upper portions of the $n^+$ type semiconductor regions NV1$p$ in the regions covered with the resist film PR6 at both ends in the second direction Y remain at an $n^+$ type even in the active regions L1 and L5 on the same high breakdown voltage pMIS side. Also, the $n^-$ type semiconductor regions NV1$m$ are formed in the vicinity of the surface of the semiconductor substrate 1S and are formed over the $n^+$ type semiconductor regions NV1$p$. That is, the $n^-$ type semiconductor regions NV1$m$ are formed at positions shallower than the $n^+$ type semiconductor regions NV1$p$. Therefore, the threshold voltages at the centers (main surface portion of substrate 1S) of the channel regions of the active regions L1 and L5 on the high breakdown voltage pMIS side can be set lower than the threshold voltages at both ends (substrate 1S portions that contact the sidewalls of the isolation portion 3) in the second direction Y, of the active regions L1 and L5 on the high breakdown voltage pMIS side, thereby making it possible to suppress or prevent the occurrence of the kink effect.

Now, the length of the semiconductor region NV1m forming the channel region below a gate electrode HG, and the length of the semiconductor region NV1p are formed such that the length of the semiconductor region NV1m becomes longer than that of the semiconductor region NV1p as viewed in the transverse direction (second direction Y) of the gate electrode to be formed later. That is, the semiconductor region NV1m is formed so as to make up more than half of the channel region. Thus, the regions for the hard-to-operate MISs formed at both ends in the second direction Y, of the channel region can be reduced, thereby making it possible to prevent a reduction in effective operating speed of the high breakdown voltage pMIS according to the present embodiment.

At this time, the semiconductor regions NVp1 are formed so as to be deeper than the isolation portion 3. Forming the semiconductor regions NVp1 in this way makes it possible to increase the threshold voltage at the shoulder portion of the substrate 1S, which contacts it's the corresponding upper portion of the isolation portion 3. Thus, it is possible to suppress the occurrence of the kink effect.

Figure 99:
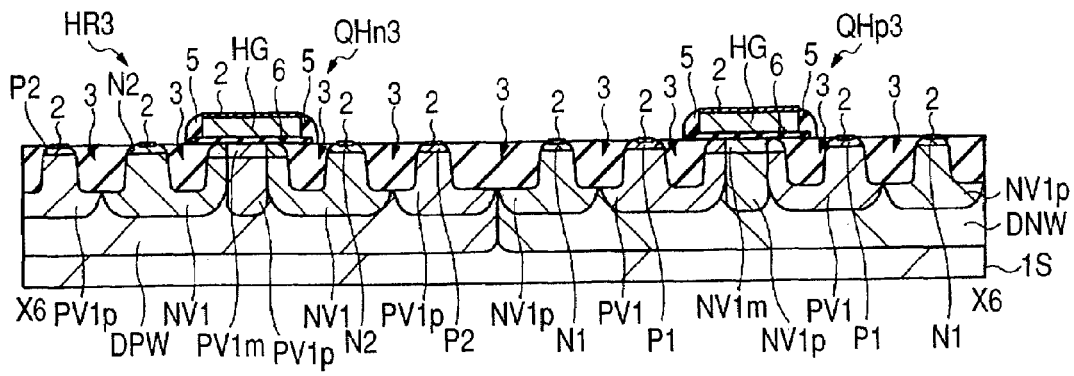
FIG. 99 is a cross-sectional view following the steps of FIGS. 93 through 99, including the section corresponding to each of lines X5-X5 of FIGS. 64 through 67 in the third forming region of the high breakdown voltage field effect transistor in the manufacturing process of the semiconductor device.
Figure 100:
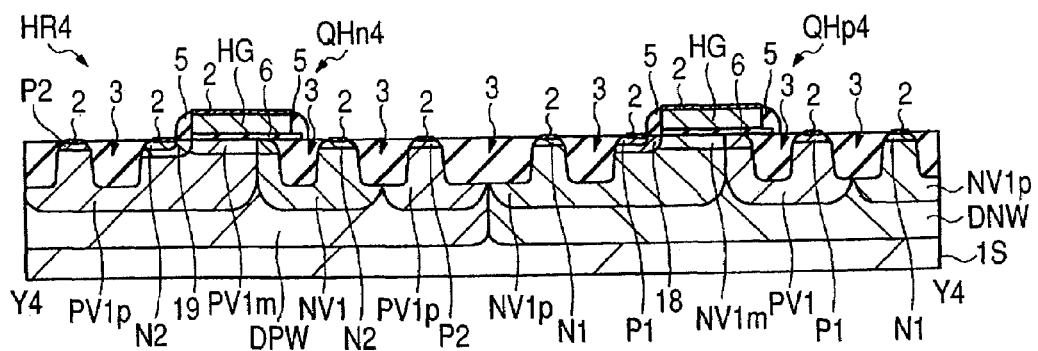
FIG. 100 is a fragmentary cross-sectional view showing a fourth forming region of the high breakdown voltage field effect transistor of the semiconductor device in the same manufacturing process as FIG. 99.
Figure 101:
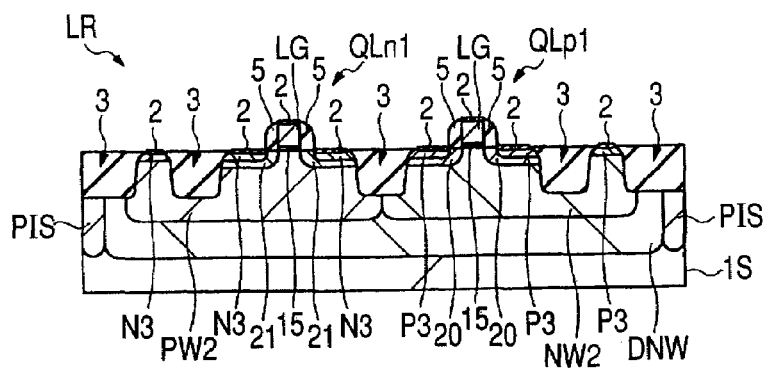
FIG. 101 is a fragmentary cross-sectional view showing the forming region of the low breakdown voltage field effect transistor of the semiconductor device in the same manufacturing process as FIG. 99.

Thereafter, the resist film PR6 is removed and thereafter the corresponding high breakdown voltage nMIS (ninth and tenth high breakdown voltage field effect transistors) QHn3, high breakdown voltage nMIS (eleventh and twelfth high breakdown voltage field effect transistors) QHn4, high breakdown voltage pMISQHp3 and QHp4, low breakdown voltage nMISQLn1 and low breakdown voltage pMISQLp1 are formed over the same substrate 1S via process steps similar to the third embodiment, as shown in fragmentary sections of the substrate 1S in the same manufacturing process of FIGS. 99 through 101. Incidentally, the illustration of an insulating film 6a is omitted to make it easy to see or read the drawings in consideration of the sixth embodiment. Thus, a low breakdown voltage MIS manufacturing process and a high breakdown voltage MIS manufacturing process are placed in common use in the manufacturing process, thereby making it possible to achieve a reduction in the manufacturing process of the semiconductor device having a low breakdown voltage MISs and high breakdown voltage MISs over the same substrate 1S.

Seventh Preferred Embodiment

A seventh embodiment will be explained for a case in which each of the trench type isolation portions 3 of the semiconductor device according to the fourth embodiment is replaced with an isolation portion formed by a LOCOS (Local Oxidization of Silicon) method.

Figure 102:
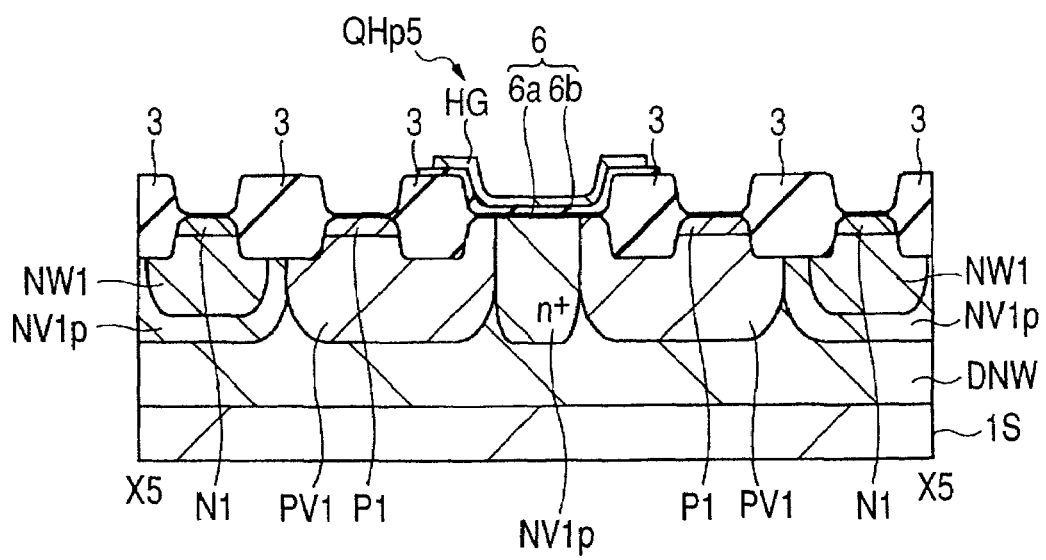
FIG. 102 is a cross-sectional view showing one example of a high breakdown voltage field effect transistor of a semiconductor device illustrative of a seventh embodiment of the present invention and depicting the section corresponding to each of lines X5-X5 of FIGS. 64 through 67.
Figure 103:
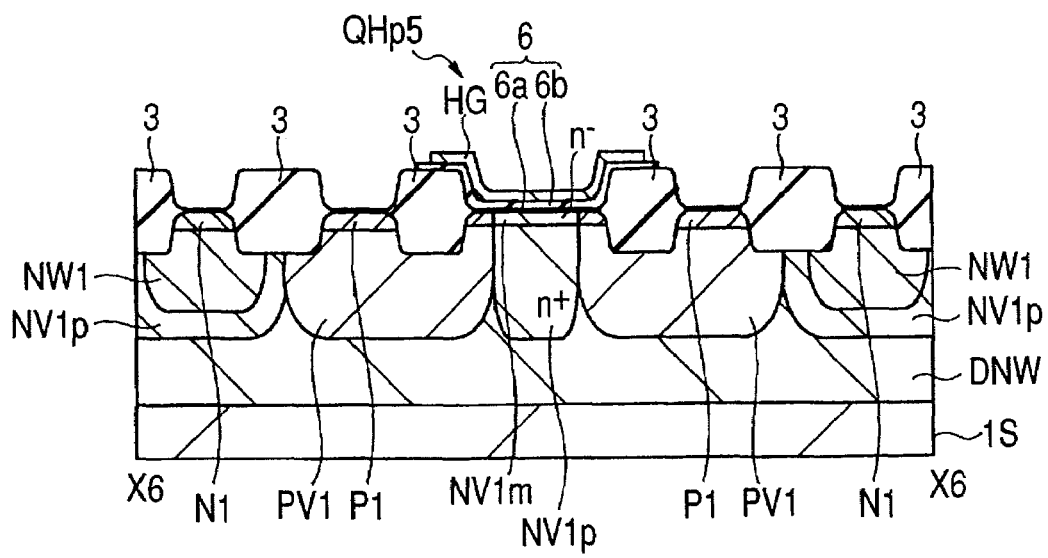
FIG. 103 is a cross-sectional view showing the high breakdown voltage field effect transistor shown in FIG. 102 and illustrating the section corresponding to each of lines X6-X6 of FIGS. 64 through 67.
Figure 104:
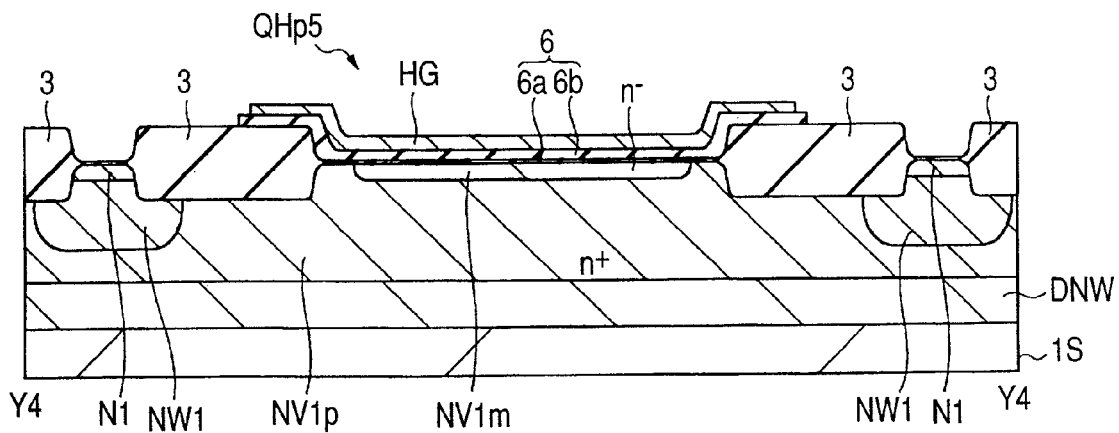
FIG. 104 is a cross-sectional view showing the high breakdown voltage field effect transistor shown in FIG. 102 and depicting the section corresponding to each of lines Y4-Y4 of FIGS. 64 through 67.

Fragmentary cross-sectional views illustrative of one example of a high breakdown voltage MIS according to the seventh embodiment are shown in FIGS. 102 through 104. Plan views thereof are identical to FIGS. 64 through 67 employed in the fourth embodiment. FIG. 102 is a cross-sectional view showing the spots or sections corresponding to lines X5-X5 of FIGS. 64 through 67, FIG. 103 is a cross-sectional view showing the spots or sections corresponding to lines X6-X6 of FIGS. 64 through 67, and FIG. 104 is a cross-sectional view showing the spots or sections corresponding to lines Y4-Y4 of FIGS. 64 through 67. Incidentally, although a description will be made hereof a case in which the present invention is applied to a high breakdown voltage pMISQHp5, the present invention can also be applied to a high breakdown voltage nMIS.

The high breakdown voltage pMISQHp5 according to the seventh embodiment is identical to that of the fourth embodiment, except for the fact that the isolation portions 3 are formed by the LOCOS method. That is, a laminated pattern of an insulating film comprising a thin silicon oxide or the like and an oxidation-resistant insulating film deposited thereon and comprising silicon nitride or the like is formed in the active region above the main surface of the substrate 1S without forming the isolation portions by digging trenches in the main surface of the substrate 1S and embedding an insulating film therein. Thereafter, the substrate 1S is subjected to a thermal oxidation process to thereby form isolation portions 3 comprising silicon oxide or the like in isolation regions exposed from the laminated pattern.

Even in the present embodiment, as described in conjunction with the fourth embodiment, the capability of suppressing or preventing a punch through between the $p^+$ type semiconductor regions P1 and P1 ($p^-$ type semiconductor regions PV1 and PV1) for the source and drain can be enhanced. Therefore, it is possible to shorten the design channel length (length in the first direction X) of the high breakdown voltage pMISQHp5. That is, even in the case of a high breakdown voltage pMISQHp5 in which the isolation portions 3 are formed by the LOCOS method, its size can be scaled down. It is also possible to reduce the size of a semiconductor chip having the high breakdown voltage pMISQHp5.

Since a structure other than the isolation portions 3 and a manufacturing method are similar to those of the fourth and sixth embodiments, and an effect similar thereto can be obtained, a description thereof is omitted.

Eighth Preferred Embodiment

An eighth embodiment will be explained for a case in which each of the trench type isolation portions 3 of the semiconductor device according to the fifth embodiment is replaced with an isolation portion formed by the LOCOS method.

Figure 105:
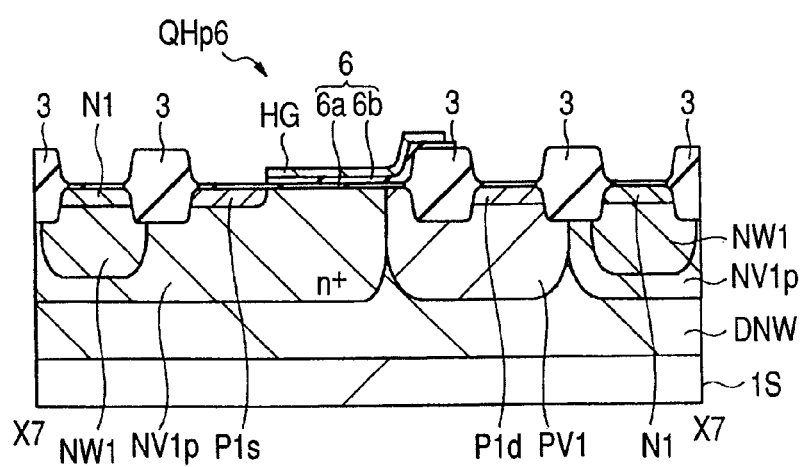
FIG. 105 is a cross-sectional view showing one example of a high breakdown voltage field effect transistor of a semiconductor device illustrative of an eighth embodiment of the present invention and depicting the section corresponding to each of lines X7-X7 of FIGS. 72 through 75.
Figure 106:
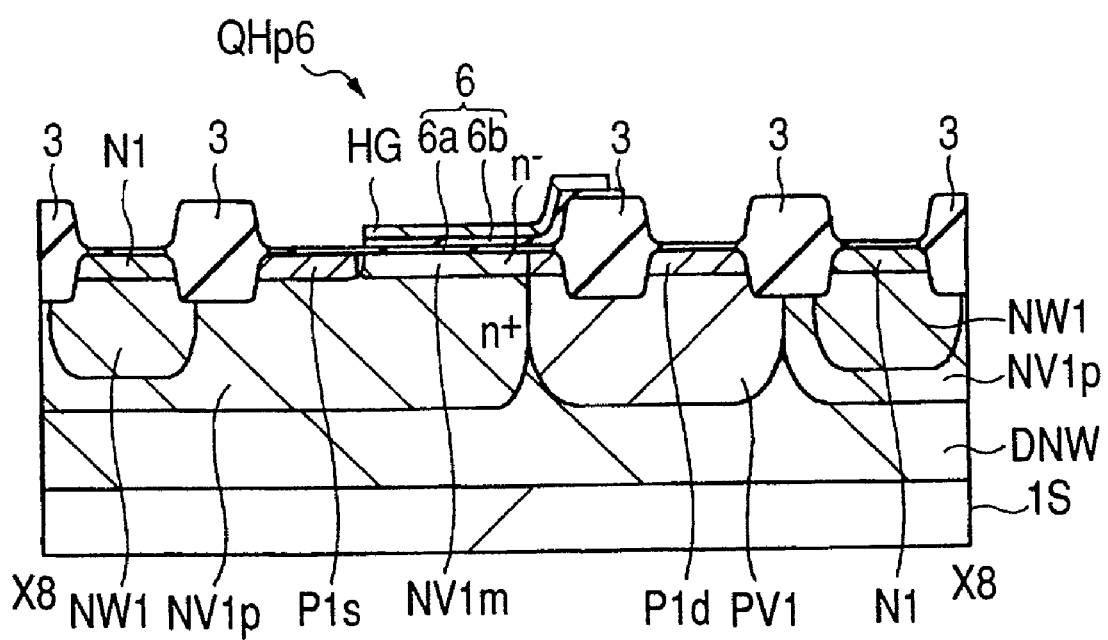
FIG. 106 is a cross-sectional view illustrating the high breakdown voltage field effect transistor shown in FIG. 105 and showing the section corresponding to each of lines X8-X8 of FIGS. 72 through 75.

Fragmentary cross-sectional views illustrative of one example of a high breakdown voltage MIS according to the eighth embodiment are shown in FIGS. 105 and 106. Plan views thereof are identical to FIGS. 72 through 75 which illustrate the fifth embodiment. FIG. 105 is a cross-sectional view showing the spots or sections corresponding to lines X7-X7 of FIGS. 72 through 75, and FIG. 106 is a cross-sectional view showing the spots or sections corresponding to lines X8-X8 of FIGS. 72 through 75. Since cross-sectional views taken along lines Y5-Y5 of FIGS. 72 through 75 are identical to FIG. 104, which illustrates the seventh embodiment, a description thereof is omitted. Incidentally, although a description will be made here of a case in which the present invention is applied to a high breakdown voltage pMISQHp6, the present invention can also be applied to a high breakdown voltage nMIS.

The high breakdown voltage pMISQHp6 according to the eighth embodiment is identical to that of the fifth embodiment except that the isolation portions 3 are formed by the LOCOS method. That is, a laminated pattern of an insulating film comprising thin silicon oxide or the like and an oxidation-resistant insulating film deposited thereon and comprising silicon nitride or the like is formed in the active region above the main surface of the substrate 1S in a manner similar to the seventh embodiment. Thereafter, the substrate 1S is subjected to a thermal oxidation process to thereby form isolation portions 3 comprising silicon oxide or the like in isolation regions exposed from the laminated pattern.

Even in the eighth embodiment, the capability of suppressing or preventing a punch through at the high breakdown voltage pMISQHp6 can be enhanced in a manner similar to the fourth to sixth embodiments. Therefore, it is possible to shorten the design channel length (length in the first direction X) of the high breakdown voltage pMISQHp6. Thus, since it is possible to reduce the size of the high breakdown voltage pMISQHp6 in which the isolation portions 3 are formed by the LOCOS method, the size of a semiconductor chip having the high breakdown voltage pMISQHp6 can be scaled down.

Since the structure other than the isolation portions 3 and the manufacturing method are similar to those of the fifth and sixth embodiments, and a similar effect can be obtained, a description thereof is omitted.

While the invention made above by the present inventors has been described specifically on the basis of the preferred embodiments, the present invention is not limited to the embodiments referred to above. It is needless to say that various changes can be made thereto within a scope not departing from the gist thereof.

Although the first to eighth embodiments have been explained, for example, for a case in which the gate electrode for the high breakdown voltage MIS and the gate electrode for the low breakdown voltage MIS are formed in discrete processes, the present invention is not limited to this. The gate electrode for the high breakdown voltage MIS and the gate electrode for the low breakdown voltage MIS may be formed in the same process. Such a case is handled in the following manner, for example. The insulating film 6b of the high breakdown voltage MIS, which is formed by the CVD method, is first patterned as in the third and sixth embodiments. Thereafter, the high breakdown voltage MIS forming region is covered with a corresponding resist film. Subsequently, silicon of the active region formed over the main surface of the substrate 1S in the low breakdown voltage MIS forming region is etched so as to be exposed, and, thereafter, the resist film is removed. Afterwards, a gate insulating film for the low breakdown voltage MIS is formed by a thermal oxidation method or the like, followed by deposition of a gate electrode forming conductor film over the full area of the main surface of the substrate 1S. This is patterned via a lithography process and a dry etching process, thereby forming gate electrodes in high breakdown voltage MIS and low breakdown voltage MIS forming regions.

When the drain breakdown voltage of the high breakdown voltage MIS is relatively low like, for example, approximately 7 to 30V, the introduction of an impurity by ion implantation or the like for forming a well for the low breakdown voltage MIS may share the use of the introduction of an impurity by ion implantation or the like for forming semiconductor regions (PV1 and NV1) each having a field relaxing function, of the high breakdown voltage MIS and a channel stopper thereof. In such a case, a once-introduction process makes it possible to form the well for the low breakdown voltage MIS, the semiconductor regions each having the field relaxing function, of the high breakdown voltage MIS and the channel stopper. That is, since a lithography process with a series of processes, such as resist application, development and exposure, can be cut down, the process of manufacturing a semiconductor device can be greatly reduced.

While the above description has principally been directed to a case in which the invention made by the present inventors is applied to a method of manufacture of a semiconductor device, which is applied to a driver circuit of a liquid crystal display, a motor control driver circuit for performing high current control, etc., which belong to a field of application reaching the background of the invention, the present invention is not limited to it, but is applicable in various ways. The present invention is applicable even to a method of manufacturing a semiconductor device for other electronic equipment, as well as to, for example, the use thereof in various circuits of a vehicle, etc.

The present invention is applicable to the manufacturing industry of a semiconductor device.

What is claimed is:

1. A semiconductor device having a first MISFET comprising:
   a first well of a first conduction type formed in a semiconductor substrate;
   a gate insulating film of the first MISFET formed over the semiconductor substrate;
   a gate electrode of the first MISFET formed over the gate insulating film;
   first semiconductor regions of a second conduction type opposite to the first conduction type formed in the first well and serving as part of source and drain regions of the first MISFET;
   second semiconductor regions of the second conduction type formed in the first well, having a lower impurity concentration than that of the first semiconductor regions and serving as part of source and drain regions of the first MISFET; and
   an insulating film formed in the first well and embedded into a trench formed in the semiconductor substrate;
   wherein the second semiconductor regions surround the first semiconductor regions and the insulating film,
   wherein, in a gate length direction of the first MISFET, the insulating film is arranged between the first semiconductor regions and a channel region under the gate insulating film,
   wherein, in the gate length direction, ends of the gate electrode are formed over the insulating film,
   wherein third semiconductor regions of the first conduction type are formed at ends of the channel region in a gate width direction of said MISFET, and the third semiconductor regions are away from the source and drain regions of the first MISFET, and
   wherein an impurity concentration of the third semiconductor regions is higher than that of the first well.

2. A semiconductor device according to claim 1, wherein a depth of the third semiconductor regions is deeper than that of the insulating film.

3. A semiconductor device according to claim 1, wherein the gate insulating film includes:
   a first gate insulating film formed over the first well; and
   a second gate insulating film formed over the first gate insulating film and the insulating film, and
   wherein ends of the gate electrode are formed over the second gate insulating film.

4. A semiconductor device according to claim 3, wherein the second gate insulating film is thicker than the first gate insulating film.

5. A semiconductor device according to claim 1, wherein silicide layers are formed over the gate electrode and the first semiconductor regions.

6. A semiconductor device according to claim 5, wherein the silicide layers are made of cobalt silicide, titanium silicide, platinum silicide, nickel silicide or tungsten silicide.

7. A semiconductor device according to claim 1, wherein the first conduction type is p-type, and wherein the second conduction type is n-type.

8. A semiconductor device according to claim 1, wherein the first conduction type is n-type, and wherein the second conduction type is p-type.

9. A semiconductor device according to claim 1, further comprising a second MISFET which includes a thinner gate insulating film than that of the first MISFET.

10. A semiconductor device according to claim 1, wherein the first MISFET is constituted of a part of circuits for driving a liquid crystal display.

* * * * *